(12) United States Patent
Lee et al.

(10) Patent No.: US 12,733,155 B2
(45) Date of Patent: Sep. 8, 2026

(54) SEMICONDUCTOR MEMORY DEVICE

(71) Applicant: Samsung Electronics Co., Ltd., Suwon-si (KR)

(72) Inventors: Kyunghwan Lee, Suwon-si (KR); Wonsok Lee, Suwon-si (KR); Juho Lee, Suwon-si (KR); Daewon Ha, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 387 days.

(21) Appl. No.: 18/421,187

(22) Filed: Jan. 24, 2024

(65) Prior Publication Data

US 2024/0422964 A1 Dec. 19, 2024

(30) Foreign Application Priority Data

Jun. 16, 2023 (KR) ........................ 10-2023-0077719

(51) Int. Cl.
*H10B 12/00* (2023.01)
*H10D 62/17* (2025.01)

(52) U.S. Cl.
CPC ......... *H10B 12/488* (2023.02); *H10B 12/482* (2023.02); *H10D 62/221* (2025.01)

(58) Field of Classification Search
CPC .... H10B 12/488; H10B 12/482; H10B 12/30; H10B 51/20; H10B 12/01; H10B 12/50; H10B 51/30; H10B 51/40; H10D 62/221; H10D 30/701; H10D 84/83
See application file for complete search history.

(56) References Cited

U.S. PATENT DOCUMENTS

| | | | | |
|---|---|---|---|---|
| 11,011,529 | B2 | 5/2021 | Ramaswamy | |
| 11,501,827 | B2 * | 11/2022 | Kim | G11C 11/4097 |
| 12,131,774 | B2 * | 10/2024 | Kim | G11C 11/4097 |
| 2021/0151437 | A1 | 5/2021 | Tomishima | |
| 2022/0139916 | A1 | 5/2022 | Kwak | |
| 2022/0199621 | A1 | 6/2022 | Lee et al. | |
| 2022/0246619 | A1 | 8/2022 | Kim | |
| 2022/0352170 | A1 | 11/2022 | Lee et al. | |
| 2023/0030585 | A1 | 2/2023 | Sarpatwari et al. | |

FOREIGN PATENT DOCUMENTS

CN 115332253 A 11/2022

* cited by examiner

*Primary Examiner* — David Vu
(74) *Attorney, Agent, or Firm* — Harness, Dickey & Pierce, P.L.C.

(57) ABSTRACT

A semiconductor memory device includes a memory cell array having a three-dimensional structure, the memory cell array including a plurality of memory cells repeatedly arranged in a first lateral direction, a second lateral direction, and a vertical direction, wherein the first lateral direction and the second lateral direction are perpendicular to each other, and the vertical direction is perpendicular to each of the first lateral direction and the second lateral direction, wherein each of the plurality of memory cells includes two transistors including at a least portions of two word lines passing through the memory cell in the vertical direction and at least portions of two bit lines respectively on both sides of the two word lines in the first lateral direction, each of the two bit line extending along the second lateral direction, and each of the plurality of memory cells does not include a capacitor.

20 Claims, 46 Drawing Sheets

Figure 13:
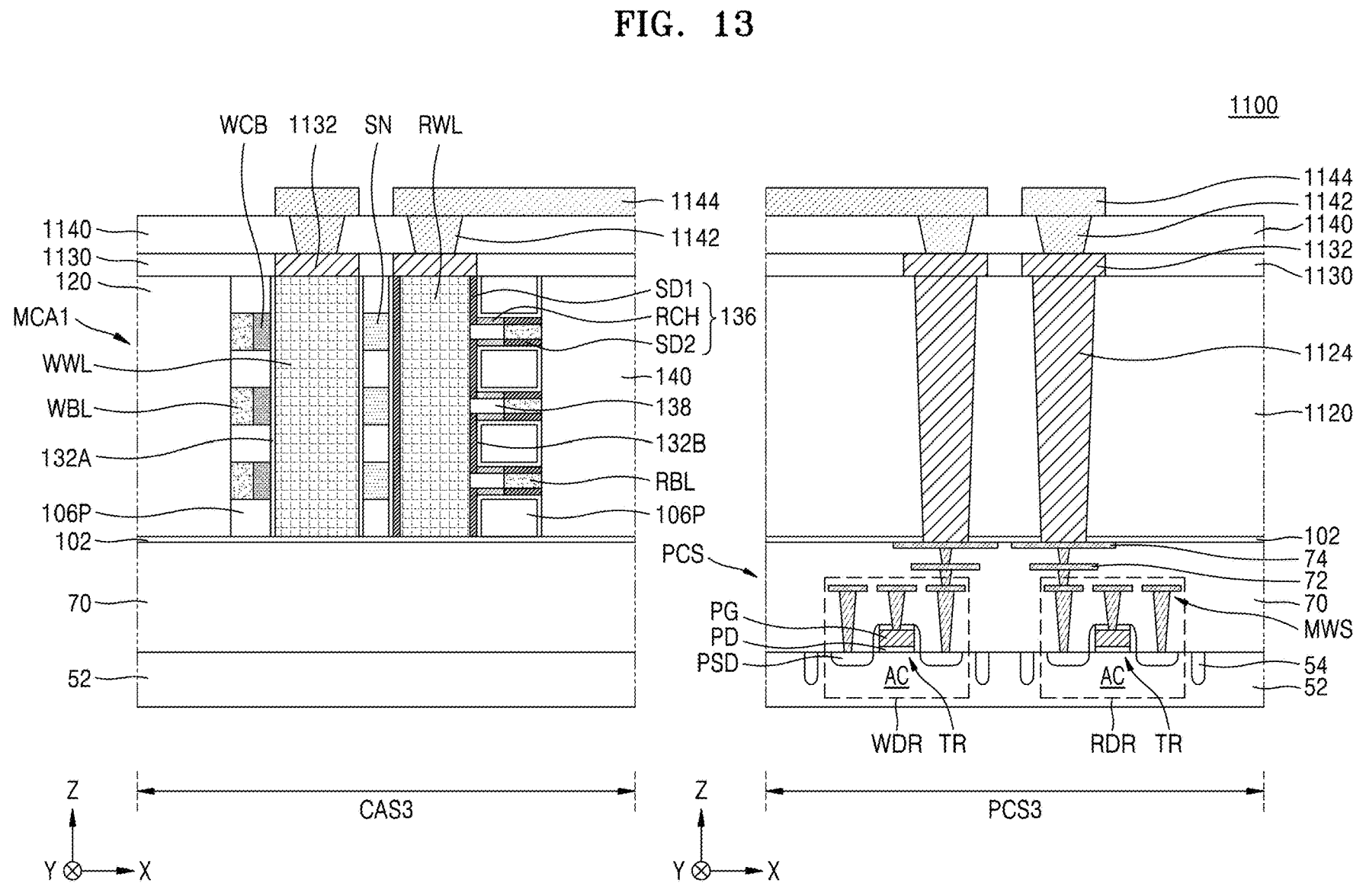

1144 1142 1140 1132 1130 1124 1120 102 74 72 70 MWS 54 52

RDR TR AC WDR TR AC PCS3

PG PD PSD PCS

SD1 RCH SD2 136 140 138 132B RBL 106P 1144 1142 RWL SN 1132 WCB CAS3

1140 1130 120 MCA1 WWL WBL 132A 106P 102 70 52

Z Y X

SEMICONDUCTOR MEMORY DEVICE

CROSS-REFERENCE TO RELATED APPLICATION

This application is based on and claims priority under 35 U.S.C. § 119 to Korean Patent Application No. 10-2023-0077719, filed on Jun. 16, 2023, in the Korean Intellectual Property Office, the disclosure of which is incorporated by reference herein in its entirety.

BACKGROUND

Various example embodiments relate to a semiconductor memory device, and more particularly, to a semiconductor memory device including a plurality of memory cells arranged three-dimensionally.

In recent years, the downscaling of semiconductor devices has rapidly progressed due to the development of electronics technology. Thus, the reduction or miniaturization of memory cells is required or expected, and existing memory cells have limitations in maintaining high integration and/or reliability. Accordingly, it is necessary or desirable to develop a semiconductor memory device having a structure that facilitates miniaturization and/or a high integration of memory cells.

SUMMARY

Example embodiments relate to a semiconductor memory device having a structure that facilitates miniaturization and/or high degree of integration of memory cells.

According to some example embodiments, there is provided a semiconductor memory device including a memory cell array having a 3D structure, the memory cell array including a plurality of memory cells that are repeatedly arranged in a first lateral direction, a second lateral direction, and a vertical direction, wherein the first lateral direction and the second lateral direction are perpendicular to each other, and the vertical direction is perpendicular to each of the first lateral direction and the second lateral direction. Each of the plurality of memory cells includes two transistors including at least portions of two word lines passing through the memory cell in the vertical direction and at least portions of two bit lines respectively on first and second sides of the two word lines in the first lateral direction, each bit line extending along in the second lateral direction, and each of the plurality of memory cells does not include a capacitor.

Alternatively or additionally according to some example embodiments, there is provided a semiconductor memory device including a memory cell array having a 3D structure, the memory cell array including a plurality of memory cells on a substrate that are repeatedly arranged in a first lateral direction, a second lateral direction, and a vertical direction, wherein the first lateral direction and the second lateral direction are parallel to a main surface of the substrate and are perpendicular to each other, and the vertical direction is perpendicular to the main surface of the substrate, wherein each of the plurality of memory cells includes two transistors adjacent to each other in the first lateral direction. Each of the plurality of memory cells includes at least a portion of a write word line extending along the vertical direction, at least a portion of a read word line apart from the write word line in the first lateral direction, the read word line extending along in the vertical direction, at least a portion of a write bit line on one side of the write word line in the first lateral direction, the write bit line extending along the second lateral direction, and at least a portion of a read bit line apart from the write bit line in the first lateral direction with the write word line and the read word line therebetween, the read bit line extending along the second lateral direction.

Alternatively or additionally according to some example embodiments, there is provided a semiconductor memory device including a memory cell array having a 3D structure, the memory cell array including a plurality of memory cells that are repeatedly arranged on a substrate in a first lateral direction, a second lateral direction, and a vertical direction, wherein the first lateral direction and the second lateral direction are parallel to a main surface of the substrate and are perpendicular to each other, and the vertical direction is perpendicular to the main surface of the substrate, and each of the plurality of memory cells includes a write transistor and a read transistor adjacent to each other in the first lateral direction. Each of the plurality of memory cells includes at least a portion of a write word line extending along the vertical direction, at least a portion of a write bit line on one side of the write word line in the first lateral direction, the write bit line extending along the second lateral direction, a first gate dielectric film surrounding the write word line, a first channel region surrounding the write word line and the first gate dielectric film, the first channel region being in contact with the write bit line, at least a portion of a read word line apart from the write word line in the first lateral direction, the read word line extending along the vertical direction, at least a portion of a read bit line apart from the write bit line in the first lateral direction with the write word line and the read word line therebetween, the read bit line extending along the second lateral direction, a second gate dielectric film surrounding the read word line, and a storage node surrounding the read word line and the second gate dielectric film, the storage node being in contact with the first channel region.

BRIEF DESCRIPTION OF THE DRAWINGS

Various example embodiments will be more clearly understood from the following detailed description taken in conjunction with the accompanying drawings in which:

FIG. 13 is a cross-sectional view of a semiconductor memory device according to some example embodiments;

FIGS. 15A to 29B are diagrams illustrating a method of manufacturing a semiconductor device, according to some example embodiments, wherein FIGS. 15A, 16A, 17A, 18A,

19A, 20A, 21A, 22A, 23A, 24A, 25A, 26A, 27A, 28A, and 29A are each a plan view illustrating the method of manufacturing the semiconductor device, according to the embodiments, and FIGS. 15B, 16B, 17B, 18B, 19B, 20B, 21B, 22B, 23B, 24B, 25B, 26B, 27B, 28B, and 29B are respectively cross-sectional views taken along lines X1-X1' of 15A, 16A, 17A, 18A, 19A, 20A, 21A, 22A, 23A, 24A, 25A, 26A, 27A, 28A, and 29A.

DETAILED DESCRIPTION OF VARIOUS EXAMPLE EMBODIMENTS

Figure 1:
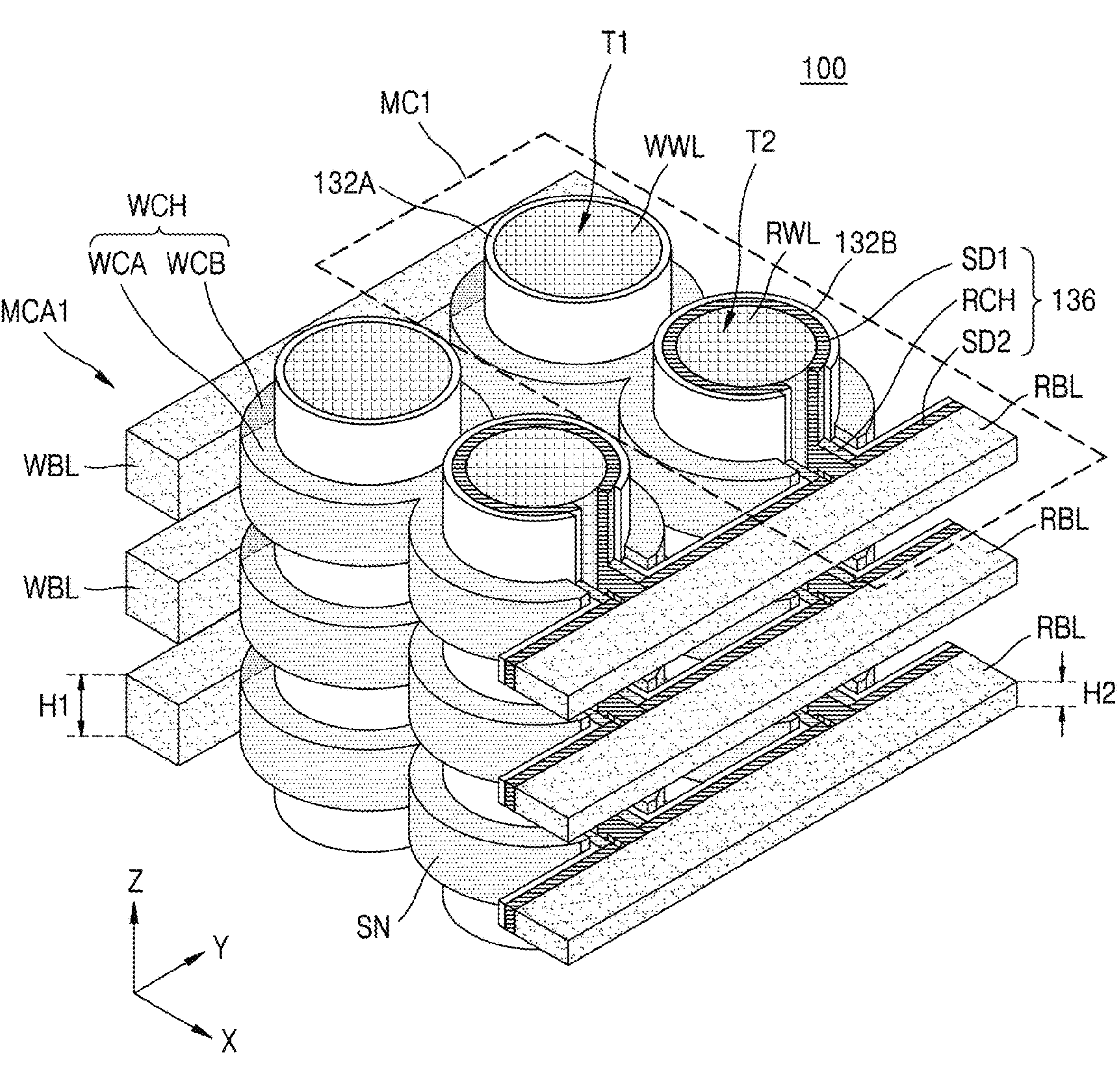
FIG. 1 is a partial perspective view of a memory cell array of a semiconductor memory device according to some example embodiments.

Hereinafter, some example embodiments will be described in detail with reference to the accompanying drawings. The same reference numerals are used to denote the same elements in the drawings, and repeated descriptions thereof are omitted.

Figure 2:
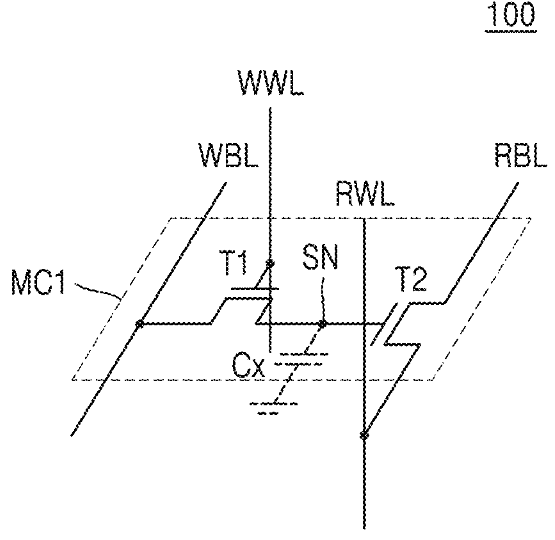
FIG. 2 is a circuit diagram of a memory cell included in the memory cell array shown in FIG. 1.
Figure 3A:
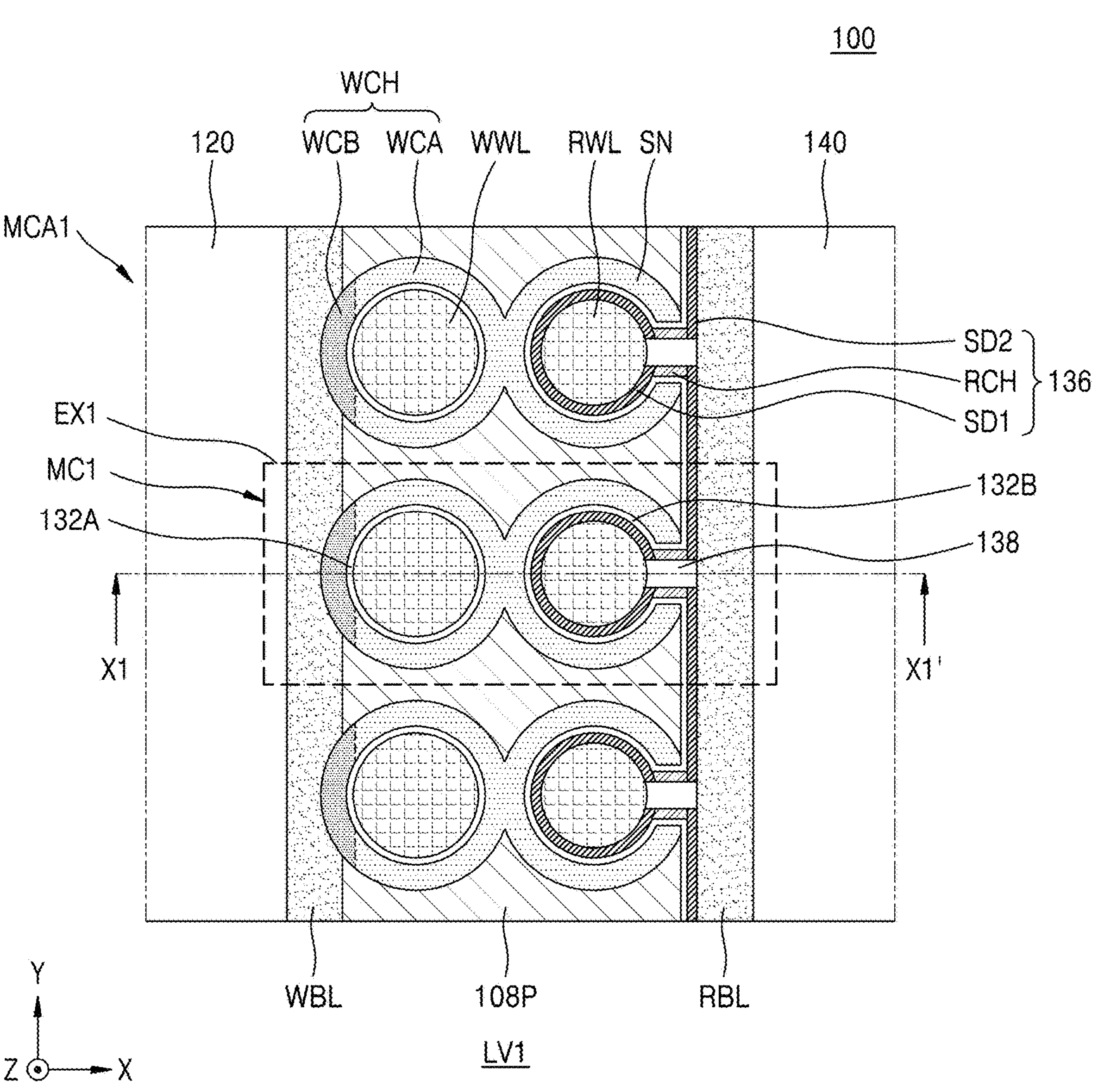
FIG. 3A is a plan view of a partial region of the memory cell array of the semiconductor memory device shown in FIG. 1.
Figure 3B:
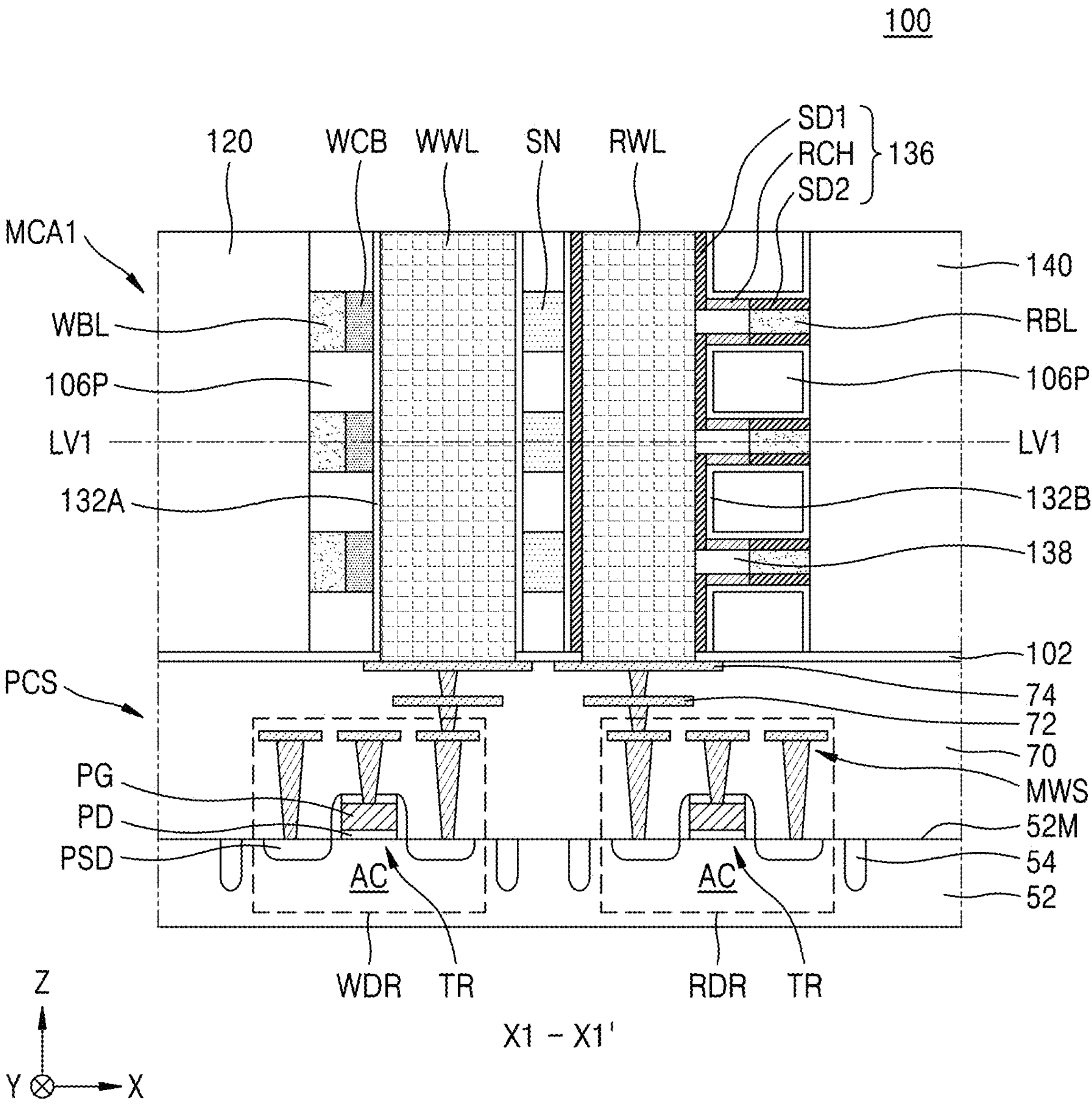
FIG. 3B is a cross-sectional view taken along line X1-X1' of FIG. 3A.
Figure 3C:
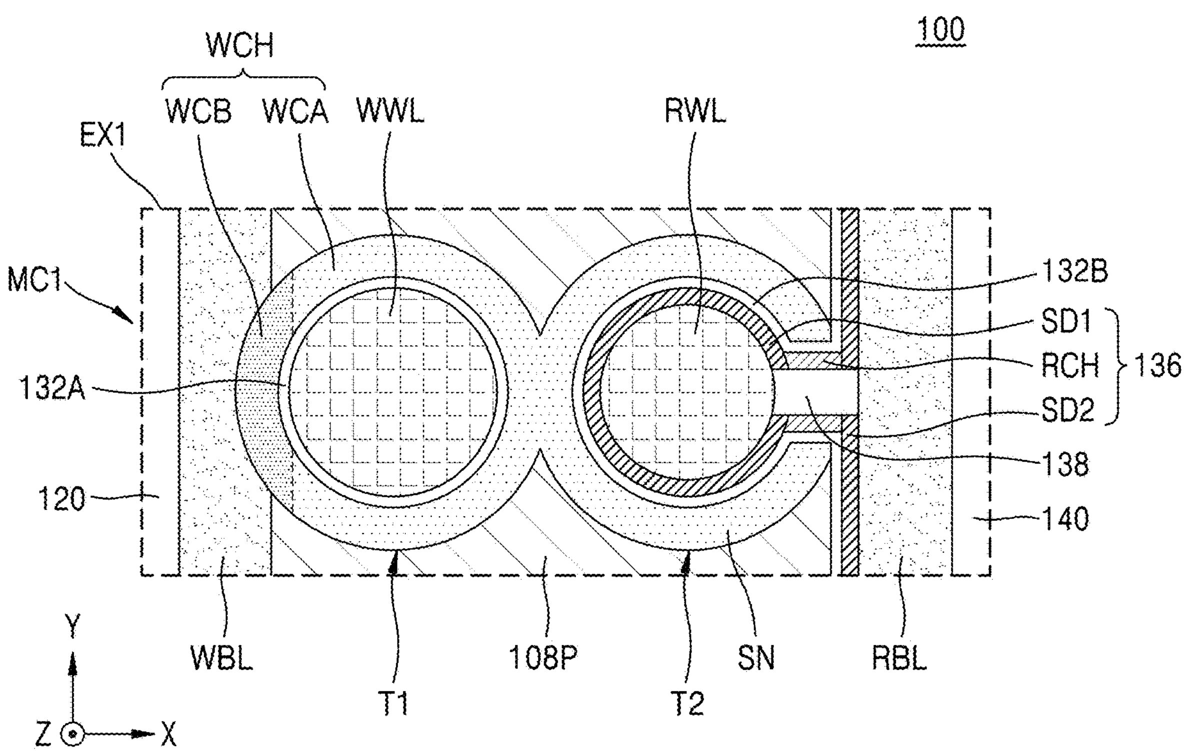
FIG. 3C is an enlarged plan view of portion "EX1" of FIG. 3A.

FIG. 1 is a partial perspective view of a memory cell array MCA1 of a semiconductor memory device 100 according to various example embodiments. FIG. 2 is a circuit diagram of a memory cell MC1 included in the memory cell array MCA1 shown in FIG. 1. FIG. 3A is a plan view of a partial region of the memory cell array MCA1 of the semiconductor memory device 100 shown in FIG. 1, and FIG. 3B is a cross-sectional view taken along line X1-X1' of FIG. 3A. FIG. 3C is an enlarged plan view of portion "EX1" of FIG. 3A.

FIG. 3B illustrates a cross-sectional configuration of the semiconductor device 100 having a cell on peripheral (COP) structure in which the memory cell array MCA1 shown in FIG. 1 is on or above, or directly on a peripheral circuit structure PCS. FIG. 3A illustrates a planar configuration at a vertical level corresponding to line LV1-LV1 of FIG. 3B. In FIG. 3A, portion "EX1" corresponds to one memory cell MC1 in the memory cell array MCA1.

Referring to FIGS. 1, 2, and 3A to 3C, the semiconductor memory device 100 may include the memory cell array MCA1 having a 3D structure including a plurality of memory cells MC1. The plurality of memory cells MC1 may be repeatedly arranged in a first horizontal or lateral direction (X direction) and a second horizontal or lateral direction (Y direction), which may be perpendicular to each other, and in a vertical direction (Z direction) that is perpendicular to each of the first lateral direction (X direction) and the second lateral direction (Y direction). Each of the plurality of memory cells MC1 may include two transistors, for example, a write transistor T1 and a read transistor T2. Each of the plurality of memory cells MC1 may not include a capacitor. Furthermore each of the plurality of memory cells MC1 may not include a memristor or other component acting to store charge. In each of the plurality of memory cells MC1, the write transistor T1 and the read transistor T2 may be adjacent to each other in the first lateral direction (X direction) and may be connected to each other.

For example, in some example embodiments a source node of the write transistor T1 may be connected to (e.g., directly connected to) a gate node of the read transistor T2. Each of the plurality of memory cells MC1 may be or may include or correspond to a two-transistor (2T) memory cell or a two-transistor, zero capacitor (2TOC) memory cell, and in some example embodiments may not be or may not include a one-transistor, one-capacitor (1T1C) memory cell and/or a one-transistor, one memristor (1T1M) memory cell. In some example embodiments, both the read transistor T1 and the write transistor T2 may be NMOS transistors; however, example embodiments are not limited thereto. For example one or both of the read transistor T1 and the write transistor T2 may be PMOS transistors.

Each of the plurality of memory cells MC1 may include or include at least portions of two word lines passing through the memory cell MC1 corresponding thereto in the vertical direction (Z direction), and may include or include at least portions of two bit lines respectively on both sides of the two word lines in the first lateral direction (X direction). Each of the two bit lines may extend along in the second lateral direction (Y direction). The two word lines may include a write word line WWL and a read word line RWL, which extend along in the vertical direction (Z direction), and the two bit lines may include a write bit line WBL and a read bit line RBL.

As used herein, a line such as a bit line or a word line such as a read bit line RBL and/or a write bit line WBL and/or a read word line RWL and/or a write word line RWL may have or may be partitioned into a plurality of portions or segments. A memory cell such as memory cell MC1 may include at least these portions or segments of the respective line. A plurality of memory cells MC1 may be arranged such that different portions of the respective lines are included in different ones of the memory cells MC1.

For example, in each of the plurality of memory cells MC1, the write transistor T1 may include or include at least portions of the write word line WWL extending along in the vertical direction (Z direction), a first gate dielectric film 132A surrounding the write word line WWL, and a first channel region WCH surrounding the write word line WWL and the first gate dielectric film 132A. The first channel region WCH may be in contact with (e.g., in direct contact with) the write bit line WBL. In the write transistor T1, the first channel region WCH may include a main channel portion WCA surrounding the write word line WWL and a channel contact portion WCB in contact with (or in direct contact with) the write bit line WBL. The main channel portion WCA may be integrally connected to the channel contact portion WCB. In various example embodiments, each of the main channel portion WCA and the channel contact portion WCB may include a semiconductor film, for example, a doped silicon (Si) film, and a dopant or impurity concentration of the channel contact portion WCB may be higher than (e.g., several orders of magnitude greater than) a dopant concentration of the main channel portion WCA. For example, the main channel portion WCA may include undoped polysilicon, doped polysilicon, or a combination thereof, and the channel contact portion WCB may include an ohmic contact portion having a higher dopant concentration than the main channel portion WCA.

In each of the plurality of memory cells MC1, the write bit line WBL may be on one side of the write word line WWL in the first lateral direction (X direction) and extend along in the second lateral direction (Y direction).

In each of the plurality of memory cells MC1, the read transistor T2 may include or include at least portions of a read word line RWL and a second gate dielectric film 132B. The read word line RWL may be apart from the write word line WWL in the first lateral direction (X direction) and extend along in the vertical direction (Z direction). The second gate dielectric film 132B may surround the read word line RWL. The read bit line RBL may be on one side of the read word line RWL and extend along in the second lateral direction (Y direction). The read bit line RBL may be apart from the write bit line WBL in the first lateral direction (X direction) with the write word line WWL and the read word line RWL therebetween.

A storage node SN may be between the write transistor T1 and the read transistor T2. The storage node SN may have a structure surrounding the read word line RWL and the second gate dielectric film 132B.

The storage node SN may be in contact with or in direct contact with the first channel region WCH of the write transistor T1. The storage node SN may be integrally connected to the first channel region WCH. In various example embodiments, the storage node SN may include a semiconductor film, for example, a doped silicon (Si) film. For example, the storage node SN may include undoped polysilicon, doped polysilicon, or a combination thereof.

As shown in FIG. 2, in the memory cell MC1 that does not include a capacitor such as a container or other physically embodied capacitor, the storage node SN may serve as a gate of the read transistor T2. Charges (electric potential) written to the storage node SN may mainly be maintained by a gate capacitance of the read transistor T2 and a parasitic capacitance Cx. The gate capacitance of the read transistor T2 may be considered as part of the parasitic capacitance Cx. In the memory cell MC1, because a size of the storage node SN is relatively great, the parasitic capacitance Cx may become relatively great, and thus, data written to the storage node SN may be stored for a relatively long period of time. This may affect (e.g., may improve) a retention or refresh time of the memory cell MC1.

Each of the write word line WWL and the read word line RWL may include tungsten (W), aluminum (Al), molybdenum (Mo), ruthenium (Ru), aluminum (Al), cobalt (Co), titanium (Ti), titanium nitride (TiN), tantalum (Ta), tantalum nitride (TaN), tungsten nitride (WN), titanium silicon nitride (TiSiN), tungsten silicon nitride (WSiN), polysilicon, or a combination thereof, without being limited thereto.

In various example embodiments, each of the first gate dielectric film 132A and the second gate dielectric film 132B may include a paraelectric material. For example, each of the first gate dielectric film 132A and the second gate dielectric film 132B may include silicon oxide, silicon nitride, silicon oxynitride, or a combination thereof. In other embodiments, each of the first gate dielectric film 132A and the second gate dielectric film 132B may include a high-k dielectric material. The high-k dielectric material may have a dielectric constant of about 10 to about 25. For example, the high-k dielectric material may include hafnium oxide, aluminum oxide, zirconium oxide, or a combination thereof, without being limited thereto. Alternatively or additionally in some example embodiments, each of the first gate dielectric film 132A and the second gate dielectric film 132B may include a combination of a paraelectric material and a high-k dielectric material.

As shown in FIGS. 1 and 3A to 3C, in the memory cell array MCA1 including the plurality of memory cells MC1, a plurality of write bit lines WBL may be on one side of the write word line WWL and the read word line RWL in the first lateral direction (X direction). The plurality of write bit lines WBL may overlap or at least partially overlap each other in the vertical direction (Z direction). Each of the plurality of write bit lines WBL may extend along in the second lateral direction (Y direction). In the memory cell array MCA1, a plurality of read bit lines RBL may be on another side of the write word line WWL and the read word line RWL in the first lateral direction (X direction). The plurality of read bit lines RBL may overlap each other in the vertical direction (Z direction). Each of the plurality of read bit lines RBL may extend along in the second lateral direction (Y direction).

From the plurality of memory cells MC1 included in the memory cell array MCA1, memory cells MC1 of some groups arranged in a line in the vertical direction (Z direction) may share the write word line WWL and the read word line RWL. From among the plurality of memory cells MC1 included in the memory cell array MCA1, memory cells MC1 of some other groups arranged in a line in the second lateral direction (Y direction) may share a selected one of the plurality of write bit lines WBL and a selected one of the plurality of read bit lines RBL in the memory cell array MCA1.

As shown in FIGS. 1 and 3A, in the vertical direction (Z direction), the write bit line WBL may have a first thickness H1 that is equal or similar to a thickness of the first channel region WCH. In the vertical direction (Z direction), the read bit line RBL may have a second thickness H2 that is less than the first thickness H1. In the vertical direction (Z direction), the second thickness H2 of the read bit line RBL may be less than a thickness of the storage node SN. In the vertical direction (Z direction), the first channel region WCH and the storage node SN may have the same or substantially the same thickness as each other.

As shown in FIGS. 1 and 3A to 3C, in the memory cell array MCA1 including the plurality of memory cells MC1, one write word line WWL may be surrounded by a plurality of first channel regions WCH. The plurality of first channel regions WCH, which surround the one write word line WWL, may overlap each other in the vertical direction (Z direction). In an X-Y plane (or a plane that is parallel to a surface of the substrate 70, a planar shape of each of the plurality of first channel regions WCH may include a circular or a beveled or chamfered polygonal shape or elliptical shape including a closed curve.

In addition, in the memory cell array MCA1 including the plurality of memory cells MC1, one read word line RWL may be surrounded by a plurality of storage nodes SN The plurality of storage nodes SN, which surround the one read word line RWL, may overlap each other in the vertical direction (Z direction). Each of the plurality of storage nodes SN may be in contact with the first channel region WCH adjacent thereto, from among the plurality of first channel regions WCH. In an X-Y plane, a planar shape of each of the plurality of storage nodes SN may have a partially circular shape or a beveled or chamfered or partially elliptical shape of which a portion opens toward the read bit line RBL.

As shown in FIGS. 1 and 3A to 3C, the memory cell array MCA1 including the plurality of memory cells MC1 may include a first source/drain region SD1 surrounding the read word line RWL, a plurality of second channel regions RCH connected to the first source/drain region SD1, and a plurality of second source/drain regions SD2 connected to the plurality of second channel regions RCH.

Each of the plurality of second channel regions RCH may be between the read word line RWL and the read bit line RBL. Each of the plurality of second channel regions RCH may be apart from the storage node SN with the second gate dielectric film 134 therebetween and extend to intersect with a portion of the storage node SN in the first lateral direction (X direction). The plurality of second channel regions RCH may overlap or at least partly overlap each other in the vertical direction (Z direction). Each of the plurality of second channel regions RCH may extend away from each of the first source/drain region SD1 and the read word line RWL in the first lateral direction (X direction). The first source/drain region SD1, the plurality of second channel regions RCH, and the plurality of second source/drain regions SD2 may be integrally connected to each other or directly connected to each other, and may constitute a semiconductor structure 136.

In various example embodiments, each of the plurality of first channel regions WCH, the plurality of second channel regions RCH, and the plurality of storage nodes SN may include a semiconductor film (e.g., a silicon film), and a dopant concentration of each of the plurality of storage nodes SN may be equal to or similar to a dopant concentration of each of the main channel portion WCA and the plurality of second channel regions RCH in the first channel region WCH.

Each of the plurality of first channel regions WCH may surround the write word line WWL and the first gate dielectric film 132A. Each of the plurality of first channel regions WCH may be one write bit line WBL, which is adjacent thereto in the first lateral direction (X direction), from among the plurality of write bit lines WBL. From among the plurality of memory cells MC1, memory cells MC1 of some groups arranged in a line in the vertical direction (Z direction) may share one first gate dielectric film 132A. Each of the plurality of memory cells MC1 may include a selected one of the plurality of first channel regions WCH.

In various example embodiments, the plurality of first channel regions WCH may include the same material as the plurality of second channel regions RCH. For example, the plurality of first channel regions WCH and the plurality of second channel regions RCH may or may not include any material different from the other. For example, the plurality of first channel regions WCH and the plurality of second channel regions RCH may include a semiconductor film, for example, a silicon film.

As shown in FIGS. 1 and 3A to 3C, the first gate dielectric film 132A may be in spaces defined by the plurality of first channel regions WCH around the write word line WWL and in a range that is on extension lines of the spaces in the vertical direction (Z direction). The first gate dielectric film 132A may include a portion between the write word line WWL and the first channel region WCH and a portion covering a sidewall of the write word line WWL between two adjacent ones of the plurality of first channel regions WCH that overlap each other in the vertical direction (Z direction).

The second gate dielectric film 132B may include a portion surrounding the read word line RWL, a portion between the second channel region RCH and the storage node SN, and a portion that is apart from the read bit line RBL in the first lateral direction (X direction) with the second source/drain region SD2 therebetween and extend parallel to the read bit line RBL in the second lateral direction (Y direction).

Each of the plurality of storage nodes SN may surround the read word line RWL, the first source/drain region SD1, and the second gate dielectric film 132B. Each of the plurality of storage nodes SN may include a portion (hereinafter, referred to as a first sidewall portion) in contact with a selected one of the plurality of first channel regions WCH and a portion (hereinafter, referred to as a second sidewall portion) defining an opening (e.g., an opening SNH shown in FIGS. 24A and 24B) by which the portion of each of the storage nodes SN opens toward the read bit line RBL. Each of the plurality of second channel regions RCH may be inside the opening defined by the second sidewall portion, out of each of the plurality of storage nodes SN. Each of the plurality of second channel regions RCH may intersect with the storage node SN of a selected one of the plurality of storage nodes SN through the opening of the selected storage node SN and extend in the first lateral direction (X direction).

In the semiconductor memory device 100, each of the plurality of memory cells MC1 may include two second channel regions RCH, which are adjacent to each other from among the plurality of second channel regions RCH that overlap each other in the vertical direction (Z direction), two second source/drain regions SD2, which are adjacent to each other from among the plurality of second source/drain regions SD2 that overlap each other in the vertical direction (Z direction), and one of the plurality of storage nodes SN that overlap each other in the vertical direction (Z direction). From among the plurality of memory cells MC1 included in the semiconductor memory device 100, memory cells MC1 of some groups arranged in a line in the vertical direction (Z direction) may share one first source/drain region SD1 and one second gate dielectric film 132B.

As shown in FIGS. 3A and 3B, two second channel regions RCH included in each of the plurality of memory cells MC1 in the semiconductor memory device 100 may be apart from each other in the vertical direction (Z direction), and an inter-channel insulating pattern 138 may be between the two second channel regions RCH. The inter-channel insulating pattern 138 may include a silicon oxide film, without being limited thereto.

As shown in FIG. 3B, in the semiconductor memory device 100, a vertical inter-cell insulating pattern 106P may be between two adjacent ones of memory cells MC1 of some groups arranged in a line in the vertical direction (Z direction). The vertical inter-cell insulating pattern 106P may be in contact with the first channel region WCH, the storage node SN, the first gate dielectric film 132A, and the second gate dielectric film 132B of each of two adjacent ones of the memory cells MC1 of the some groups arranged in a line in the vertical direction (Z direction). The vertical inter-cell insulating pattern 106P may include a silicon oxide film, without being limited thereto.

As shown in FIG. 3A, the semiconductor memory device 100 may include a plurality of lateral inter-cell insulating patterns 108P, which are respectively one-by-one between memory cells MC1 of some other groups, which are at the same or substantially the same vertical level in the vertical direction (Z direction) and arranged in a line in the second lateral direction (Y direction). Each of the plurality of lateral inter-cell insulating patterns 108P may be in contact with the first channel region WCH and the storage node SN of each of two adjacent ones of the memory cells MC1 of the some other groups. Each of the plurality of lateral inter-cell insulating patterns 108P may include a silicon nitride film, without being limited thereto.

As shown in FIGS. 3A and 3B, the semiconductor memory device 100 may include a first cell inter-group insulating film 120 and a second cell inter-group insulating film 140. The first cell inter-group insulating film 120 may be on one side of memory cells MC1 of some groups arranged in a line in the vertical direction (Z direction), and the second cell inter-group insulating film 140 may be on another side of the memory cells MC1 of the some groups. The first cell inter-group insulating film 120 may be in contact with or indirect contact with the write bit line WBL of each of the memory cells MC1 of the some groups. The second cell inter-group insulating film 140 may be in contact with or in direct contact with the read bit line RBL of each of the memory cells MC1 of the some groups. Each of the first cell inter-group insulating film 120 and the second cell inter-group insulating film 140 may include a silicon oxide film, without being limited thereto.

As shown in FIG. 3B, the memory cell array MCA1 including the plurality of memory cells MC1 may be on a substrate 52, and a peripheral circuit structure PCS may be between the substrate 52 and the memory cell array MCA1. The plurality of memory cells MC1 included in the memory cell array MCA1 may be repeatedly arranged in the first lateral direction (X direction) and the second lateral direction (Y direction), which are parallel to a main surface 52M of the substrate 52 on the substrate 52 and the peripheral circuit structure PCS and perpendicular to each other, and in a vertical direction (Z direction) that is perpendicular to the main surface 52M of the substrate 52.

The peripheral circuit structure PCS may include a plurality of circuits formed on the substrate 52 and a multilayered wiring structure MWS configured to connect the plurality of circuits to each other or connect the plurality of circuits to components included in the memory cell array MCA1.

The substrate 52 may include a semiconductor substrate. For example, the substrate 52 may include a semiconductor substrate including one or more of silicon (Si), germanium (Ge), or silicon germanium (SiGe). An active region AC may be defined by a device isolation film 54 in the substrate 52. A plurality of transistors TR, which constitute the plurality of circuits, may be formed on the active region AC. Each of the plurality of transistors TR may include a gate dielectric film PD and a gate PG, which are sequentially stacked on the substrate 52, and a plurality of ion implantation regions PSD formed on both sides of the gate PG in the active region AC. Each of the plurality of ion implantation regions PSD may constitute a source region or a drain region of the transistor TR.

The multilayered wiring structure MWS included in the peripheral circuit structure PCS may include a plurality of contact plugs 72 and a plurality of conductive lines 74. At least some of the plurality of conductive lines 74 may be electrically connected to the transistor TR. The plurality of contact plugs 72 may connect the plurality of transistors TR to some conductive lines 74 selected from the plurality of conductive lines 74. The plurality of transistors TR and the multilayered wiring structure MWS in the peripheral circuit structure PCS may be covered by an interlayer insulating film 70. The interlayer insulating film 70 may include a silicon oxide film, a silicon nitride film, a silicon oxynitride (SiON) film, a silicon oxycarbonitride (SiOCN) film, or a combination thereof.

In the peripheral circuit structure PCS, the plurality of transistors TR, the plurality of contact plugs 72, and the plurality of conductive lines 74 may constitute the plurality of circuits. Each of the plurality of transistors TR may be electrically connectable to the plurality of memory cells MC1 included in the memory cell array MCA1 through a plurality of multilayered wiring structures MWS.

The peripheral circuit structure PCS may include various circuits not necessarily illustrated. As shown in FIG. 3B, the peripheral circuit structure PCS may include a write word line driver WDR and a read bit line driver RDR. The write word line driver WDR may be connected to the write word line WWL through the multilayered wiring structure MWS included in the peripheral circuit structure PCS. The read bit line driver RDR may be connected to the read word line RWL through the multilayered wiring structure MWS included in the peripheral circuit structure PCS.

Although FIG. 3B illustrates that there is one level of conductive plugs 72 and one level of conductive lines 74, example embodiments are not limited thereto. Furthermore, although FIG. 3B illustrates planar transistors extending in the Y direction, such as the plurality of transistors TR, example embodiments are not limited thereto. For example, at least one of the plurality of transistors TR may be a three-dimensional transistor. Alternatively or additionally at least one of the plurality of transistors TR may extend, e.g., in the Y direction.

An etch stop film 102 may be between the peripheral circuit structure PCS and the memory cell array MCA1. Each of the write word line WWL and the read word line RWL may pass through the etch stop film 102 in the vertical direction (Z direction) and be connected to the conductive line 74 included in the multilayered wiring structure MWS. The etch stop film 102 may include a silicon nitride film, an aluminum oxide film, or a combination thereof, without being limited thereto.

In the semiconductor memory device 100 described with reference to FIGS. 1, 2, and 3A to 3C, the memory cell array MCA1 may have a 3D structure in which the plurality of memory cells MC1 are repeatedly arranged in the first lateral direction (X direction), the second lateral direction (Y direction), and the vertical direction (Z direction). Thus, a structure that may miniaturize or reduce the size of the semiconductor memory device 100 and may be advantageous for high-density 3D arrangement may be provided. Alternatively or additionally, in the semiconductor memory device 100, each of the plurality of memory cells MC1 may constitute the memory cell array MCA1 of a 3D stack type, which includes two transistors including a write transistor T1 and a read transistor T2 and does not include a capacitor. Therefore, the semiconductor memory device 100 may overcome or may help to overcome problems due to the density limit of bit lines, which have been encountered in a semiconductor memory device having a conventional 2D structure, provide a compact structure advantageous for high integration, and provide excellent competitiveness in various aspects including performance, power, chip area, and cost.

FIGS. 4 to 10 are plan views of semiconductor memory devices 200, 300, 400, 500, 600, 700, and 800 according to various example embodiments. FIGS. 4 to 10 illustrate enlarged cross-sectional configurations of a portion corresponding to portion "EX1" of FIG. 3A in the semiconductor memory devices 200, 300, 400, 500, 600, 700, and 800. In FIGS. 4 to 10, the same reference numerals are used to denote the same elements as in FIGS. 1, 2, and 3A to 3C, and thus, detailed descriptions thereof are omitted.

Figure 4:
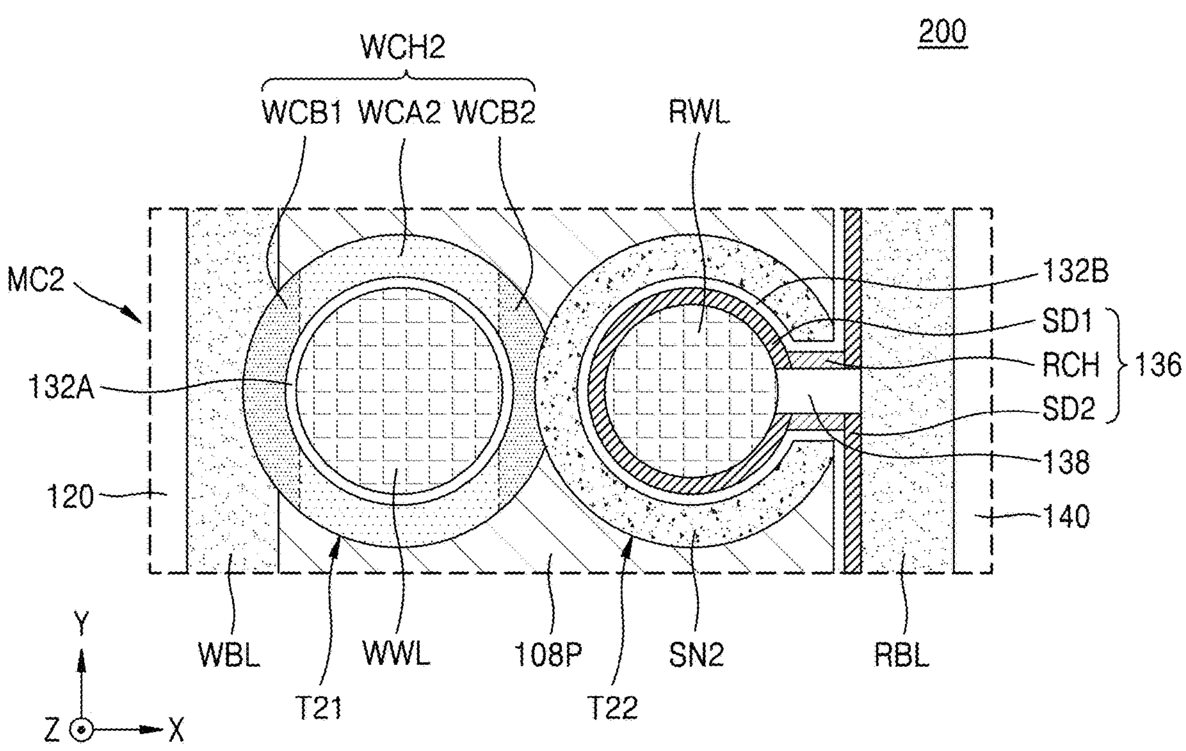
FIGS. 4 to 10 are each a plan view of a semiconductor memory device according to other embodiments.

Referring to FIG. 4, the semiconductor memory device 200 may have substantially the same or substantially the same configuration as the semiconductor memory device 100 described with reference to FIGS. 1, 2, and 3A to 3C. However, the semiconductor memory device 200 may include a memory cell MC2 including a write transistor T21 and a read transistor T22.

In the memory cell MC2, the write transistor T21 and the read transistor T22 may substantially have the same or substantially the same configurations as the write transistor T1 and the read transistor T2, which have been described with reference to FIGS. 1, 2, and 3A to 3C. However, the write transistor T21 may include a first channel region WCH2, and a storage node SN2 may be between the write transistor T21 and the read transistor T22.

The storage node SN2 may have a structure surrounding a read word line RWL and a second gate dielectric film 132B. A detailed description of the storage node SN2 is the same as that of the storage node SN, which has been provided with reference to FIGS. 1, 2, and 3A to 3C. However, the storage node SN2 may include a metal and/or a conductive metal nitride. For example, the storage node SN2 may include W, Al, Mo, Ru, Al, Co, Ti, TIN, Ta, TaN, WN, or a combination thereof, without being limited thereto.

The storage node SN2 may be in contact with the first channel region WCH2 of the write transistor T21. The first channel region WCH2 may substantially have the same or substantially the same configuration as the first channel region WCH described with reference to FIGS. 1 and 3A to 3C. However, the first channel region WCH2 may include a main channel portion WCA2 surrounding the write word line WWL, a first channel contact portion WCB1 in contact with the write bit line WBL, and a second channel contact portion WCB2 in contact with the storage node SN2. The main channel portion WCA2 may be integrally connected to the first and second channel contact portions WCB1 and WCB2. In various example embodiments, the main channel portion WCA2 and the first and second channel contact portions WCB1 and WCB2 may include a semiconductor film, for example, a doped silicon (Si) film, and a dopant concentration of the first and second channel contact portions WCB1 and WCB2 may be higher than (e.g., several orders of magnitude greater than) a dopant concentration of the main channel portion WCA2. For example, the main channel portion WCA2 may include undoped polysilicon, doped polysilicon, or a combination thereof, and the first and second channel contact portions WCB1 and WCB2 may include an ohmic contact portion having a higher dopant concentration than the main channel portion WCA2.

Figure 5:
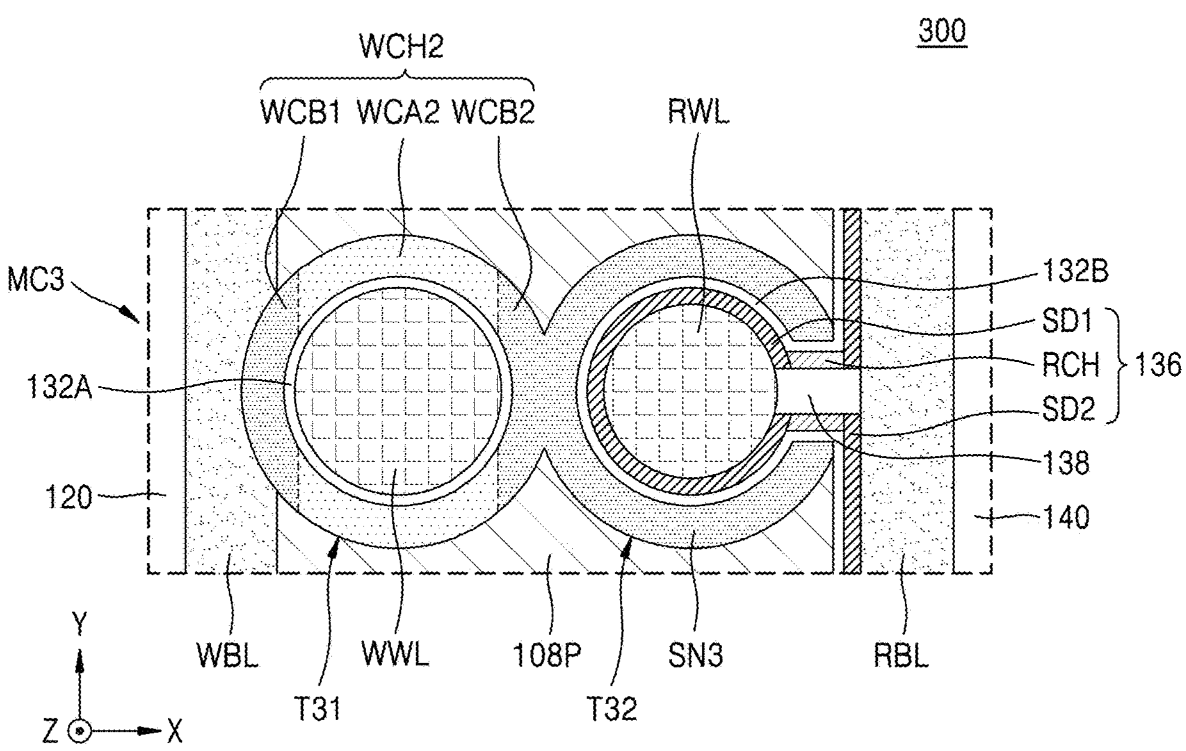

Referring to FIG. 5, the semiconductor memory device 300 may have the same or substantially the same configuration as the semiconductor memory device 100 described with reference to FIGS. 1, 2, and 3A to 3C. However, the semiconductor memory device 300 may include a memory cell MC3 including a write transistor T31 and a read transistor T32.

In the memory cell MC3, the write transistor T31 and the read transistor T32 may have the same or substantially the same configurations as the write transistor T1 and the read transistor T2 described with reference to FIGS. 1, 2, and 3A to 3C. However, the write transistor T31 may include a first channel region WCH2, and a storage node SN3 may be between the write transistor T31 and the read transistor T32.

The storage node SN3 may have a structure surrounding the read word line RWL and the second gate dielectric film 132B. A detailed description of the storage node SN3 is substantially the same as that of the storage node SN, which has been provided with reference to FIGS. 1, 2, and 3A to 3C. However, a dopant concentration of the storage node SN3 may be higher than (e.g., several orders of magnitude greater than) a dopant concentration of the main channel portion WCA2 included in the first channel region WCH2 and higher than a dopant concentration of the second channel region RCH.

A detailed configuration of the first channel region WCH2 is substantially the same as that provided with reference to FIG. 4. However, the second channel contact portion WCB2 included in the first channel region WCH2 may be integrally connected to the storage node SN3 and include the same material as the storage node SN3. A dopant concentration of the second channel contact portion WCB2 may be equal to or similar to a dopant concentration of the storage node SN3.

Figure 6:
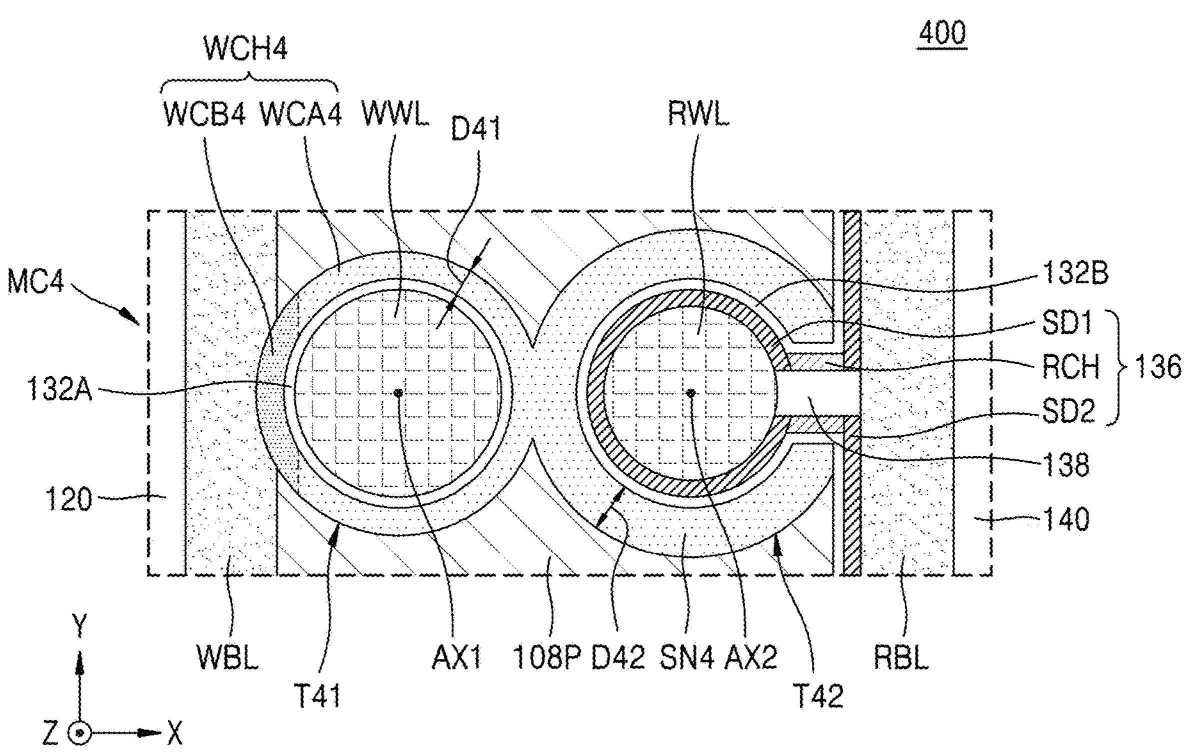

Referring to FIG. 6, the semiconductor memory device 400 may have substantially the same configuration as the semiconductor memory device 100 described with reference to FIGS. 1, 2, and 3A to 3C. However, the semiconductor memory device 400 may include a memory cell MC4 including a write transistor T41 and a read transistor T42.

In the memory cell MC4, the write transistor T41 and the read transistor T42 may have the same or substantially the same configurations as the write transistor T1 and the read transistor T2, which have been described with reference to FIGS. 1, 2, and 3A to 3C. However, the write transistor T41 may include a first channel region WCH4, and a storage node SN4 may be between the write transistor T41 and the read transistor T42.

In the semiconductor memory device 400, a thickness of the storage node SN4 may be greater than a thickness of the first channel region WCH4. More specifically, the first channel region WCH4 may have a first thickness D41 in a radial direction from a first central axis AX1, which is in a vertical direction (Z direction) that is a lengthwise direction of the write word line WWL, and the storage node SN4 may have a second thickness D42 in a radial direction from a second central axis AX2, which is in the vertical direction (Z direction) that is a lengthwise direction of the read word line RWL. Here, the second thickness D42 may be greater than the first thickness D41.

Although FIG. 6 illustrates a configuration in which the thickness of the storage node SN4 is greater than the thickness of the first channel region WCH4, example embodiments are not limited thereto. For example, the first channel region WCH4 may have a greater thickness than the storage node SN4.

The first channel region WCH4 may be integrally connected to the storage node SN4. The first channel region WCH4 may include a main channel portion WCA4 surrounding the write word line WWL and a channel contact portion WCB4 in contact with the write bit line WBL. The main channel portion WCA4 may be integrally connected to the channel contact portion WCB4. Detailed descriptions of the main channel portion WCA4 and the channel contact portion WCB4 are substantially the same as those of the main channel portion WCA and the channel contact portion WCB, which have been provided with reference to FIGS. 1 and 3A to 3C. The storage node SN4 may have a structure surrounding the read word line RWL and the second gate dielectric film 132B. A detailed configuration of the storage node SN4 may substantially be the same as that of the storage node SN, which has been described with reference to FIGS. 1, 2, and 3A to 3C.

Figure 7:
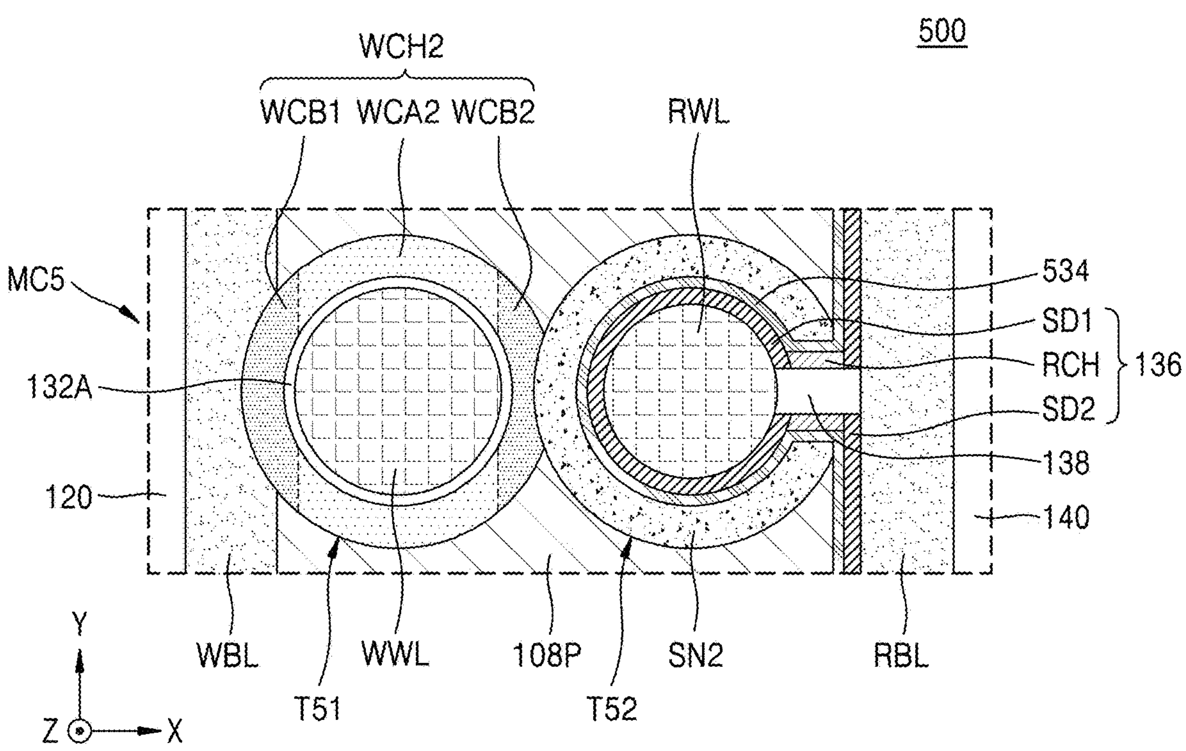

Referring to FIG. 7, the semiconductor memory device 500 may have the same or substantially the same configuration as the semiconductor memory device 200 described with reference to FIG. 4. However, the semiconductor memory device 500 may include a memory cell MC5 including a write transistor T51 and a read transistor T52.

In the memory cell MC5, the write transistor T51 and the read transistor T52 may have the same or substantially the same configurations as the write transistor T21 and the read transistor T22, which have been described with reference to FIG. 4. However, the read transistor T52 may include a second gate dielectric film 534 including a ferroelectric material.

The second gate dielectric film 534 may include a portion surrounding the read word line RWL, a portion between the second channel region RCH and the storage node SN2, and a portion that is apart from the read bit line RBL in a first lateral direction (X direction) with the second source/drain region SD2 therebetween and extends parallel to the read bit line RBL in a second lateral direction (Y direction).

The ferroelectric material that may be included in the second gate dielectric film 534 may include at least one oxide selected from hafnium (Hf), silicon (Si), aluminum (Al), zirconium (Zr), yttrium (Y), lanthanum (La), gadolinium (Gd), and strontium (Sr). For example, the ferroelectric material may include hafnium oxide (HfO), hafnium zirconium oxide (HZO), hafnium titanium oxide, or hafnium silicon oxide. The ferroelectric material may further include a dopant as needed. The dopant may include at least one element selected from silicon (Si), aluminum (Al), zirconium (Zr), yttrium (Y), lanthanum (La), gadolinium (Gd), scandium (Sc), strontium (Sr), magnesium (Mg), and barium (Ba), without being limited thereto.

In various example embodiments, the second gate dielectric film 534 may include a hafnium-based oxide. For example, the second gate dielectric film 534 may include one or more of hafnium oxide (HfO), hafnium zirconium oxide (HZO), hafnium titanium oxide, or hafnium silicon oxide. When the second gate dielectric film 534 includes a hafnium-based oxide, the second gate dielectric film 534 may or may not further include a dopant including at least one element selected from Si, Al, Zr, Y, La, Gd, Sc, Sr, Mg, and Ba.

In some example embodiments, the second gate dielectric film 534 may include a stack structure including a plurality of ferroelectric sub-layers including different materials from each other. Alternatively or additionally, the second gate dielectric film 534 may have a stack structure of at least one ferroelectric sub-layer and a dielectric layer. A constituent material of each of the ferroelectric sub-layers may be selected from the described examples of the constituent material of the second gate dielectric film 534. The dielectric film may include a silicon oxide film, a high-k dielectric film, or a combination thereof. The high-k dielectric film may include a metal oxide or a metal oxynitride having a higher dielectric constant than a silicon oxide film.

Figure 8:
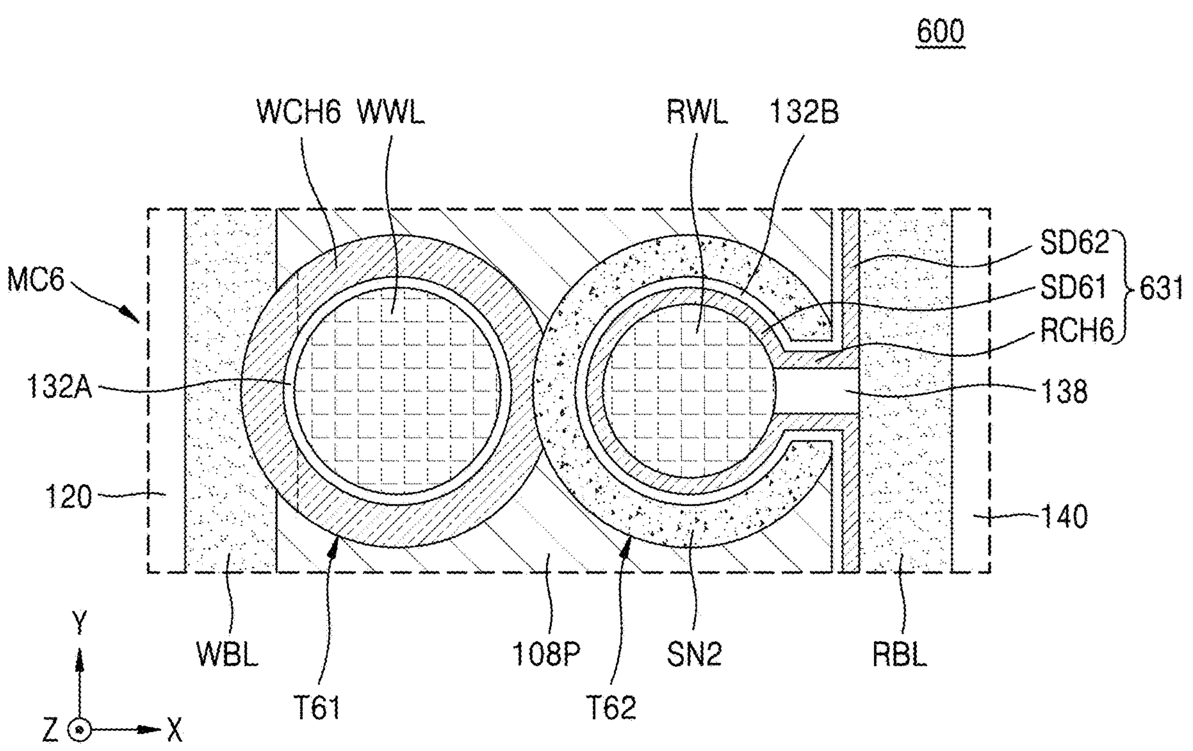

Referring to FIG. 8, the semiconductor memory device 600 may have the same or substantially the same configuration as the semiconductor memory device 100 described with reference to FIGS. 1, 2, and 3A to 3C. However, the semiconductor memory device 600 may include a memory cell MC6 including a write transistor T61 and a read transistor T62.

In the memory cell MC6, the write transistor T61 and the read transistor T62 may have the same or substantially the same configurations as the write transistor T1 and the read transistor T2, which have been described with reference to FIGS. 1, 2, and 3A to 3C. However, the write transistor T61 may include a first channel region WCH6 including an oxide semiconductor. The read transistor T62 may include an oxide semiconductor structure 636. In the read transistor T62, the oxide semiconductor structure 636 may include a first source/drain region SD61, a second channel region RCH6, and a second source/drain region SD62 of the read transistor T62. The first source/drain region SD61, the second channel region RCH6, and the second source/drain region SD62 have the same or substantially the same configurations as the first source/drain region SD1, the second channel region RCH, and the second source/drain region SD2 described with reference to FIGS. 2 and 3A to 3C except that each of the first source/drain region SD61, the second channel region RCH6, and the second source/drain region SD62 includes the oxide semiconductor.

The first channel region WCH6 and the oxide semiconductor structure 636 may include the same oxide semiconductor material as each other or different oxide semiconductor materials from each other. The oxide semiconductor material included in the first channel region WCH6 and the oxide semiconductor structure 636 may include at least selected from InGaZnO (IGZO), Sn-IGZO, InWO (IWO), InZnO (IZO), ZnSnO (ZTO), ZnO, ZnON, yttrium-doped zinc oxide (YZO), InGaSiO, InO, SnO, TiO, ZnON, MgZnO, InZnO, ZrInZnO, HfInZnO, SnInZnO, AlSnInZnO, SiInZnO, AlZnSnO, GaZnSnO, and ZrZnSnO, without being limited thereto. In various example embodiments, each of the first channel region WCH6 and the oxide semiconductor structure 636 may further include at least one dopant selected from aluminum (Al), boron (B), arsenic (As), fluorine (F), and hydrogen (H) in addition to the at least one oxide semiconductor material selected from the oxide semiconductor materials described above.

Figure 9:
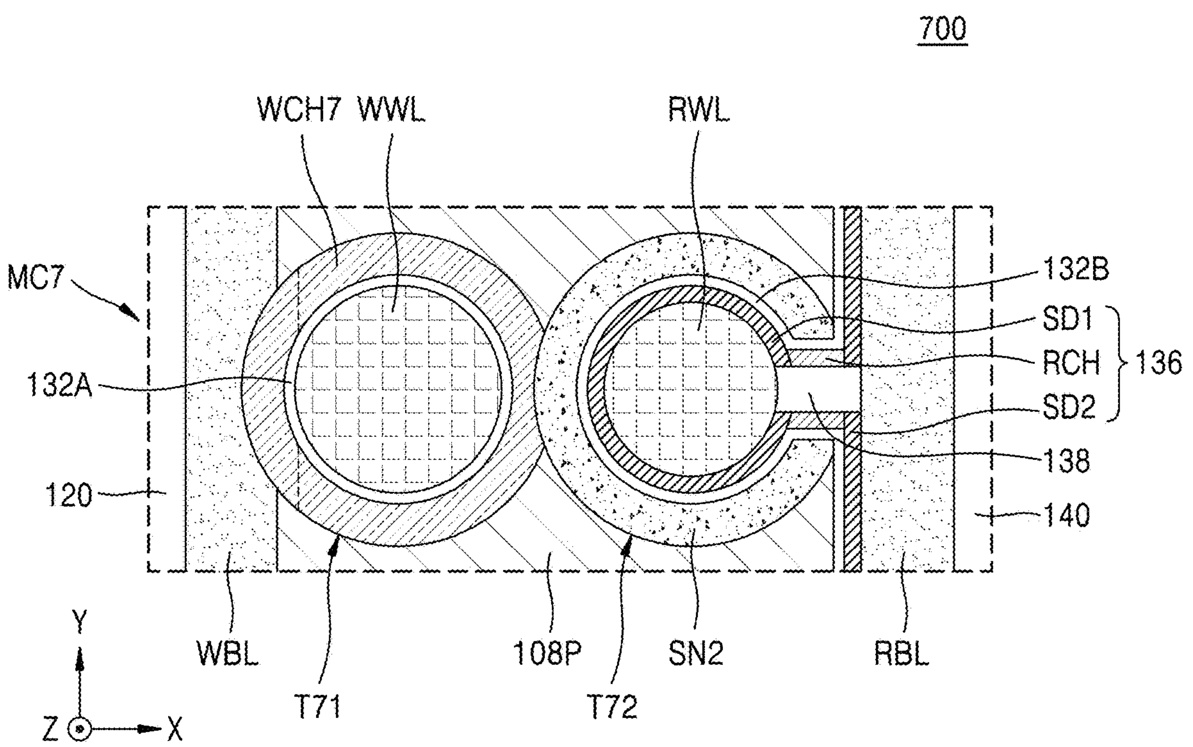

Referring to FIG. 9, the semiconductor memory device 700 may have substantially the same configuration as the semiconductor memory device 200 described with reference to FIG. 4. However, the semiconductor memory device 700 may include a memory cell MC7 including a write transistor T71 and a read transistor T72.

In the memory cell MC7, the write transistor T71 and the read transistor T72 may have the same or substantially the same configurations as the write transistor T21 and the read transistor T22, which have been described with reference to FIG. 4. However, the write transistor T61 may include a first channel region WCH7 including an oxide semiconductor. A detailed description of the first channel region WCH7 is substantially the same as that of the first channel region WCH6, which has been provided with reference to FIG. 8.

Figure 10:
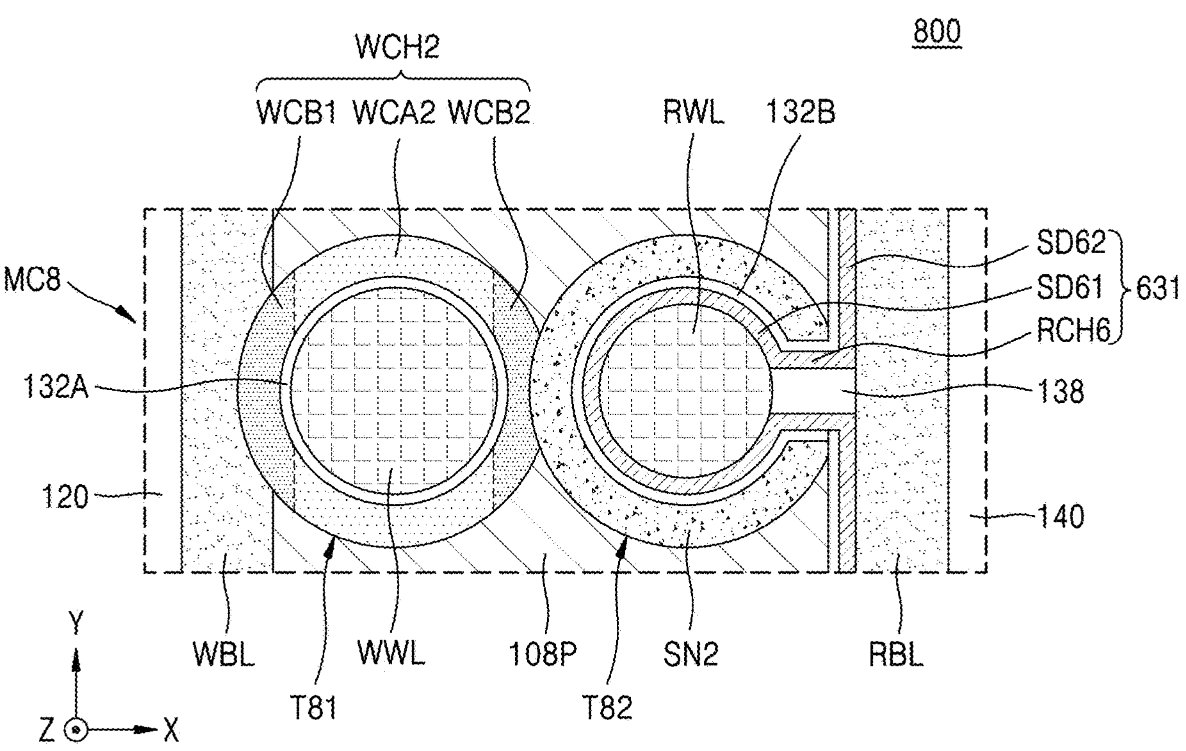

Referring to FIG. 10, the semiconductor memory device 800 may have the same or substantially the same configuration as the semiconductor memory device 200 described with reference to FIG. 4. However, the semiconductor memory device 800 may include a memory cell MC8 including a write transistor T81 and a read transistor T82.

In the memory cell MC8, the write transistor T81 and the read transistor T82 may have the same or substantially the same configurations as the write transistor T21 and the read transistor T22, which have been described with reference to FIG. 4. However, the read transistor T82 may include an oxide semiconductor structure 636. In the read transistor T82, the oxide semiconductor structure 636 may include a first source/drain region SD61, a second channel region RCH6, and a second source/drain region SD62 of the read transistor T82. The first source/drain region SD61, the second channel region RCH6, and the second source/drain region SD62 have the same or substantially the same configurations as the first source/drain region SD1, the second channel region RCH, and the second source/drain region SD2 described with reference to FIGS. 2 and 3A to 3C except that each of the first source/drain region SD61, the second channel region RCH6, and the second source/drain region SD62 includes the oxide semiconductor.

Figure 11:
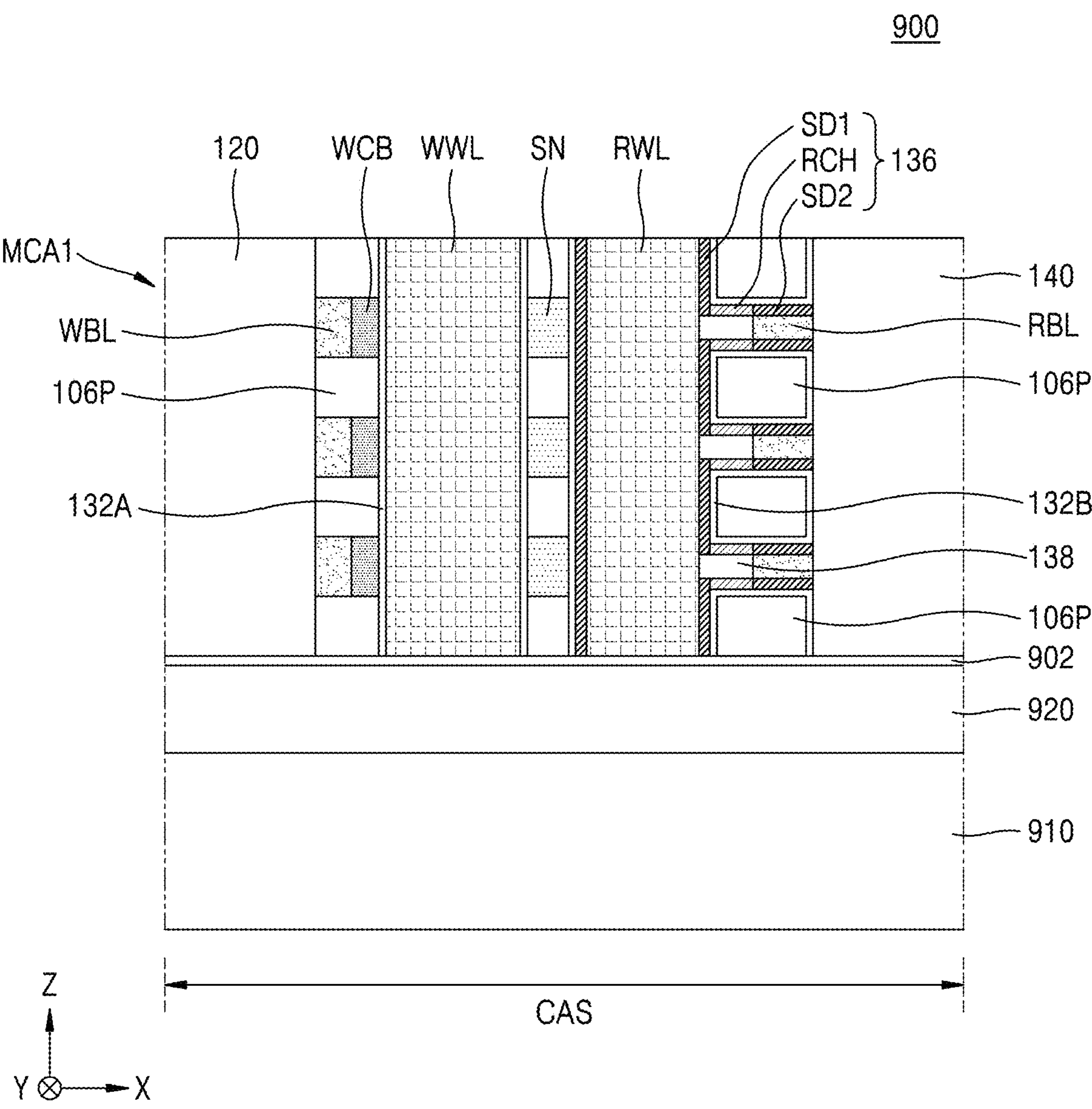
FIG. 11 is a cross-sectional view of a semiconductor memory device according to some example embodiments.

FIG. 11 is a cross-sectional view of a semiconductor memory device 900 according to some example embodiments. In FIG. 11, the same reference numerals are used to denote the same elements as in FIGS. 1, 2, and 3A to 3C, and thus, detailed descriptions thereof are omitted.

Referring to FIG. 11, the semiconductor memory device 900 may have substantially the same configuration as the semiconductor memory device 100 described with reference to FIGS. 1, 2, and 3A to 3C. However, the semiconductor memory device 900 may include a cell array structure CAS. The cell array structure CAS may include a substrate 910 and a memory cell array MCA1 on the substrate 910. An interlayer insulating film 920 may be between the substrate 910 and the memory cell array MCA1. A detailed configuration of the memory cell array MCA1 is the same as that described with reference to FIGS. 1, 2, and 3A to 3C.

An etch stop film 102 may be between the interlayer insulating film 920 and the memory cell array MCA1. A bottom surface of each of the write word line WWL and the read word line RWL may be in contact with the etch stop film 102. A top surface of each of the write word line WWL and the read word line RWL may be connected to an upper wiring structure (not shown).

The substrate 910 may include a semiconductor substrate including one or more of Si, Ge, or SiGe. The interlayer insulating film 920 may include silicon oxide, silicon nitride, silicon oxynitride, or a combination thereof.

Figure 12:
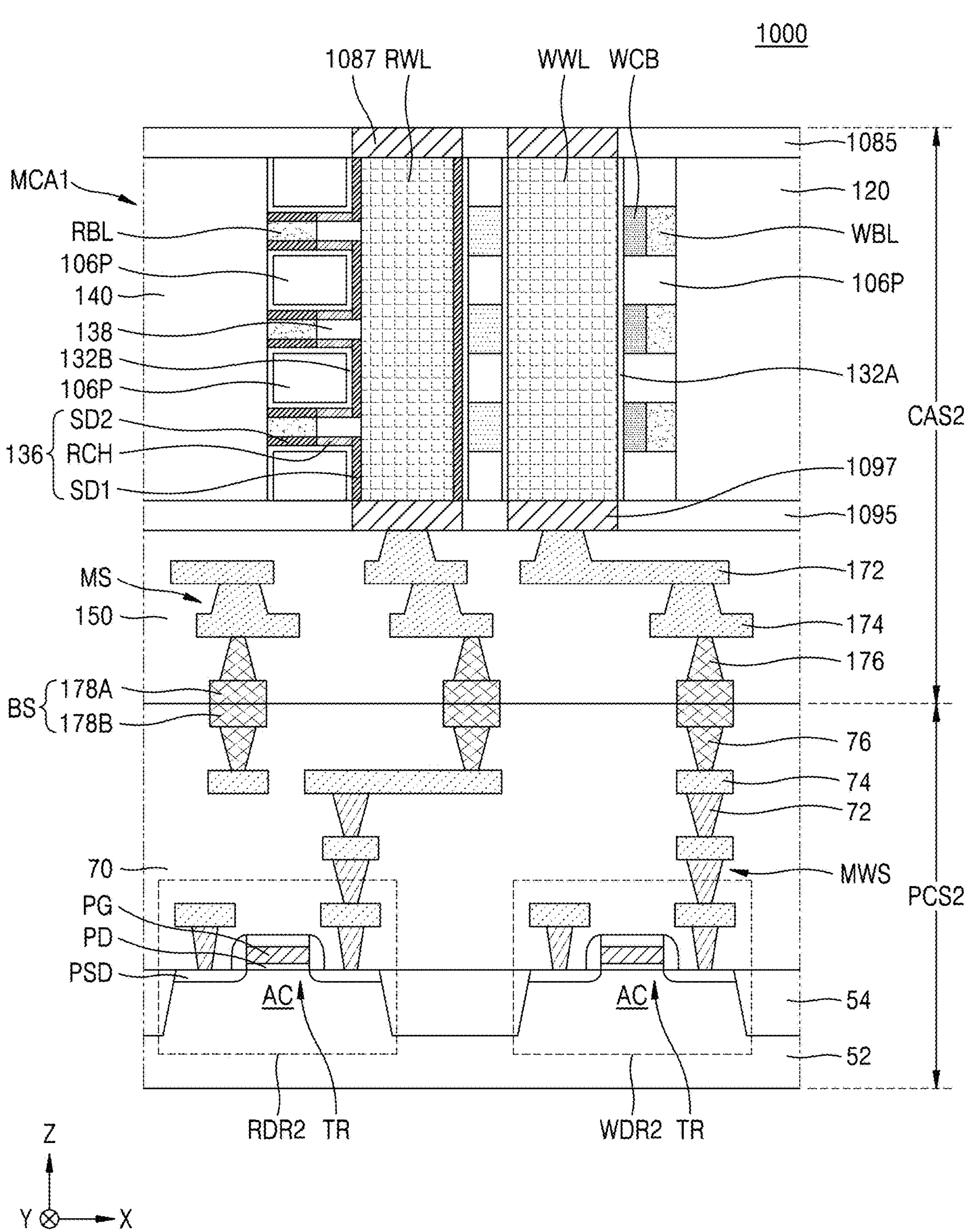
FIG. 12 is a cross-sectional view of a semiconductor memory device according to some example embodiments.

FIG. 12 is a cross-sectional view of a semiconductor memory device 1000 according to some example embodiments. In FIG. 12, the same reference numerals are used to denote the same elements as in FIGS. 1, 2, and 3A to 3C, and thus, detailed descriptions thereof are omitted.

Referring to FIG. 12, the semiconductor memory device 1000 may have the same or substantially the same configuration as the semiconductor memory device 100 described with reference to FIGS. 1, 2, and 3A to 3C. However, the semiconductor memory device 1000 may include a memory cell array MCA1 and a peripheral circuit structure PCS2, which overlap each other in a vertical direction (Z direction).

In various example embodiments, the semiconductor memory device 1000 may have a chip-to-chip (C2C) structure. To form the C2C structure, a cell array structure CAS2 including the memory cell array MCA1 may be formed on a first wafer, and the peripheral circuit structure PCS2 may be formed on a second wafer that is different from the first wafer. Thereafter, the cell array structure CAS2 and the peripheral circuit structure PCS2 may be connected to each other by using a bonding scheme. The bonding scheme may refer to a method of bonding a first bonding metal pad 178A included in the cell array structure CAS2 to a second bonding metal pad 178B included in the peripheral circuit structure PCS2 such that the first bonding metal pad 178A and the second bonding metal pad 178B are electrically connectable to each other. The first bonding metal pad 178A and the second bonding metal pad 178B may constitute or correspond to a bonding structure BS.

In various example embodiments, when each of the first bonding metal pad 178A and the second bonding metal pad 178B in the bonding structure BS includes copper (Cu), the bonding scheme may be referred to as a Cu—Cu bonding scheme. In other embodiments, each of the first bonding metal pad 178A and the second bonding metal pad 178B in the bonding structure BS may independently or concurrently include aluminum (Al) and/or tungsten (W).

The peripheral circuit structure PCS2 may have the same or substantially the same configuration as the peripheral circuit structure PCS described with reference to FIG. 3B. The peripheral circuit structure PCS2 may include a write word line driver WDR2 and a read bit line driver RDR2. The write word line driver WDR2 may be connected to the write word line WWL through a multilayered wiring structure MWS included in the peripheral circuit structure PCS2. The read bit line driver RDR2 may be connected to a read word line RWL through the multilayered wiring structure MWS included in the peripheral circuit structure PCS2. Each of the plurality of transistors TR included in the peripheral circuit structure PCS2 may be electrically connected to the memory cell array MCA1 through a plurality of multilayered wiring structures MWS and a plurality of bonding structures BS.

In the cell array structure CAS2, a top surface of the memory cell array MCA1 may be covered by a first capping insulating film 1085. A bottom surface of the memory cell array MCA1 may be covered by a second capping insulating film 1095. As used herein, the bottom surface of the memory cell array MCA1 refers to a surface of the memory cell array MCA1, which faces the peripheral circuit structure PCS2, and the top surface of the memory cell array MCA1 refers to a surface of the memory cell array MCA1, which is opposite to the bottom surface.

The cell array structure CAS2 may include a plurality of first contact plugs 1087 and a plurality of second contact plugs 1097. The plurality of first contact plugs 1087 may pass through the first capping insulating film 1085 and be selectively connected to the write word line WWL and the read word line RWL. The plurality of second contact plugs 1097 may pass through the second capping insulating film 1095 and be selectively connected to the write word line WWL and the read word line RWL. Each of the plurality of second contact plugs 1097 may be connected to the bonding structure BS through a wiring structure MS. The wiring structure MS may include a first upper wiring layer 172, a second upper wiring layer 174, and a third upper wiring layer 176. Each of the first capping insulating film 1085 and the second capping insulating film 1095 may include a silicon oxide film, a silicon nitride film, or a combination thereof. Each of the first upper wiring layer 172, the second upper wiring layer 174, the third upper wiring layer 176, the first contact plug 1087, and the second contact plug 1097 may include a metal or a conductive metal nitride. For example, each of the first upper wiring layer 172, the second upper wiring layer 174, the third upper wiring layer 176, the first contact plug 1087, and the second contact plug 1097 may include W, Al, Mo, Ru, Al, Co, Ti, TIN, Ta, TaN, WN, or a combination thereof, without being limited thereto.

In the cell array structure CAS2, each of the first upper wiring layer 172, the second upper wiring layer 174, the third upper wiring layer 176, and a plurality of first bonding metal pads 178A may be covered by an interlayer insulating film 150. The interlayer insulating film 150 may include a silicon oxide film, a silicon nitride film, or a combination thereof.

In the peripheral circuit structure PCS2, a plurality of second bonding metal pads 178B may be connected to the multilayered wiring structure MWS through an upper wiring layer 76 and connected to a plurality of circuits included in the peripheral circuit structure PCS2 through the multilayered wiring structure MWS. In the peripheral circuit structure PCS2, the interlayer insulating film 70 may cover the plurality of transistors TR, the plurality of contact plugs 72, the plurality of conductive lines 74, the upper wiring layer 76, and the plurality of second bonding metal pads 178B.

Each of the write word line WWL and the read word line RWL in the memory cell array MCA1 may be connected to the first bonding metal pad 178A through the second contact plug 1097 and the wiring structure MS, and the plurality of second bonding metal pads 178B in the peripheral circuit structure PCS2 may be bonded to the plurality of first bonding metal pads 178A included in the cell array structure CAS2 and electrically connectable to the plurality of first bonding metal pads 178A. Accordingly, the write word line WWL in the memory cell array MCA1 may be connected to the write word line driver WDR2 included in the peripheral circuit structure PCS2 through the bonding structure BS, and the read word line RWL included in the memory cell array MCA1 may be connected to the read bit line driver RDR2 included in the peripheral circuit structure PCS2 through the bonding structure BS.

FIG. 13 is a cross-sectional view of a semiconductor memory device 1100 according to some example embodiments. In FIG. 13, the same reference numerals are used to denote the same elements as in FIGS. 1 to 11, and thus, detailed descriptions thereof are omitted.

Referring to FIG. 13, the semiconductor memory device 1100 may have the same or substantially the same configuration as the semiconductor memory device 900 described with reference to FIG. 11. However, the semiconductor memory device 1100 may include a cell array structure CAS3 including a memory cell array MCA1 and a peripheral circuit structure PCS3 apart from the cell array structure CAS3 in a lateral direction (e.g., an X direction in FIG. 13).

The cell array structure CAS3 may have the same or substantially the same configuration as the cell array structure CAS described with reference to FIG. 11. However, the cell array structure CAS3 may include a substrate 52 and the memory cell array MCA1 on the substrate 52. An interlayer insulating film 70 may be between the substrate 52 and the memory cell array MCA1. Detailed descriptions of the memory cell array MCA1, the substrate 52, and the interlayer insulating film 70 are the same as those provided with reference to FIGS. 1, 2, and 3A to 3C.

The peripheral circuit structure PCS3 may have the same or substantially the same configuration as the peripheral circuit structure PCS described with reference to FIG. 3B. However, in each of the cell array structure CAS3 and the peripheral circuit structure PCS3, the etch stop film 102 may extend to cover the interlayer insulating film 70. In the peripheral circuit structure PCS3, a first upper interlayer insulating film 1120 may be at the same vertical level as the memory cell array MCA1. A plurality of through electrodes 1124 may pass through the first upper interlayer insulating film 1120 and the etch stop film 102 in the vertical direction (Z direction) and be connected to the conductive line 74 included in the multilayered wiring structure MWS.

The memory cell array MCA1 included in the cell array structure CAS3 and the first upper interlayer insulating film 1120 included in the peripheral circuit structure PCS3 may be covered by a second upper interlayer insulating film 1130. In each of the cell array structure CAS3 and the peripheral circuit structure PCS3, a plurality of contact plugs 1132 may pass through the second upper interlayer insulating film 1130 and be connected to a lower conductive structure. For example, in the cell array structure CAS3, each of the plurality of contact plugs 1132 may be selectively connected to a write word line WWL and a read word line RWL. In the peripheral circuit structure PCS3, each of the plurality of contact plugs 1132 may be connected to the through electrode 1124.

In each of the cell array structure CAS3 and the peripheral circuit structure PCS3, the second upper interlayer insulating film 1130 and the plurality of contact plugs 1132 may be covered by a third upper interlayer insulating film 1140, and each of a plurality of upper contact plugs 1142 may pass through the third upper interlayer insulating film 1140 in the vertical direction (Z direction) and be connected to the contact plug 1132. A plurality of upper conductive layers 1144 may be on the third upper interlayer insulating film 1140 and the plurality of upper contact plugs 1142. At least some of the plurality of upper conductive layers 1144 in the cell array structure CAS3 may be connected to the upper conductive layer 1144 in the peripheral circuit structure PCS3. Each of the write word line WWL and the read word line RWL in the cell array structure CAS3 may be electrically connected to the peripheral circuit structure PCS3 through the contact plug 1132, the upper contact plug 1142, and the upper conductive layer 1144.

Figure 14:
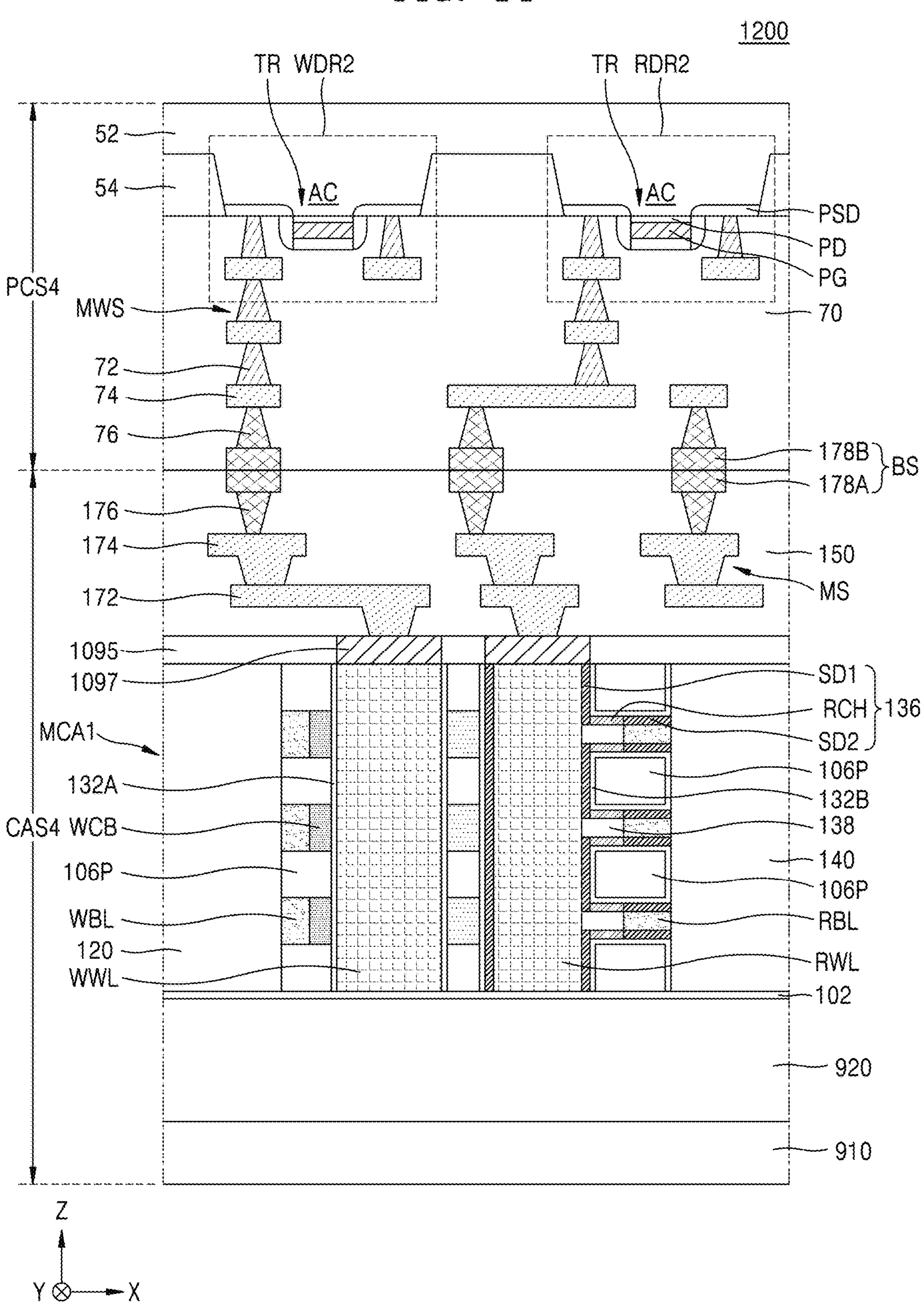
FIG. 14 is a cross-sectional view of a semiconductor memory device according to some example embodiments.

FIG. 14 is a cross-sectional view of a semiconductor memory device 1200 according to some example embodiments. In FIG. 14, the same reference numerals are used to denote the same elements as in FIGS. 1 to 12, and thus, detailed descriptions thereof are omitted.

Referring to FIG. 14, the semiconductor memory device 1200 may have substantially the same configuration as the semiconductor memory device 100 described with reference to FIGS. 1, 2, and 3A to 3C. However, the semiconductor memory device 1200 may include a memory cell array MCA1 and a peripheral circuit structure PCS4, which overlap each other in a vertical direction (Z direction).

In various example embodiments, the semiconductor memory device 1200 may have a C2C structure. To manufacture the semiconductor memory device 1200, in a similar manner to that described with reference to FIG. 11, a cell array structure CAS4 including the memory cell array MCA1 and a wiring structure MS may be formed on a lower structure including an interlayer insulating film 920 and an etch stop film 102 that are stacked on a substrate 910. In addition, after the peripheral circuit structure PCS4 having a similar structure to the peripheral circuit structure PCS2 described with reference to FIG. 12 is formed, the cell array structure CAS4 and the peripheral circuit structure PCS4 may be connected to each other by using bonding scheme in a similar manner to that described with reference to FIG. 12. In the semiconductor memory device 1200, the memory cell array MCA1 may have a structure between a substrate 52 of the peripheral circuit structure PCS4 and the substrate 910 of the cell array structure CAS4.

In the semiconductor memory devices 200, 300, 400, 500, 600, 700, 800, 900, 1000, 1100, and 1200 described with reference to FIGS. 4 to 14, memory cell arrays may have 3D structures in which the plurality of memory cells MC1, MC2, MC3, MC4, MC5, MC6, MC7, and MC8 are repeatedly arranged in the first lateral direction (X direction), the second lateral direction (Y direction), and the vertical direction (Z direction). Thus, structures that may miniaturize or reduce the size of the semiconductor memory devices 200, 300, 400, 500, 600, 700, 800, 900, 1000, 1100, and 1200 and/or are advantageous for high-density 3D arrangement may be provided. Furthermore, in the semiconductor memory devices 200, 300, 400, 500, 600, 700, 800, 900, 1000, 1100, and 1200, each of the plurality of memory cells MC1, MC2, MC3, MC4, MC5, MC6, MC7, and MC8 may constitute a 3D stack-type memory cell array that includes two transistors and does not include a capacitor. Thus, a compact structure advantageous for high integration of semiconductor memory devices may be provided, and problems due to the density limit of bit lines, which have been encountered in a semiconductor memory device having a typical 2D structure, may be overcome or at least partially overcome. Accordingly, the semiconductor memory devices 200, 300, 400, 500, 600, 700, 800, 900, 1000, 1100, and 1200 may provide excellent competitiveness in various aspects including one or more of performance, power, chip area, and cost.

Next, methods of manufacturing or fabricating semiconductor devices according to some example embodiments are described in detail.

FIGS. 15A to 29B are diagrams illustrating a method of manufacturing a semiconductor device, according to some example embodiments, wherein FIGS. 15A, 16A, 17A, 18A, 19A, 20A, 21A, 22A, 23A, 24A, 25A, 26A, 27A, 28A, and 29A are each a plan view illustrating the method of manufacturing the semiconductor device, according to the embodiments, and FIGS. 15B, 16B, 17B, 18B, 19B, 20B, 21B, 22B, 23B, 24B, 25B, 26B, 27B, 28B, and 29B are respectively cross-sectional views taken along lines X1-X1' of 15A, 16A, 17A, 18A, 19A, 20A, 21A, 22A, 23A, 24A, 25A, 26A, 27A, 28A, and 29A. FIGS. 15A, 16A, 17A, and 18A respectively illustrate planar configurations of top surfaces of FIGS. 15B, 16B, 17B, and 18B at a vertical level, and FIGS. 19A, 20A, 21A, 22A, 23A, 24A, 25A, 26A, 27A, 28A, and 29A respectively illustrate planar configurations at vertical levels taken along lines LV1-LV1 of FIGS. 19B, 20B, 21B, 22B, 23B, 24B, 25B, 26B, 27B, 28B, and 29B. An example of a method of manufacturing the semiconductor memory device 100 described with reference to FIGS. 1, 2, and 3A to 3C is described with reference to FIGS. 15A to 29B. In FIGS. 15A to 29B, the same reference numerals are used to denote the same elements as in FIGS. 1, 2, and 3A to 3C, and thus, detailed descriptions thereof are omitted.

Figure 15A:
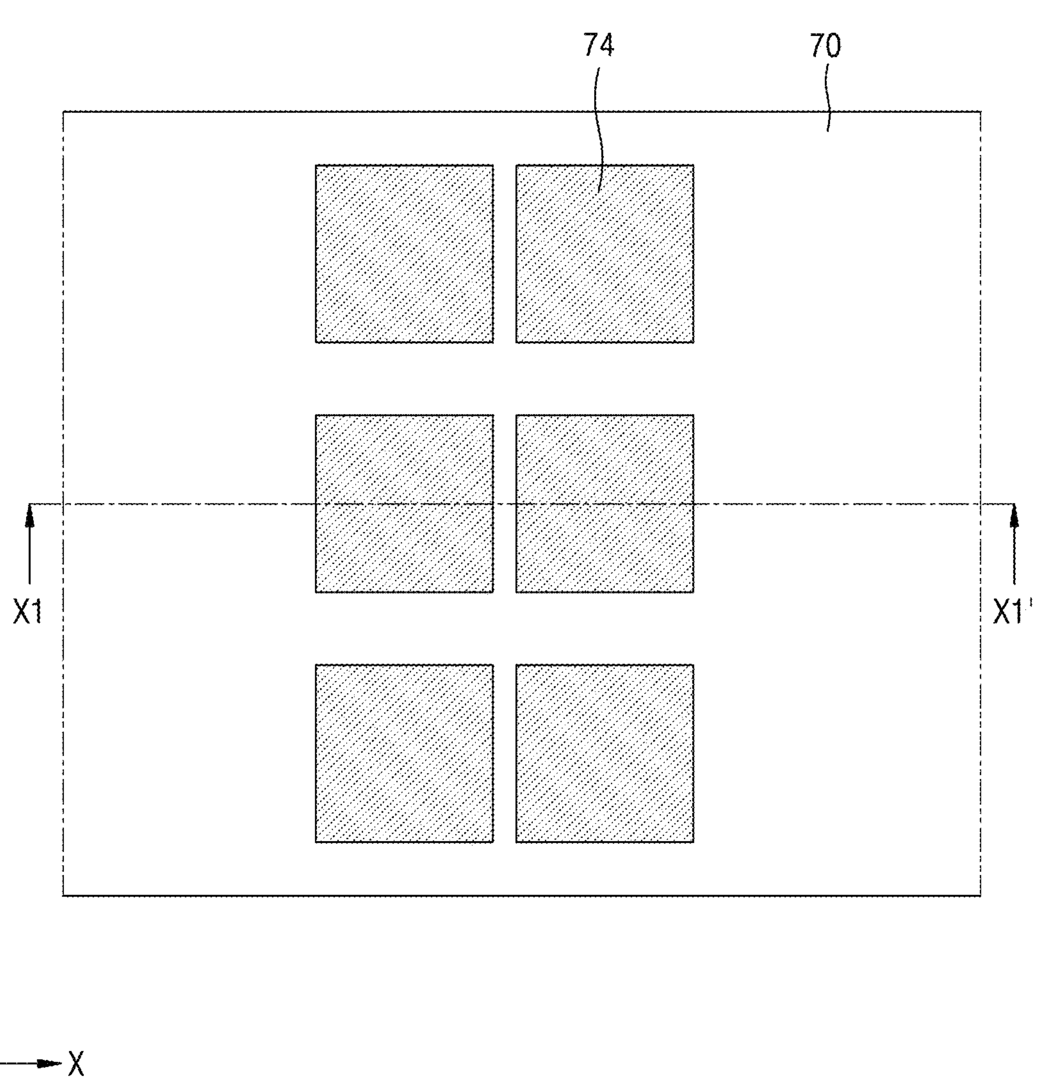
Figure 15B:
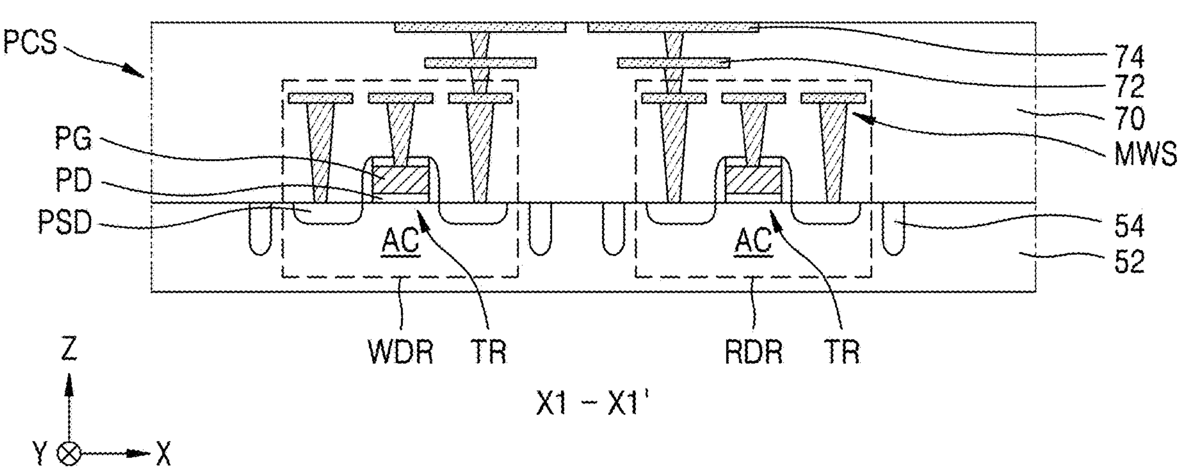

Referring to FIGS. 15A and 15B, a peripheral circuit structure PCS including a plurality of transistors TR and a multilayered wiring structure MWS on the substrate 52 may be formed, e.g., may be formed on a first wafer. An interlayer insulating film 70 and a plurality of conductive lines 74 may be exposed at a top surface of the peripheral circuit structure PCS.

Figure 16A:
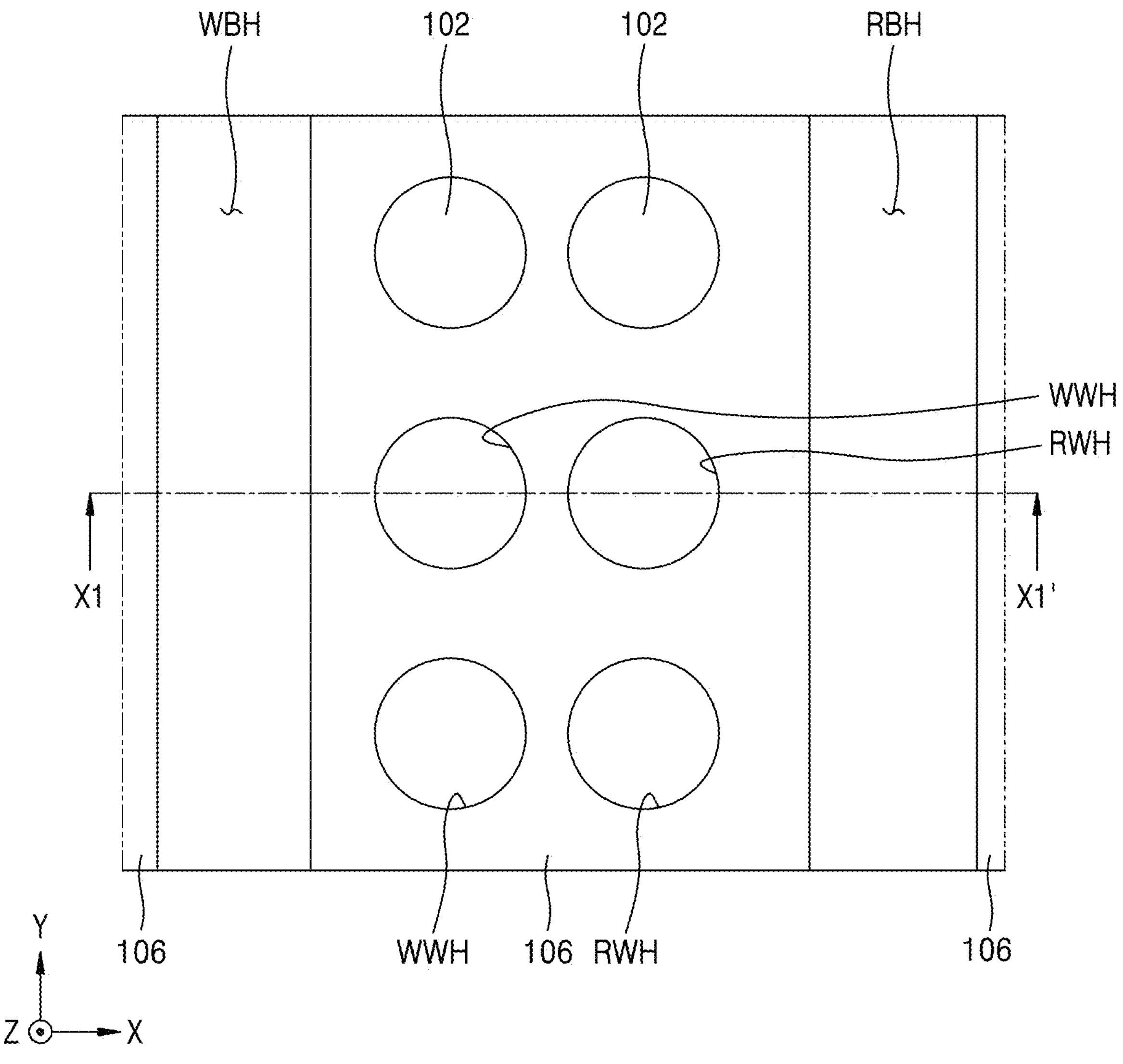
Figure 16B:
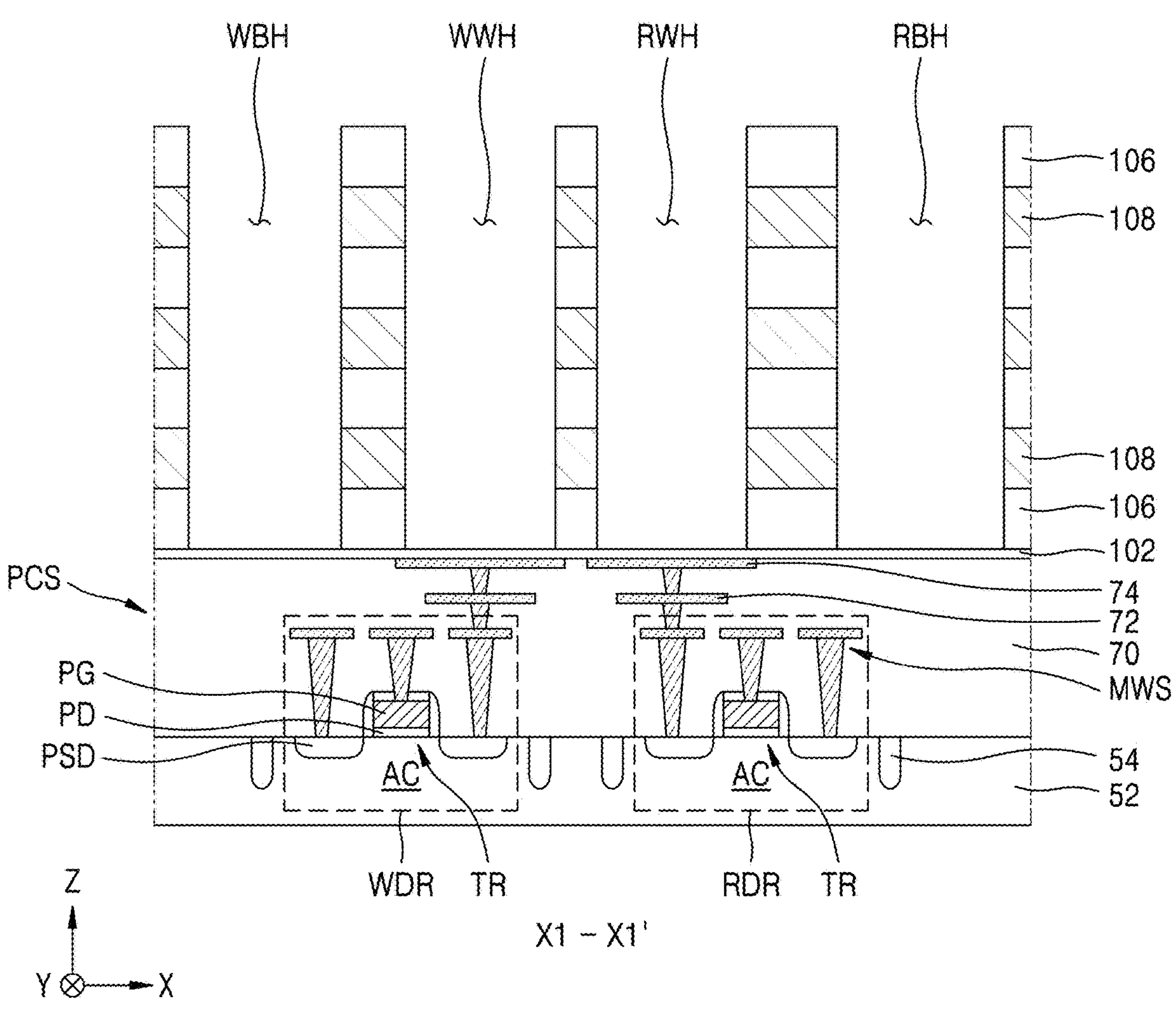

Referring to FIGS. 16A and 16B, an etch stop film 102 may be formed to cover the interlayer insulating film 70 and the plurality of conductive lines 74. Thereafter, a plurality of first insulating films 106 and a plurality of second insulating films 108 may be alternately one-by-one stacked on the etch stop film 102, e.g., with a process such as but not limited to one or more of a chemical vapor deposition (CVD) process or an atomic layer deposition (ALD) process or a physical vapor deposition (PVD) process. Afterwards, a first bit line hole WBH, a second bit line hole RBH, a plurality of first word line holes WWH, and a plurality of second word line holes RWH may be formed, e.g., with an etch process, to pass through the plurality of first insulating films 106 and the plurality of second insulating films 108 in a vertical direction (Z direction). Each of the first bit line hole WBH and the second bit line hole RBH may extend linearly in a second lateral direction (Y direction). The plurality of first word line holes WWH and the plurality of second word line holes RWH may each have an island-type hole pattern shape and be arranged in a line in the second lateral direction (Y direction) between the first bit line hole WBH and the second bit line hole RBH.

The plurality of first insulating films 106 and the plurality of second insulating films 108 may include materials having different etch selectivities from each other under various etching conditions, such as various dynamically determined (or, alternatively, predetermined) etching conditions. In various example embodiments, the plurality of first insulating films 106 may include a silicon oxide film and may or may not include a silicon nitride film, and the plurality of second insulating films 108 may include a silicon nitride film and may or may not include a silicon oxide film, without being limited thereto.

Figure 17A:
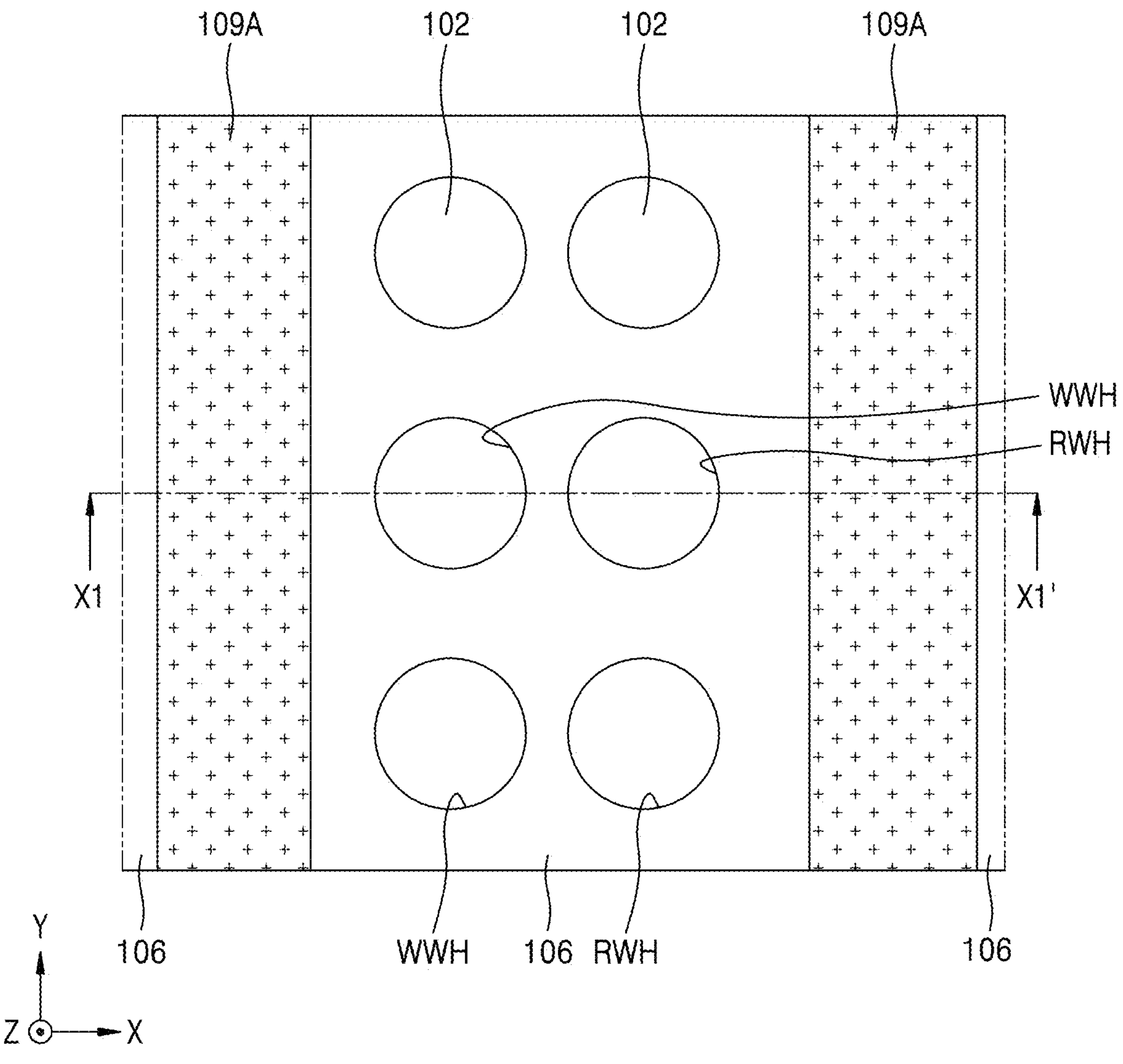
Figure 17B:
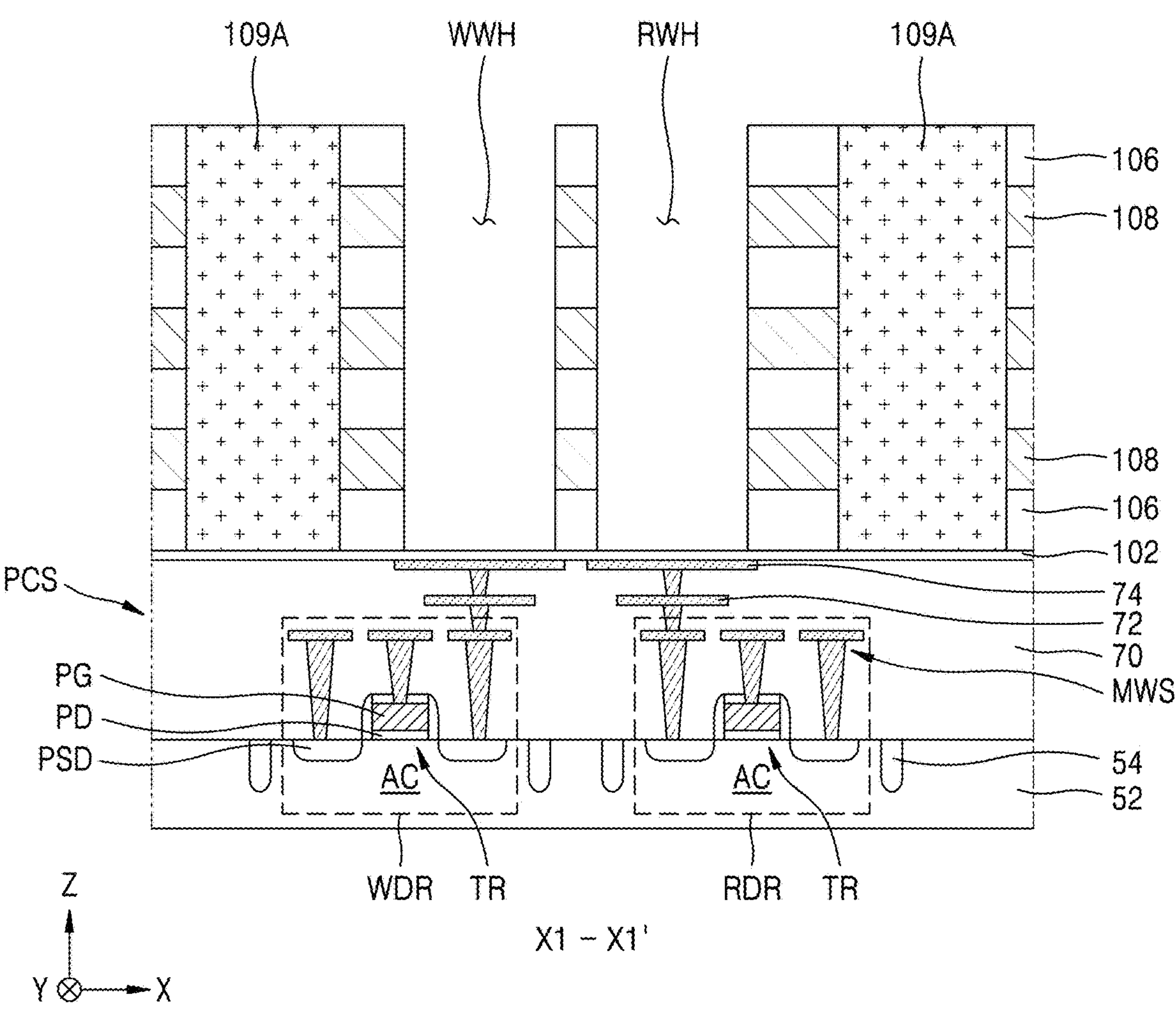

Referring to FIGS. 17A and 17B, a plurality of sacrificial films 109A may be formed, e.g., with one or more of a CVD process, ALD process, or PVD process, to fill the first bit line hole WBH and the second bit line hole RBH. In various example embodiments, the plurality of sacrificial films 109A may include polysilicon. In some example embodiments, an upper surface of the plurality of sacrificial films 109A may be planarized; however, example embodiments are not limited thereto. In some example embodiments, each of the plurality of sacrificial films 109A may include a silicon nitride liner and a silicon oxide plug surrounded by the silicon nitride liner. Alternatively or additionally, each of the plurality of sacrificial films 109A may include a silicon nitride liner and a metal plug surrounded by the silicon nitride liner.

Figure 18A:
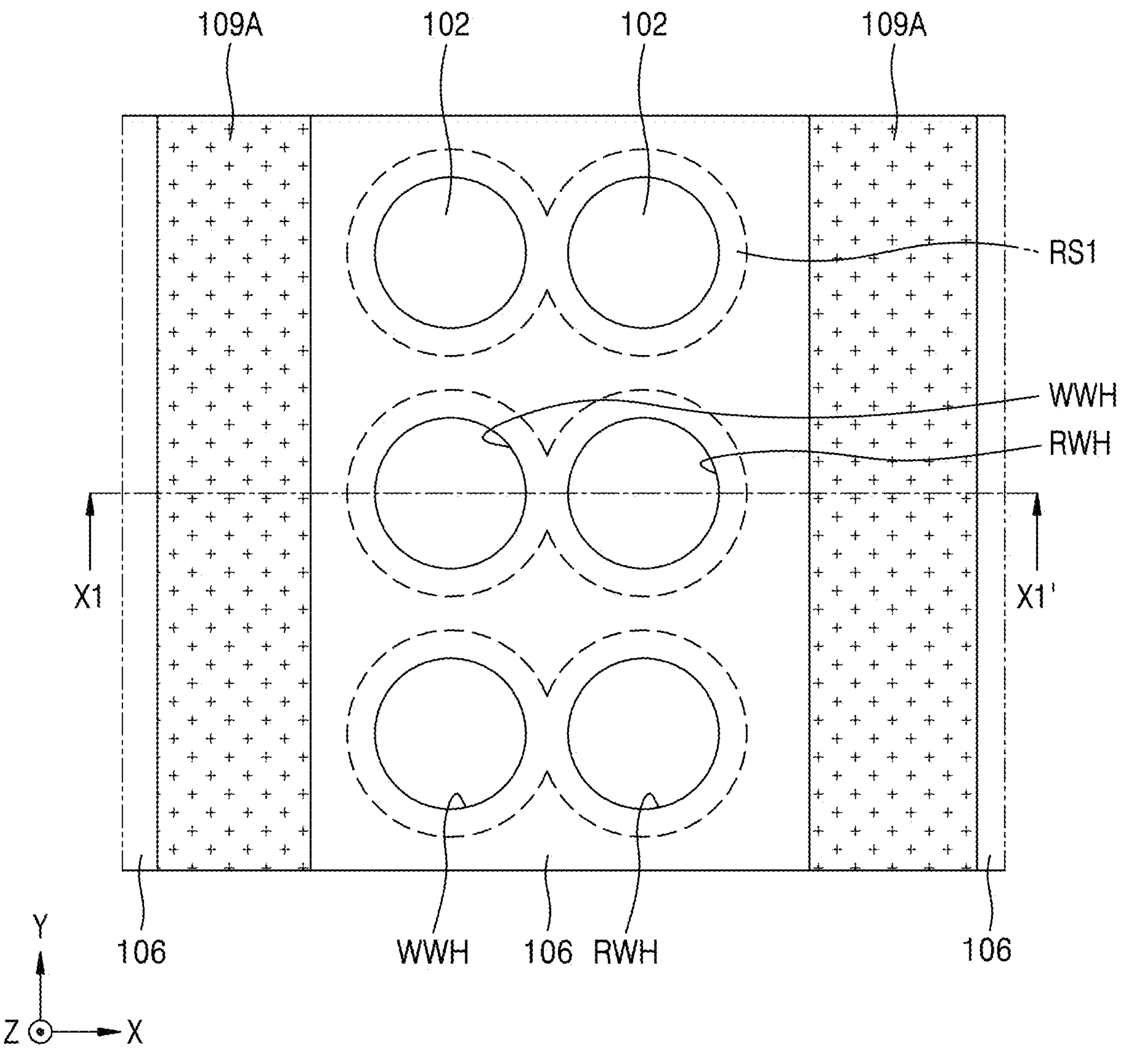
Figure 18B:
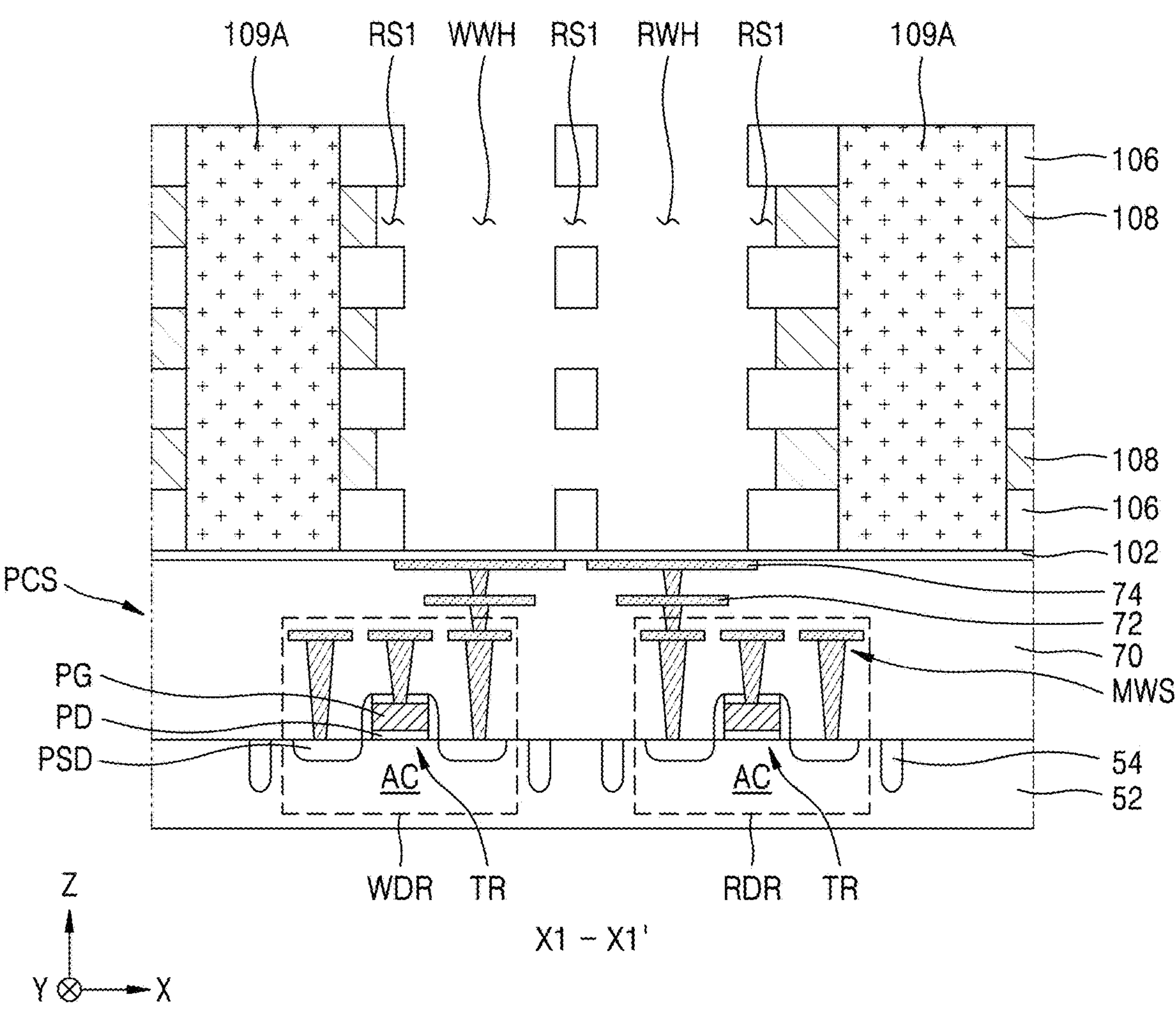

Referring to FIGS. 18A and 18B, in the resultant structure of FIGS. 17A and 17B, respective portions of the plurality of second insulating films 108, which are exposed through the plurality of first word line holes WWH and the plurality of second word line holes RWH, may be selectively etched to form a plurality of recess spaces RS1. The plurality of recess spaces RS1 may respectively expand in a radial direction from the plurality of first word line holes WWH and the plurality of second word line holes RWH in a lateral direction. From among the plurality of first word line holes WWH and the plurality of second word line holes RWH, one first word line hole WWH and one second word line hole RWH, which are adjacent to each other in a first lateral direction (X direction), may be connected to each other through some recess spaces RS1. In various example embodiments, the plurality of recess spaces RS1 may be formed by using a wet etching process.

Figure 19A:
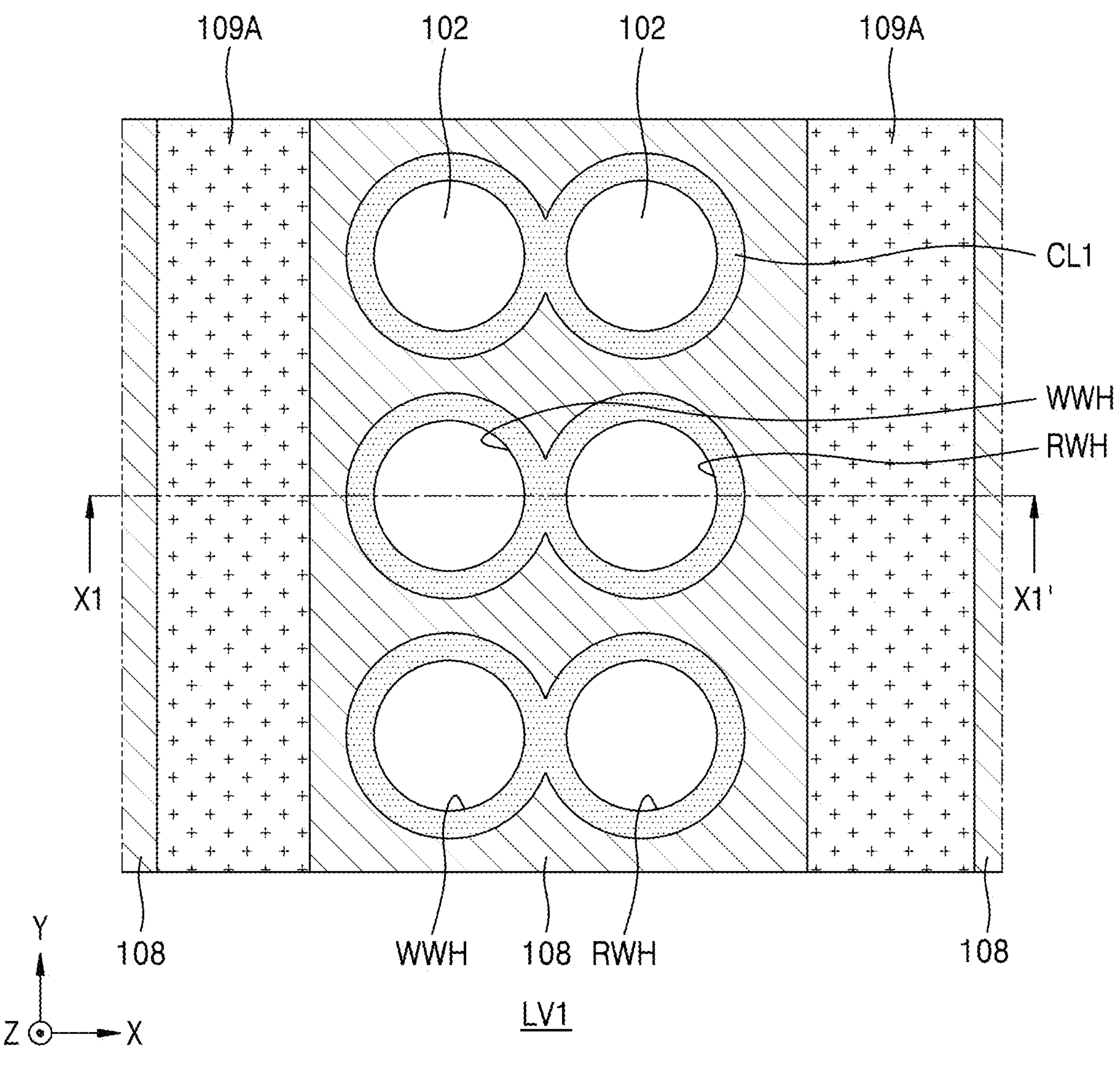
Figure 19B:
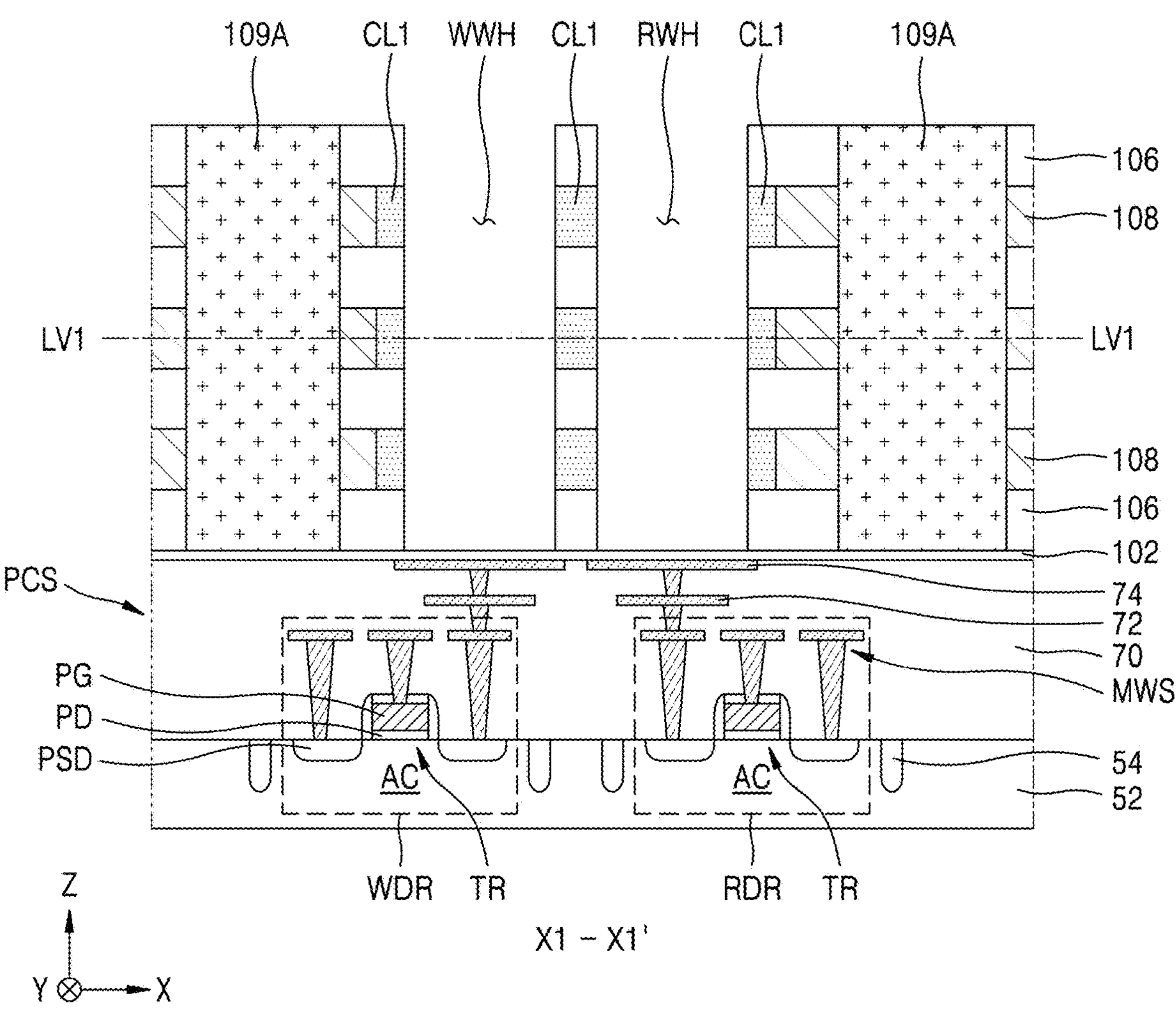

Referring to FIGS. 19A and 19B, in the resultant structure of FIGS. 18A and 18B, a semiconductor pattern CL1 may be formed to fill the plurality of recess spaces RS1. In various example embodiments, the semiconductor pattern CL1 may include polysilicon. Alternatively or additionally, the semiconductor pattern CL1 may include an oxide semiconductor. A detailed description of the oxide semiconductor is the same as a constituent material of the first channel region WCH6, which has been described with reference to FIG. 8.

Figure 20A:
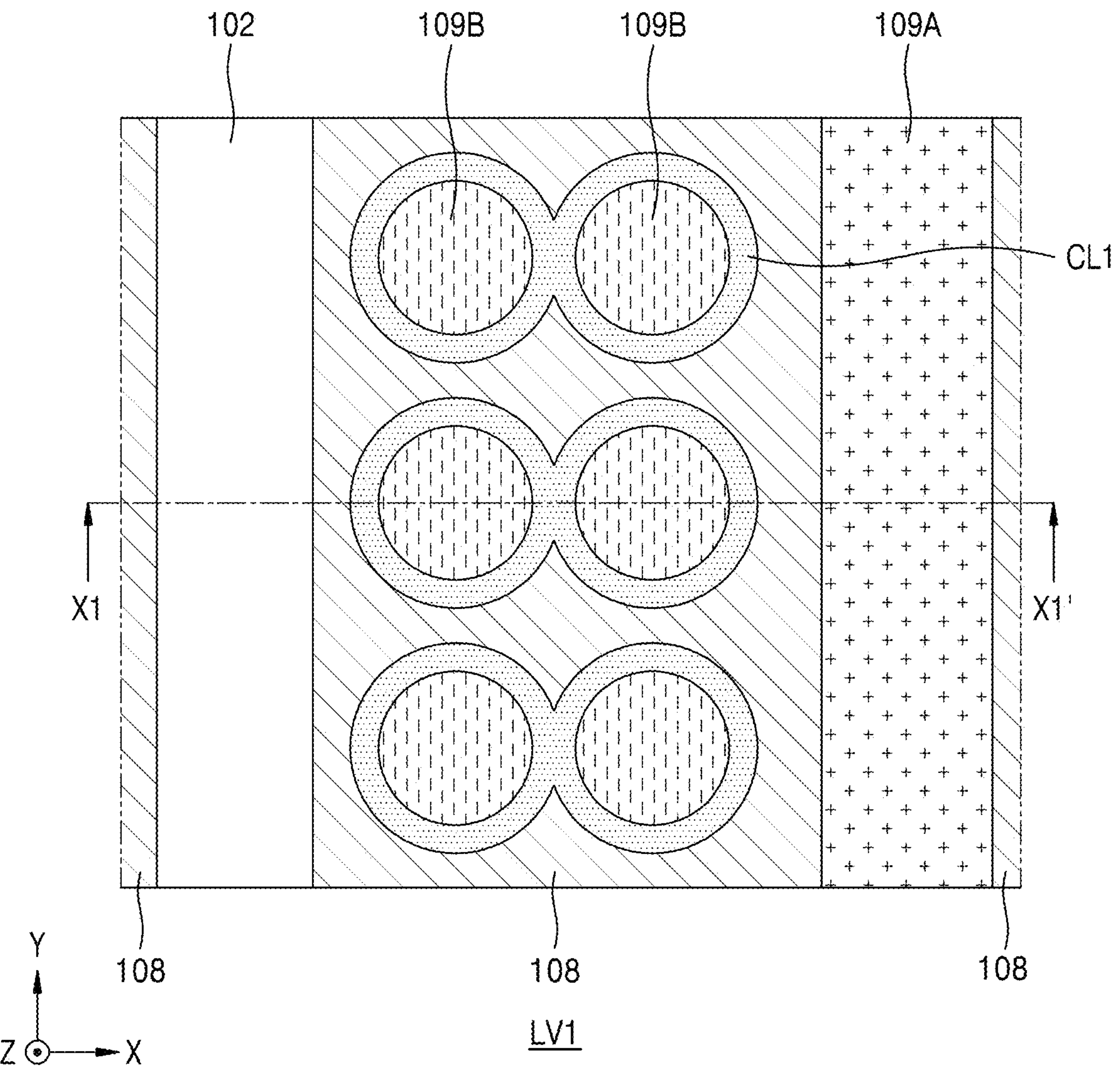
Figure 20B:
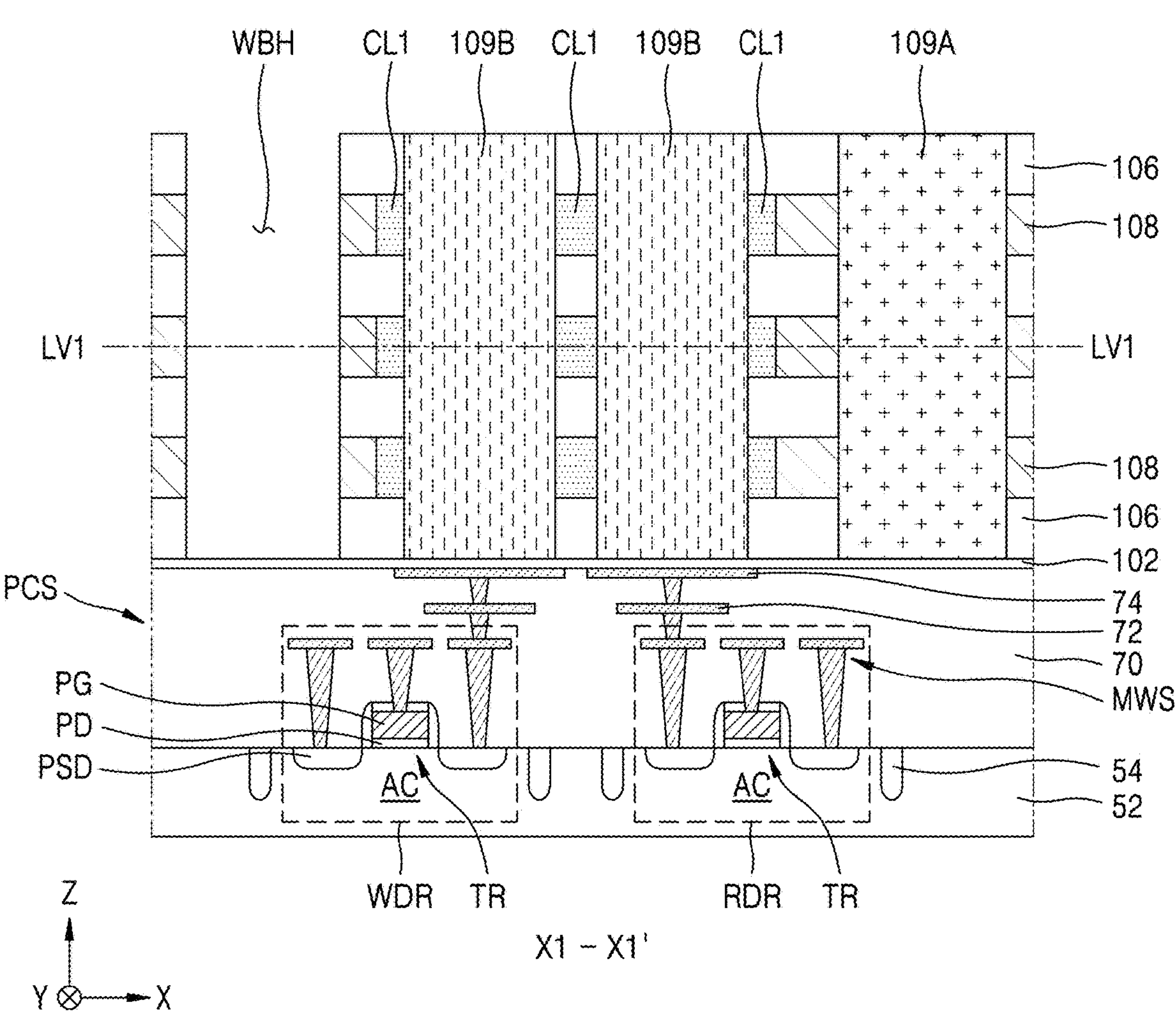

Referring to FIGS. 20A and 20B, in the resultant structure of FIGS. 19A and 19B, the plurality of first word line holes WWH and the plurality of second word line holes RWH may be filled by a plurality of sacrificial films 109B. Thereafter, the sacrificial film 109A may be selectively removed from only the first bit line hole WBH, from among the first bit line hole WBH and the second bit line hole RBH. Thus, the etch stop film 102 may be exposed at the bottom of the first bit line hole WBH, and the plurality of first insulating films 106 and the plurality of second insulating films 108 may be exposed at an inner sidewall of the first bit line hole WBH. A constituent material of the plurality of sacrificial films 109B is substantially the same as a constituent material of the plurality of sacrificial films 109A, which has been described with reference to FIGS. 17A and 17B.

Figure 21A:
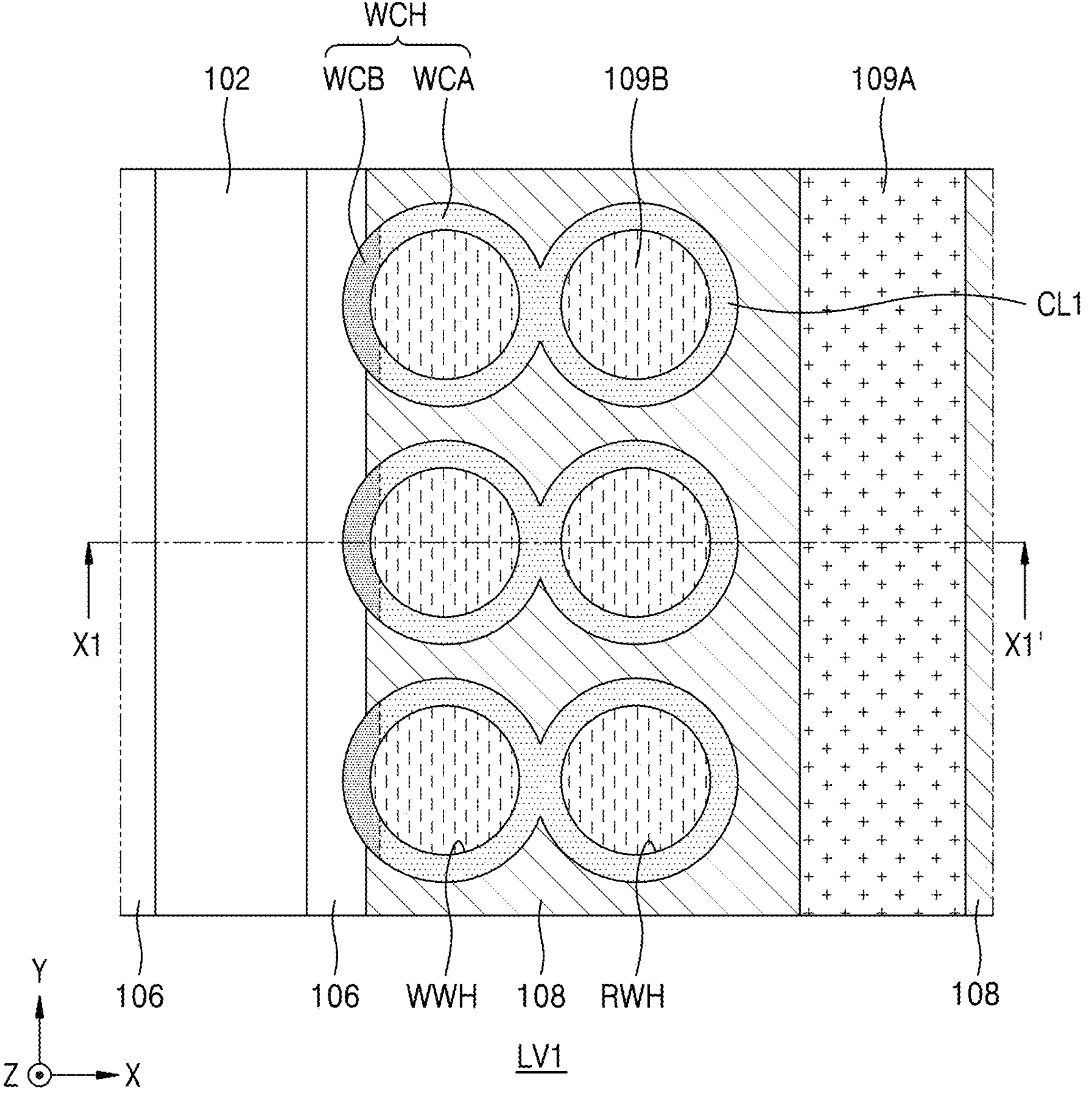
Figure 21B:
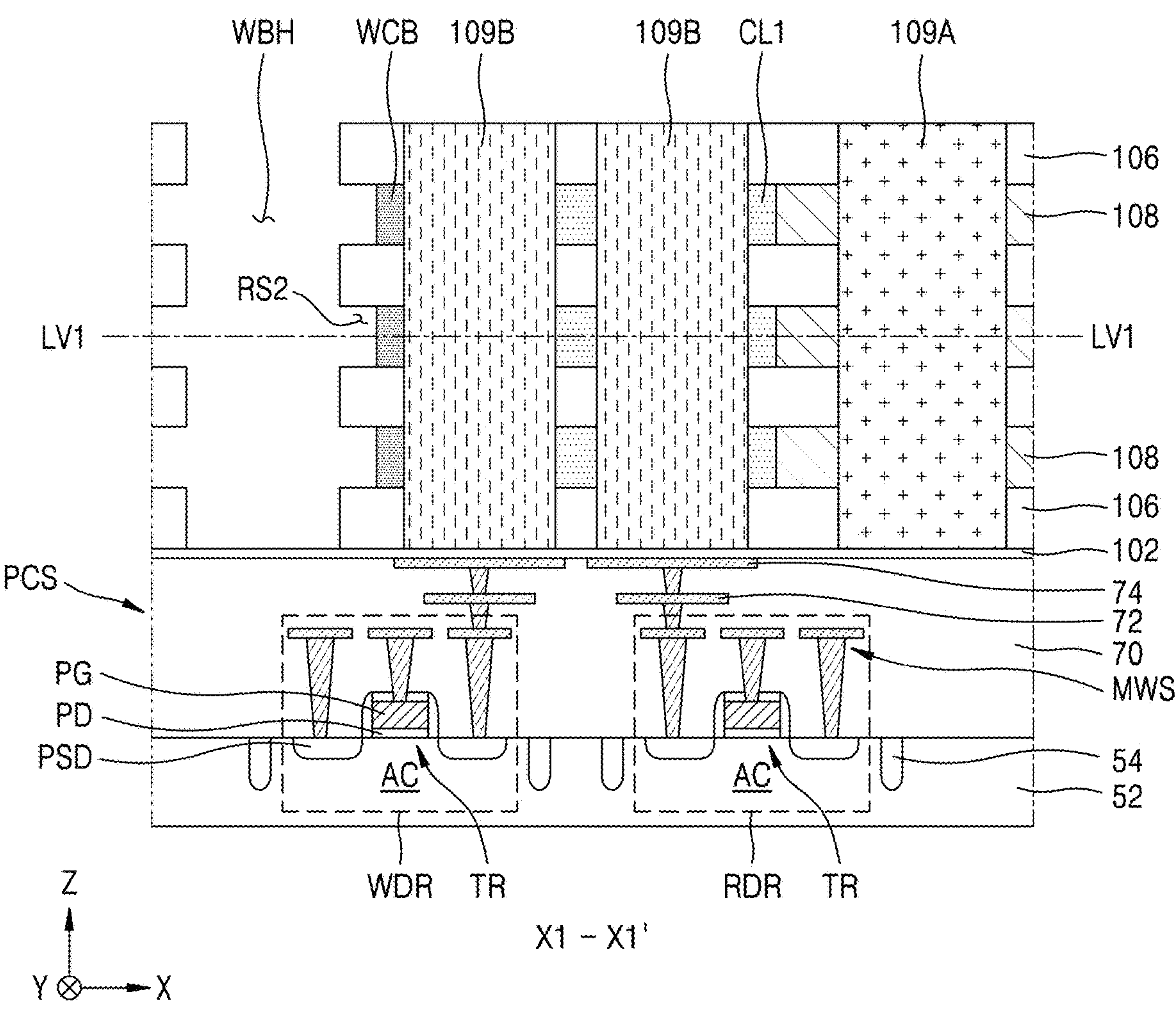

Referring to FIGS. 21A and 21B, in the resultant structure of FIGS. 20A and 20B, some of the plurality of second insulating films 108 may be selectively removed through the first bit line hole WBH so that a portion of each of a plurality of semiconductor patterns CL1 may be exposed. Thus, a plurality of recess spaces RS2, which extend from the first bit line hole WBH in a first lateral direction (X direction), may be formed. Portions of the plurality of semiconductor patterns CL1 may be respectively exposed through the plurality of recess spaces RS2. In various example embodiments, the plurality of recess spaces RS2 may be formed by using a wet etching process.

Thereafter, an ion implantation process such as one or more of beamline ion implantation process or a plasma ion implantation process may be performed on portions of the plurality of semiconductor patterns CL1, which are exposed through the plurality of recess spaces RS2. Thus, a first channel region WCH including a main channel portion WCA and a channel contact portion WCB may be formed from a portion of each of the plurality of semiconductor patterns CL1 and located around each of the plurality of first word line holes WWH. In various example embodiments, to form the channel contact portion WCB, an N-type dopant may be implanted at a relatively high concentration during the ion implantation process, without being limited thereto.

Figure 22A:
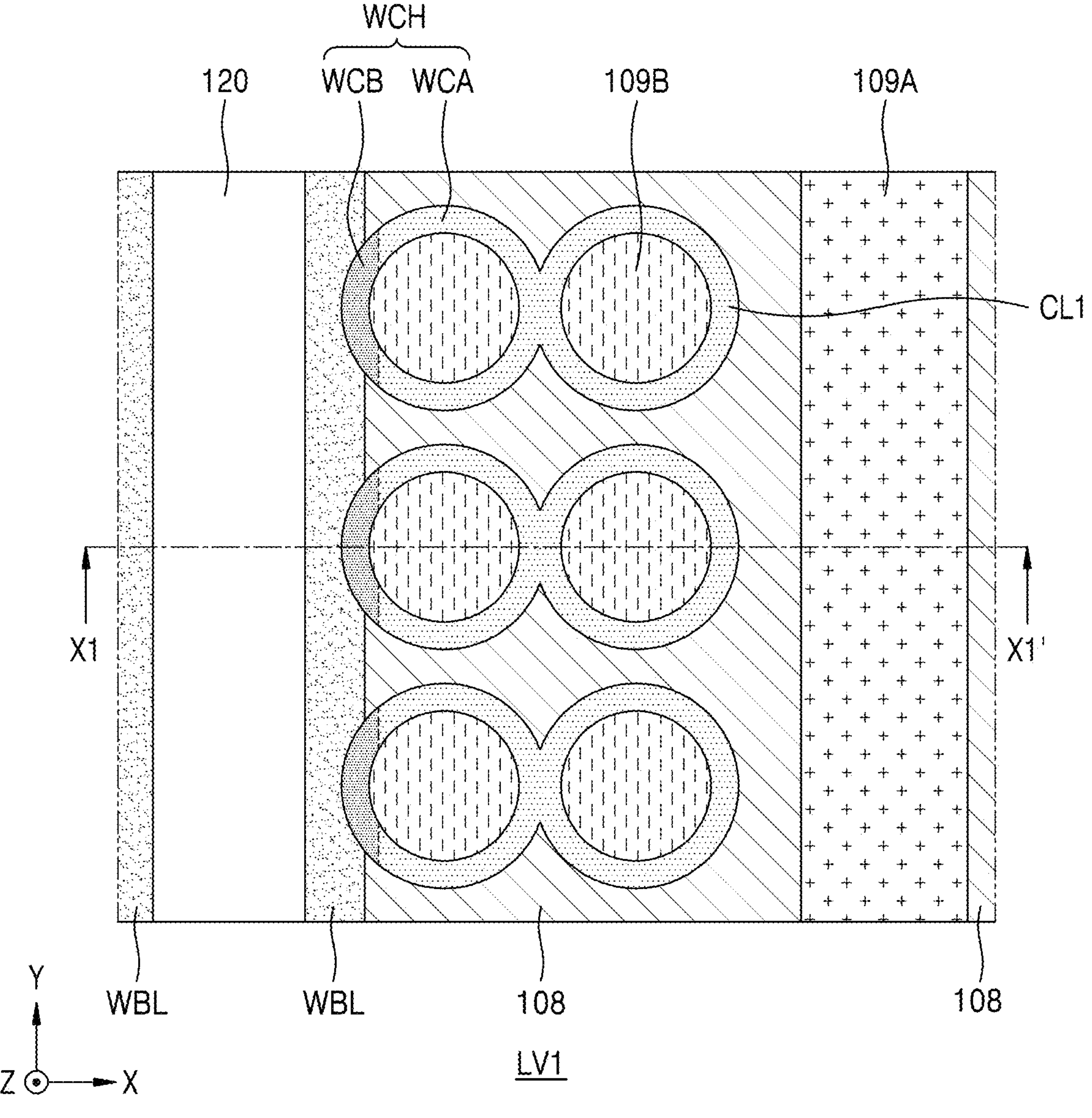
Figure 22B:
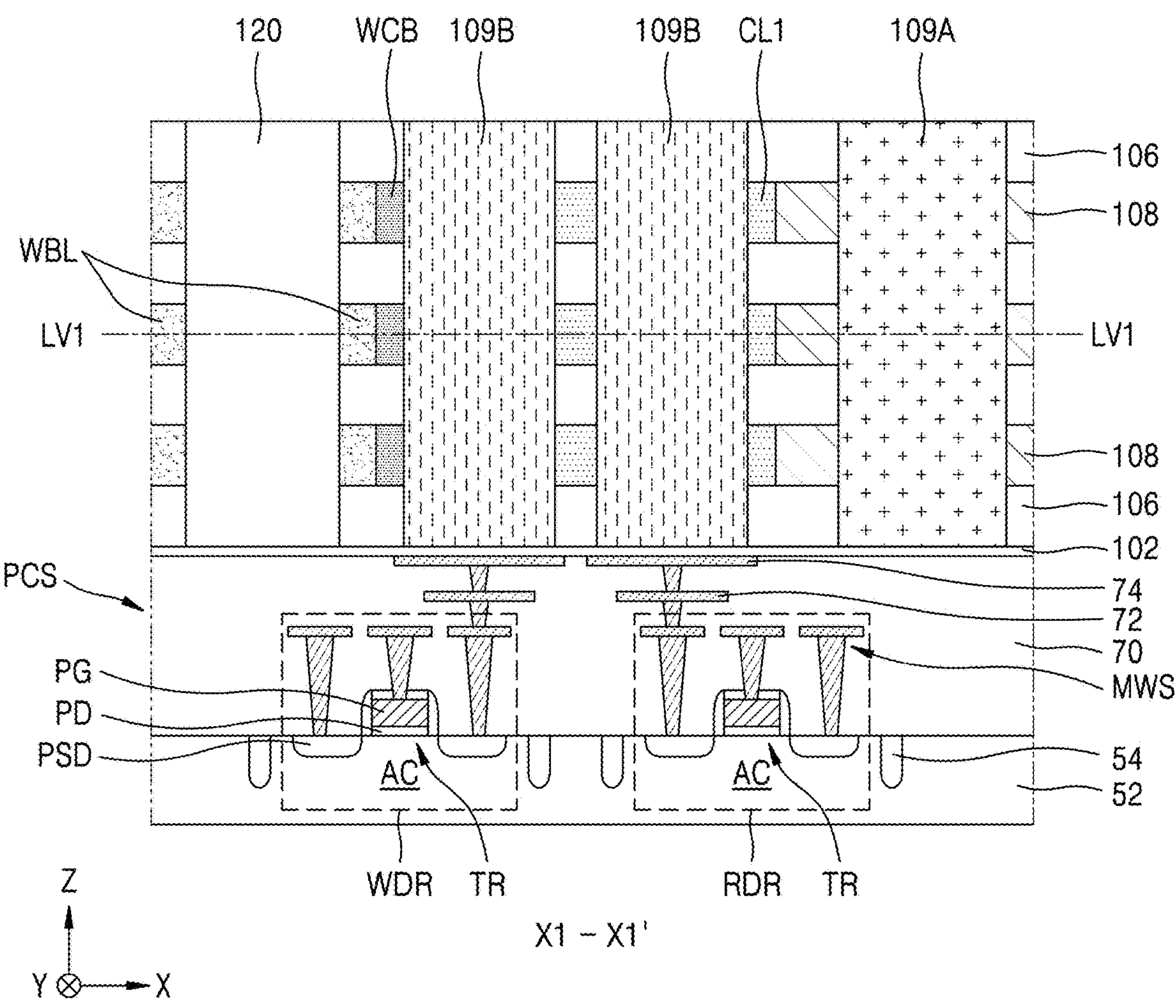

Referring to FIGS. 22A and 22B, in the resultant structure of FIGS. 21A and 21B, a plurality of write bit lines WBL may be formed to fill the plurality of recess spaces RS2. After the plurality of write bit lines WBL are formed, the etch stop film 102 may be exposed at a bottom surface of the first bit line hole WBH, and the plurality of write bit lines WBL and the plurality of first insulating films 106 may be exposed at an inner sidewall of the first bit line hole WBH. Afterwards, a first cell inter-group insulating film 120 may be formed to fill the first bit line hole WBH.

Figure 23A:
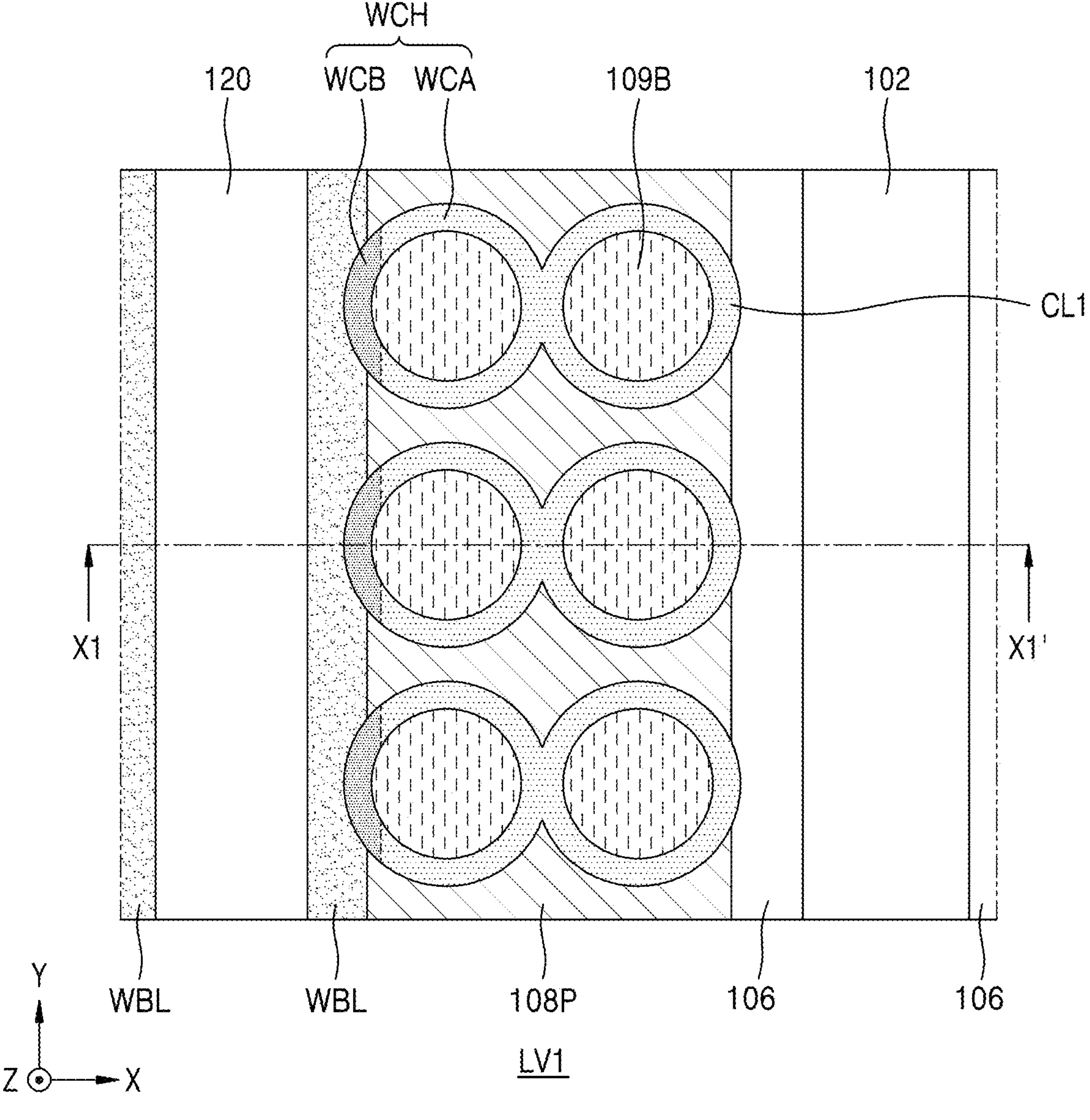
Figure 23B:
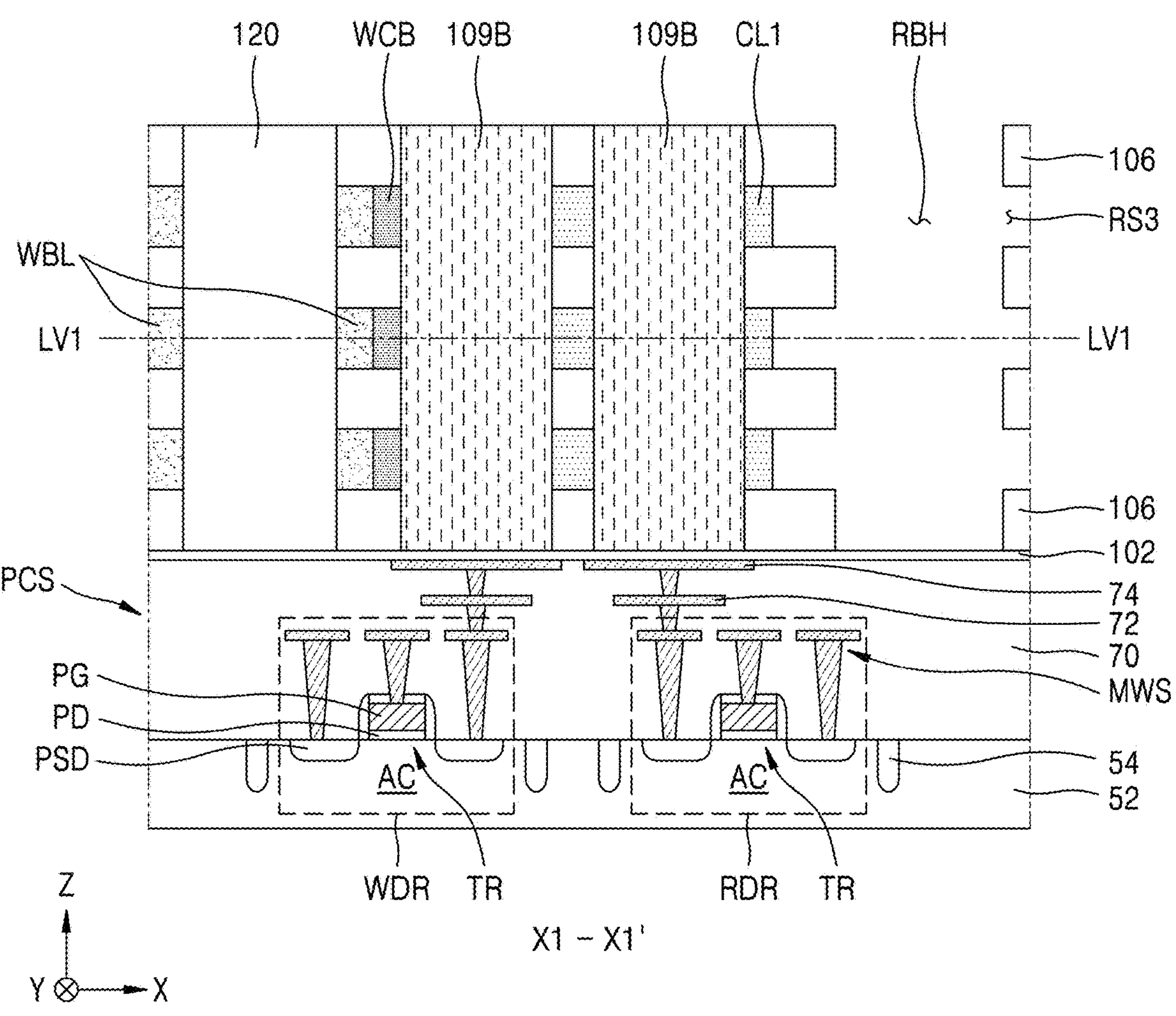

Referring to FIGS. 23A and 23B, in the resultant structure of FIGS. 22A and 22B, some of the plurality of second insulating films 108 may be selectively removed through the second bit line hole RBH so that another portion of each of the plurality of semiconductor patterns CL1 may be exposed. Thus, a plurality of recess spaces RS3 extending from the second bit line hole RBH in the first lateral direction (X direction) may be formed, and a plurality of lateral inter-cell insulating patterns 108P including the remaining portions of the plurality of second insulating films 108 may be formed. The respective other portions of the plurality of semiconductor patterns CL1 may be exposed through the plurality of recess spaces RS3. In various example embodiments, the plurality of recess spaces RS3 may be formed by using a wet etching process.

Figure 24A:
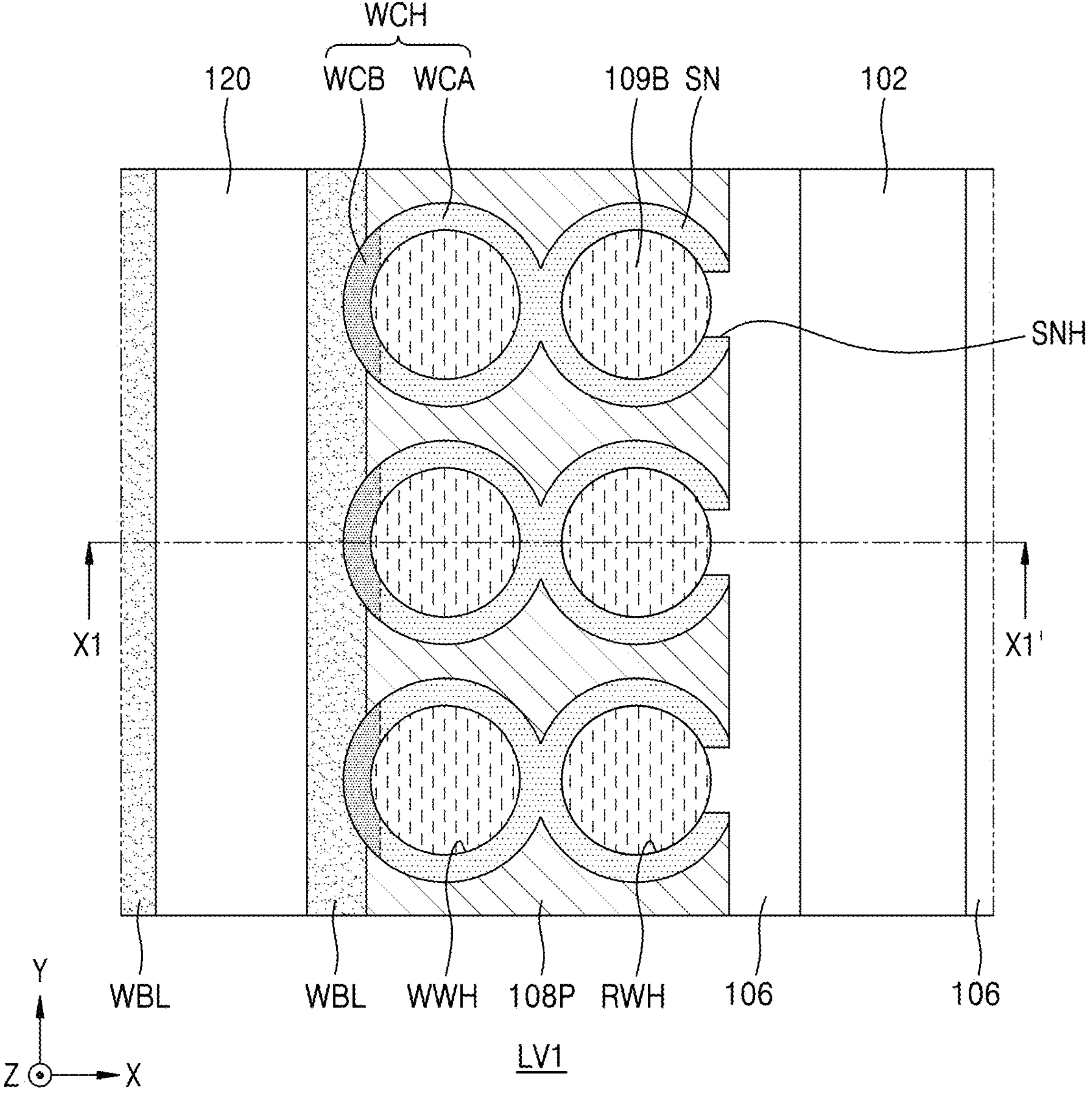
Figure 24B:
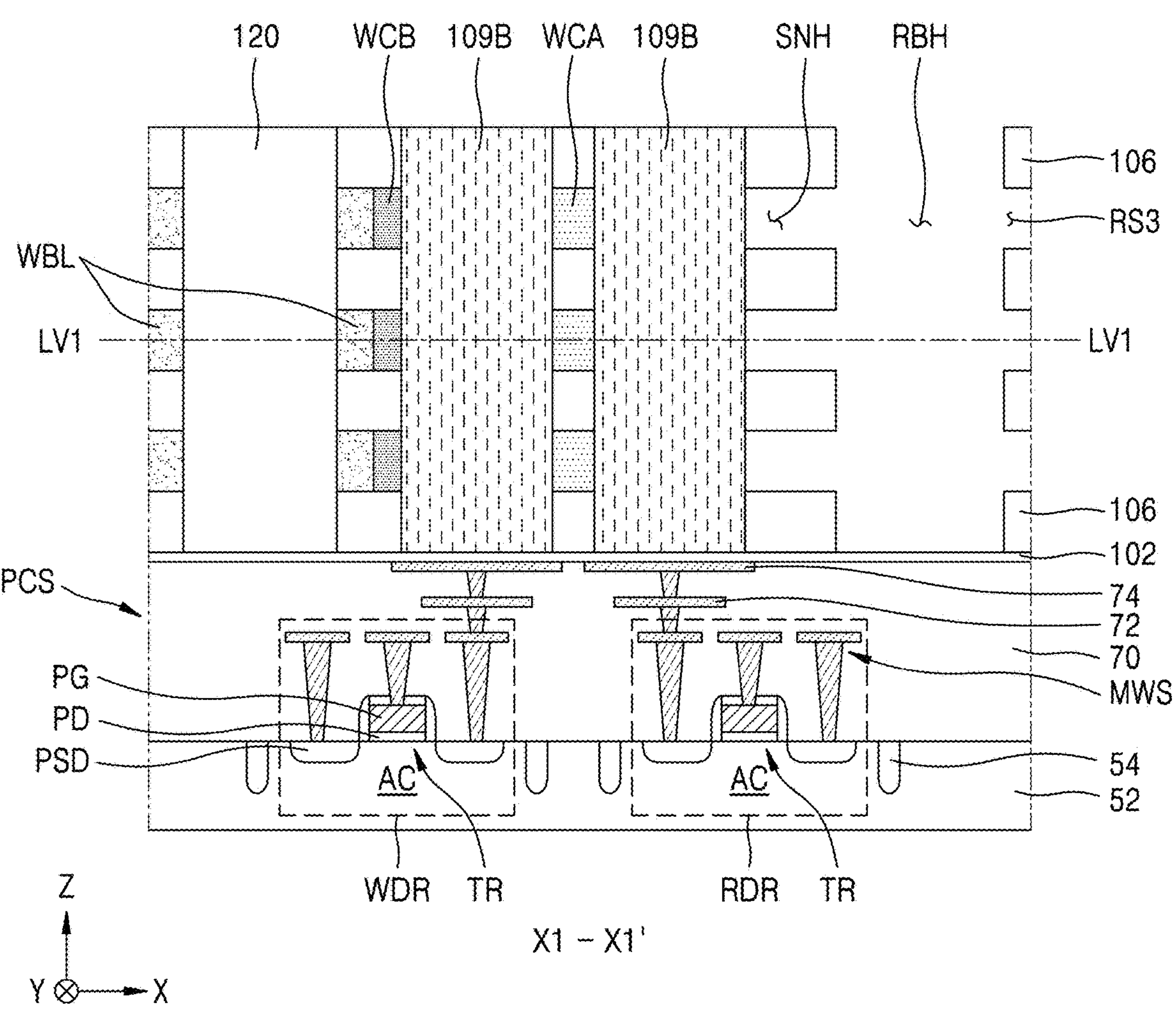
Figure 27A:
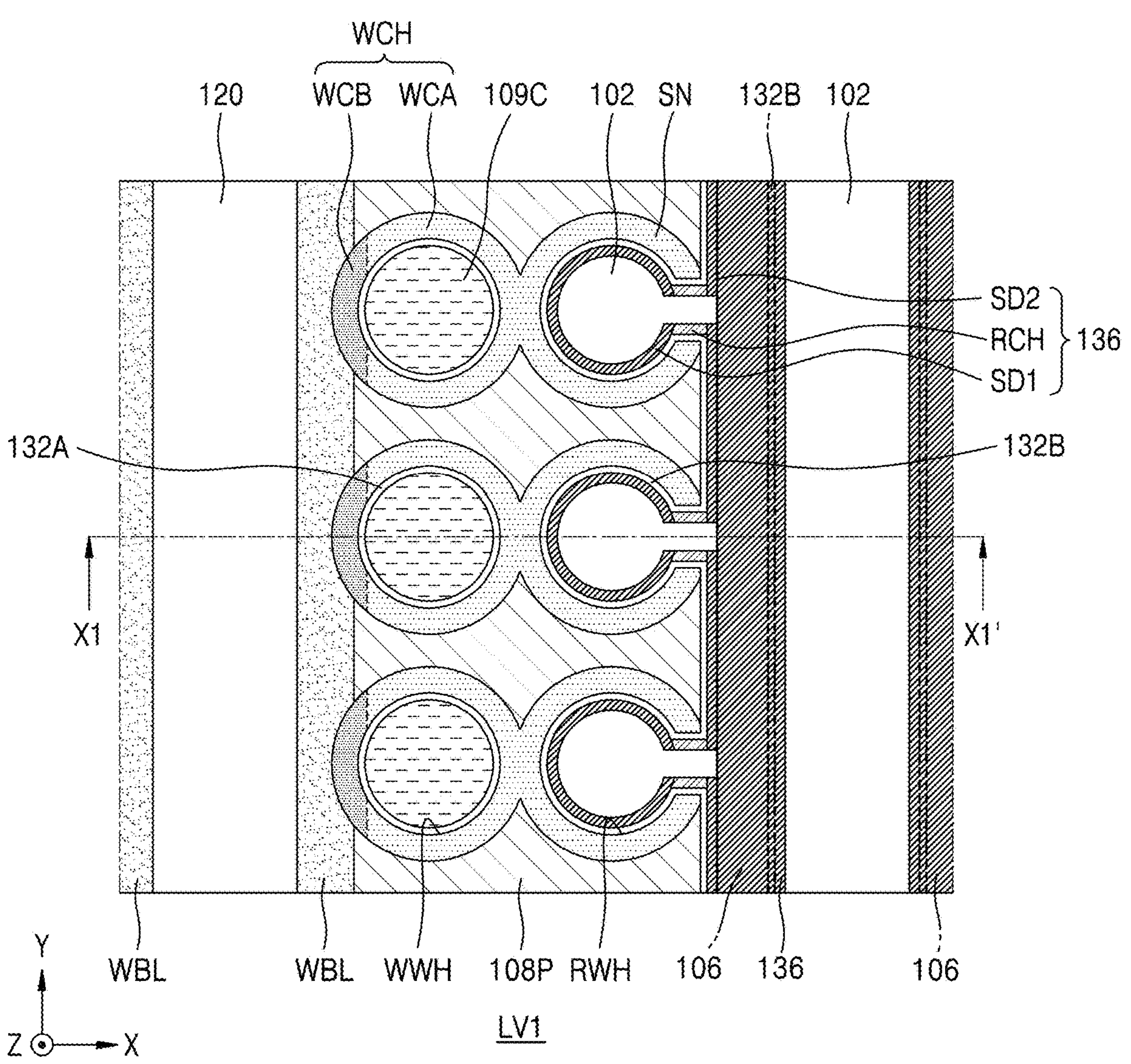
Figure 27B:
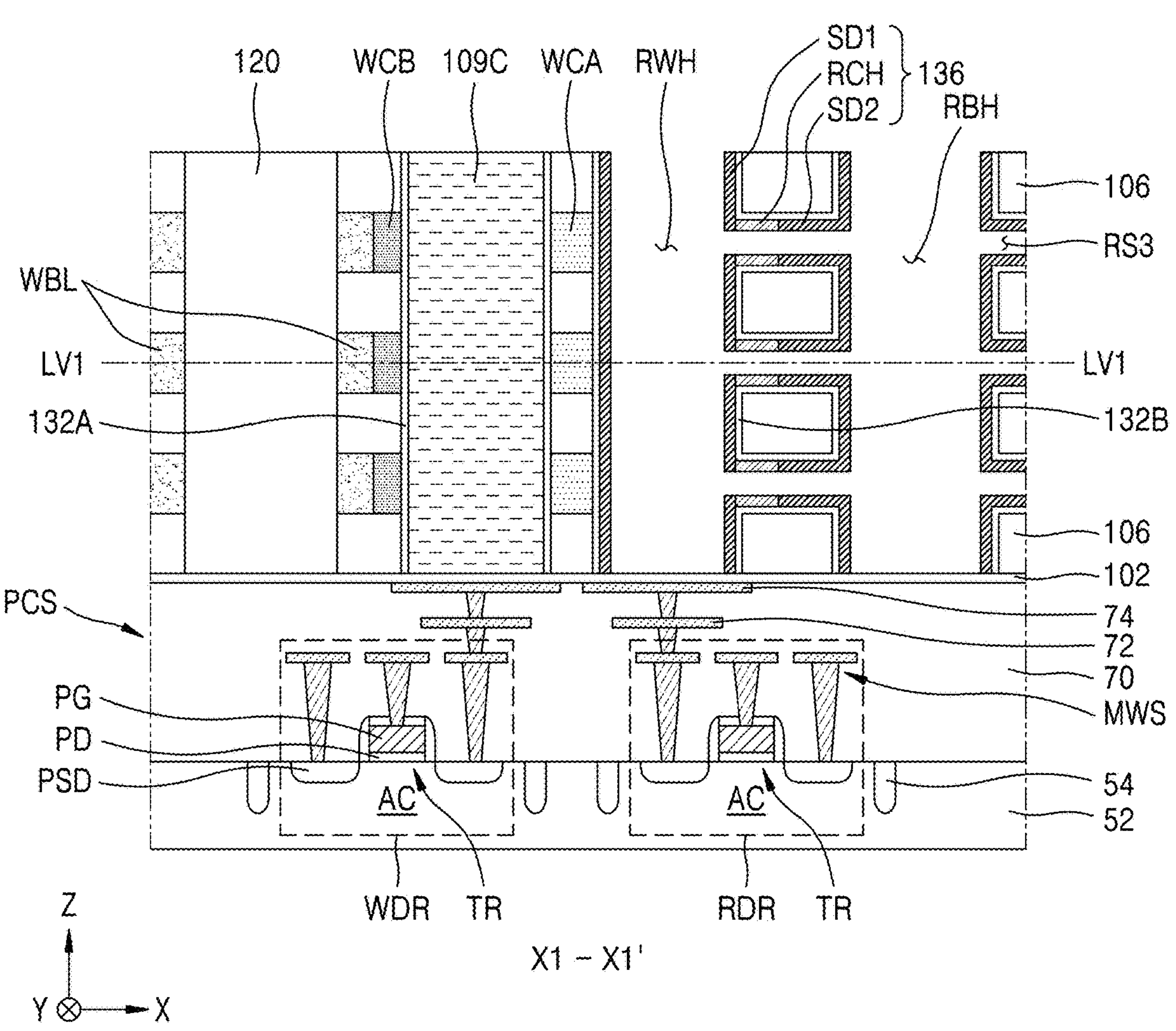

Referring to FIGS. 24A and 24B, in the resultant structure of FIGS. 27A and 27B, the respective exposed portions of the plurality of semiconductor patterns CL1 may be partially removed through the second bit line hole RBH and the plurality of recess spaces RS3. Thus, a storage node SN including the remaining portion of each of the plurality of semiconductor patterns CL1 may be formed, and the plurality of sacrificial films 109B filling the plurality of second word line holes RWH may be exposed. Each of a plurality of storage nodes SN may define an opening SNH connected to the recess space RS3.

Figure 25A:
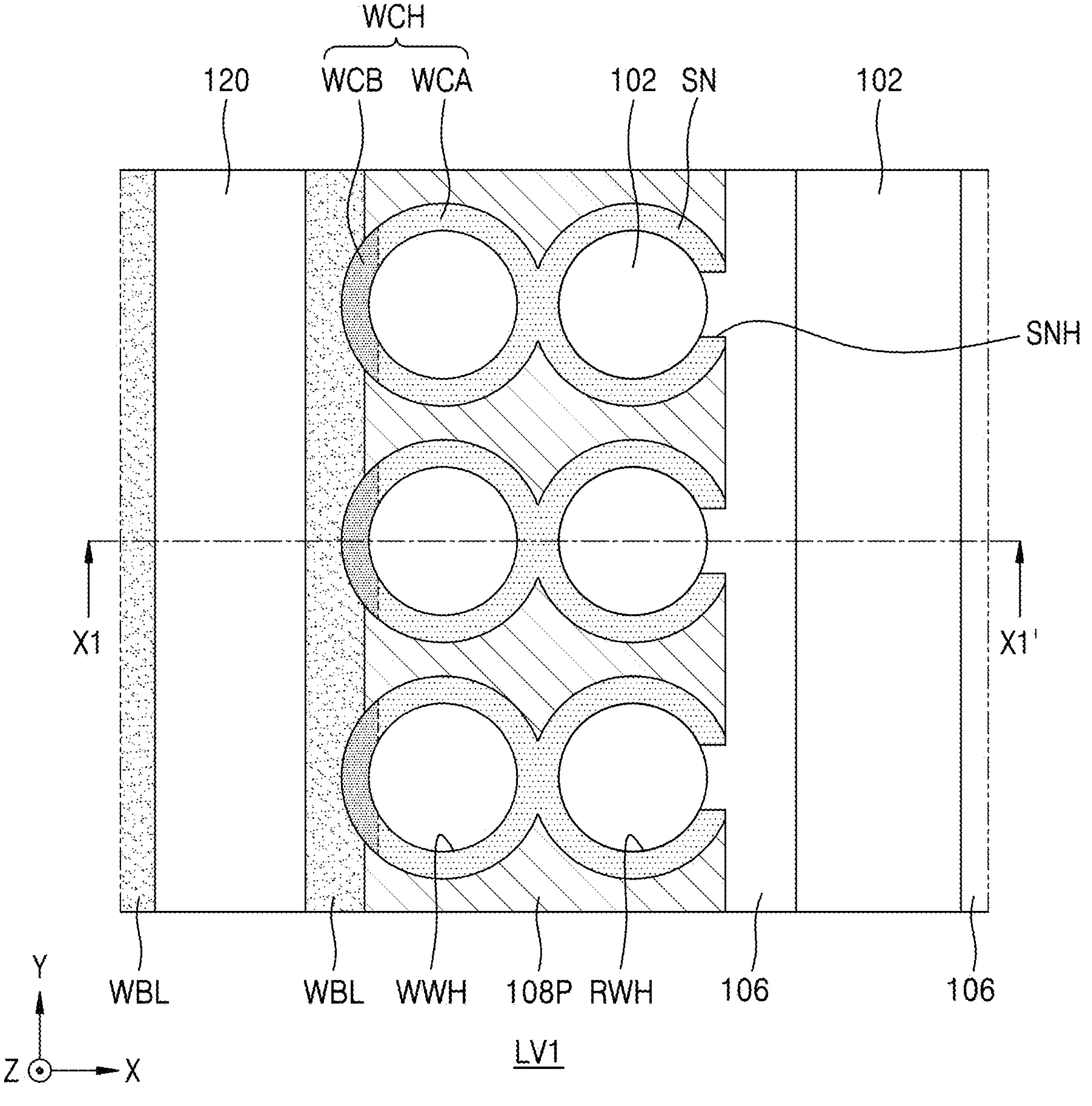
Figure 25B:
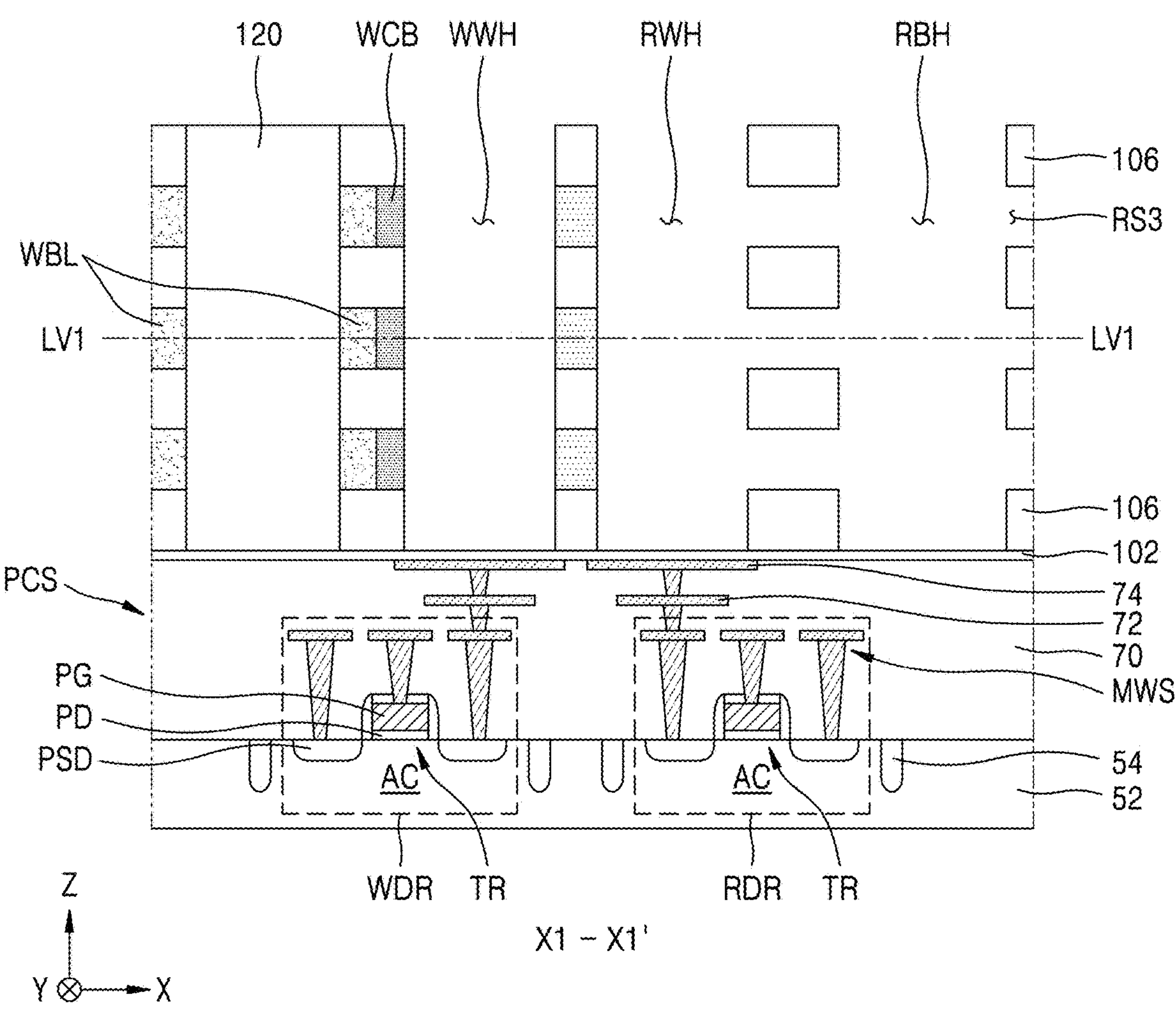

Referring to FIGS. 25A and 25B, the plurality of sacrificial films 109B may be removed from the resultant structure of FIGS. 24A and 24B. Thus, the etch stop film 102 may be exposed at a bottom surface of each of the plurality of first word line holes WWH and the plurality of second word line holes RWH.

Figure 26A:
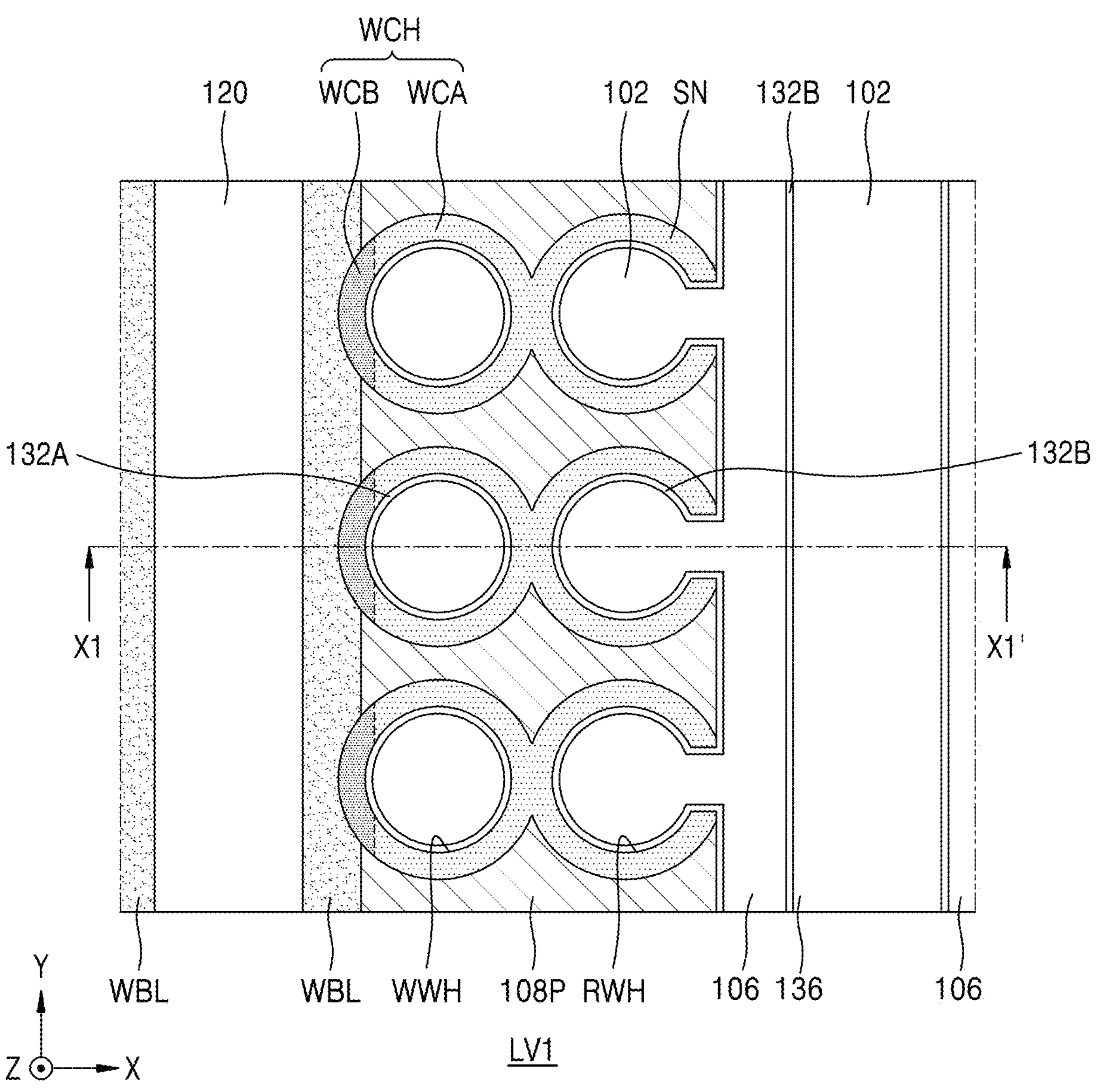
Figure 26B:
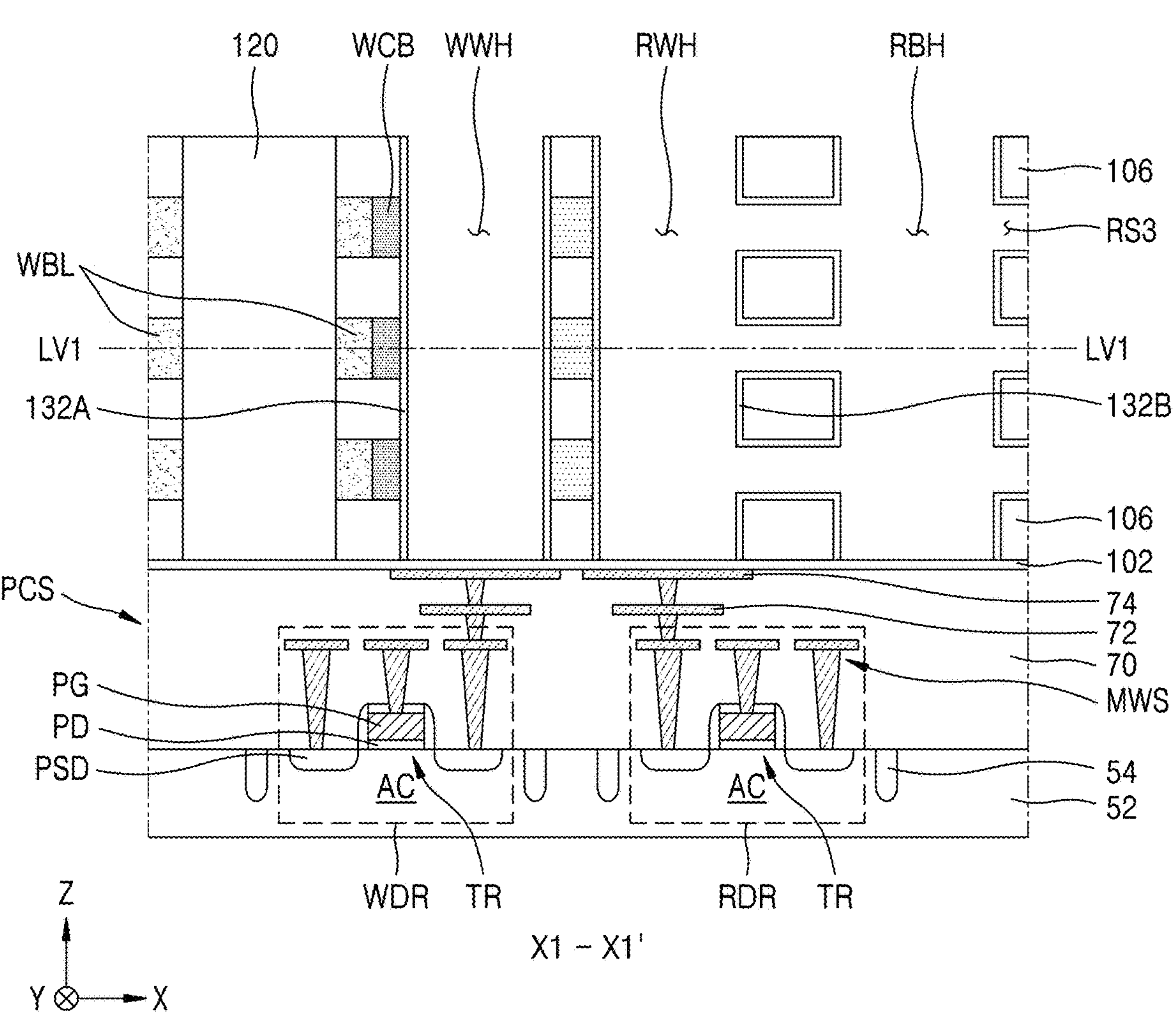

Referring to FIGS. 26A and 26B, in the resultant structure of FIGS. 25A and 25B, a gate dielectric film may be formed to conformally cover an inner surface of each of the plurality of first word line holes WWH, the plurality of second word line holes RWH, and the second bit line hole RBH. The gate dielectric film may include a first gate dielectric film 132A and a second gate dielectric film 132B. The first gate dielectric film 132A may conformally cover the inner surface of each of the plurality of first word line holes WWH. The second gate dielectric film 132B may conformally cover the inner surface of each of the plurality of second word line holes RWH, the plurality of recess spaces RS3, a plurality of openings SNH, and the second bit line hole RBH. In various example embodiments, the gate dielectric film may be formed by using an atomic layer deposition (ALD) process. Thereafter, a portion of the gate dielectric film may be anisotropically etched, e.g., with a dry etching process, to expose the etch stop film 102 at the bottom of each of the plurality of first word line holes WWH, the plurality of second word line holes RWH, and the second bit line hole RBH.

Referring to FIGS. 27A and 27B, in the resultant structure of FIGS. 26A and 26B, each of the plurality of first word line holes WWH may be filled by a sacrificial film 109C. A constituent material of the plurality of sacrificial films 109B is substantially the same as a constituent material of the plurality of sacrificial films 109A, which has been described with reference to FIGS. 17A and 17B.

Afterwards, a semiconductor liner conformally covering the first gate dielectric film 132A and the second gate dielectric film 132B may be formed inside each of the plurality of second word line holes RWH and the second bit line hole RBH. An ion implantation process may be performed on some regions of the semiconductor liner through the plurality of second word line holes RWH and the second bit line hole RBH. Thus, a plurality of semiconductor structures 136, each of which includes a first source/drain region SD1, a second channel region RCH, and a second source/drain region SD2, may be formed from the semiconductor liner. In various example embodiments, to form the plurality of semiconductor structures 136, an N-type dopant may be implanted at a relatively high concentration into some regions of the semiconductor liner during the ion implantation process to form the first source/drain region SD1 and the second source/drain region SD2, without being limited thereto.

After the plurality of semiconductor structures 136 are formed, two second channel regions RCH may be inside each of a plurality of openings (refer to SNH in FIGS. 24A and 24B) defined by the plurality of storage nodes SN, and a partial space of the opening SNH may remain empty between the two second channel regions RCH.

Figure 28A:
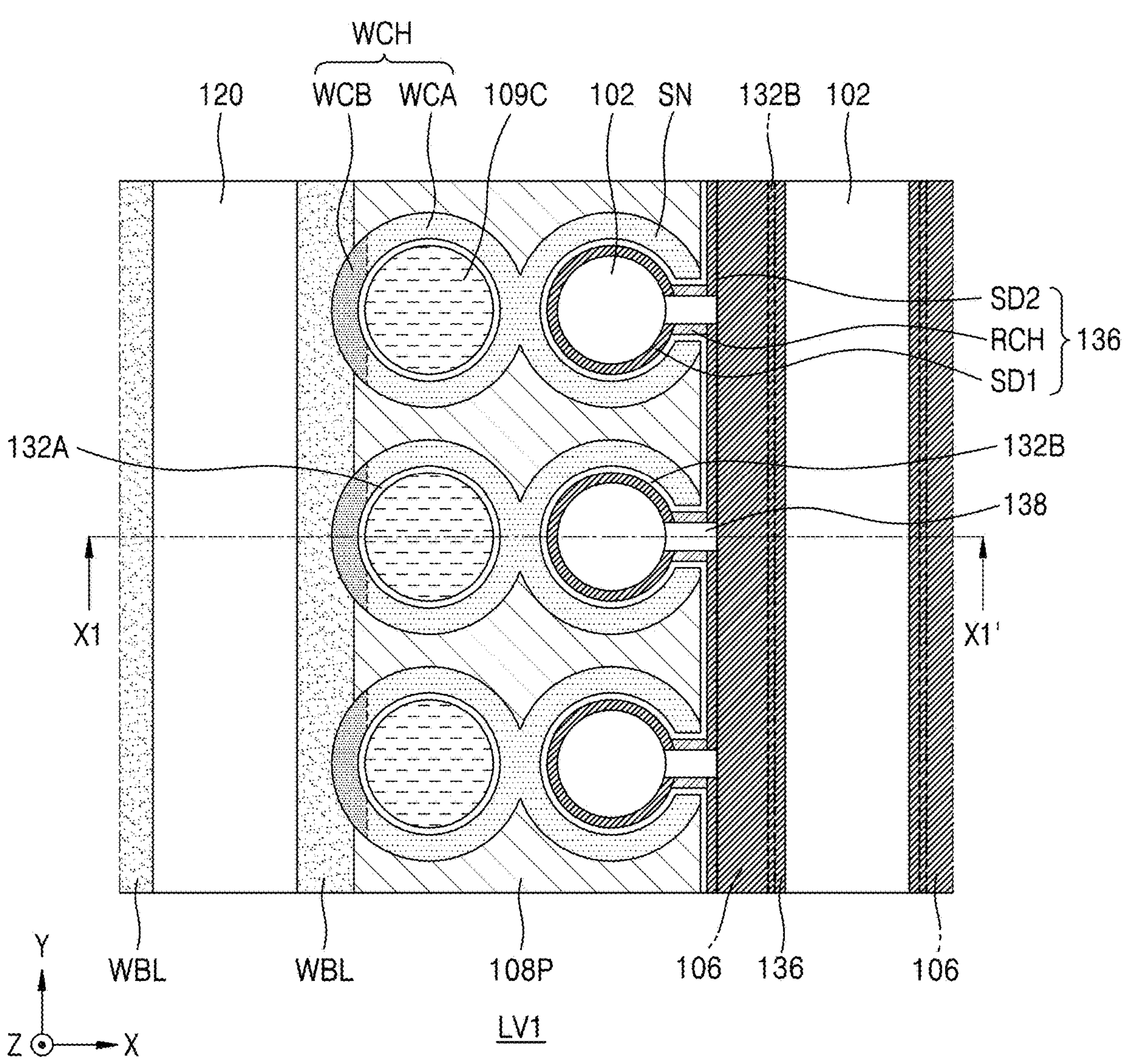
Figure 28B:
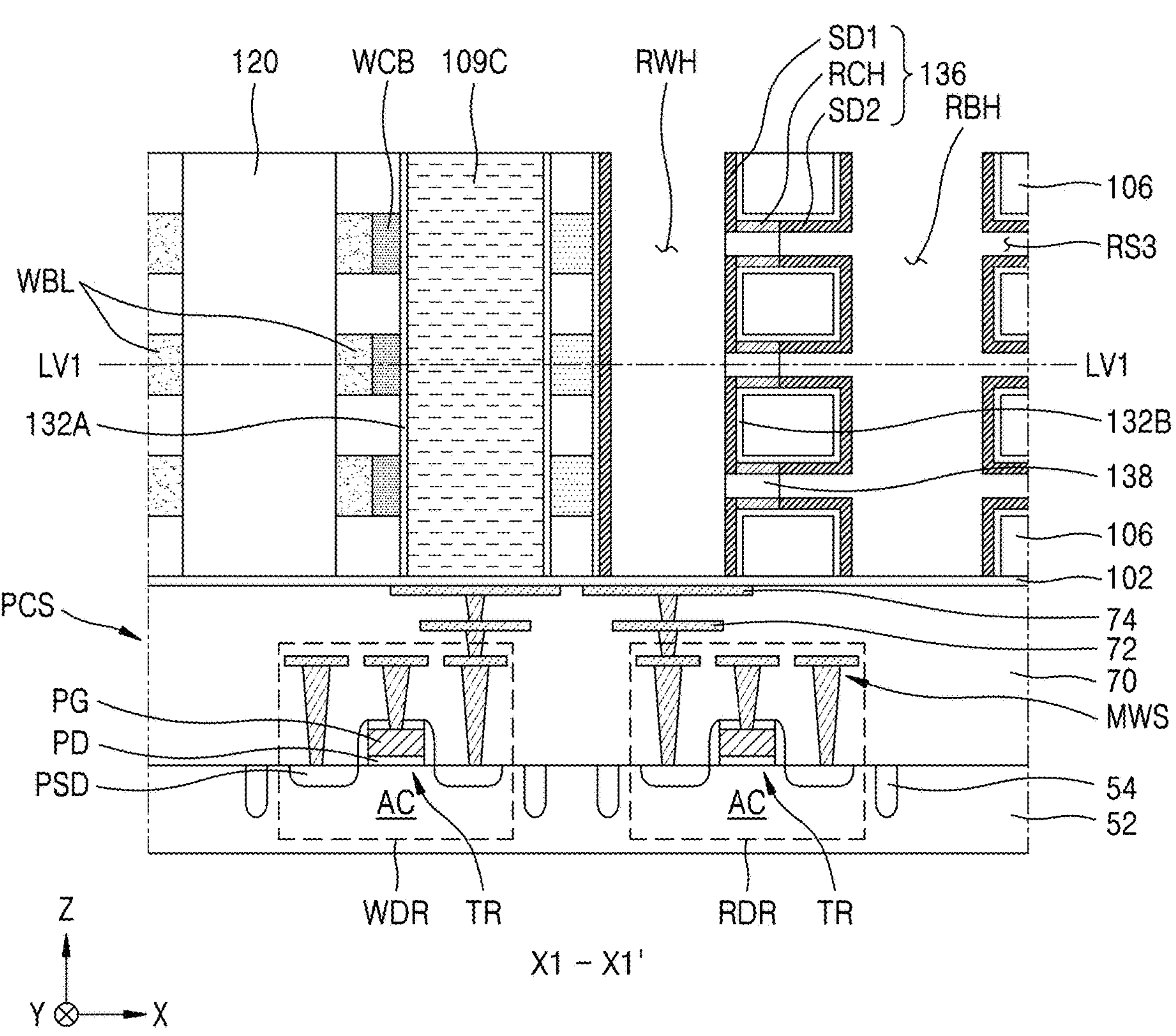

Referring to FIGS. 28A and 28B, in the resultant structure of FIGS. 27A and 27B, an inter-channel insulating pattern 138 may be formed to fill the remaining space of each of the plurality of openings SNH defined by the plurality of storage nodes SN.

In various example embodiments, in the resultant structure of FIGS. 27A and 27B, an insulating film may be formed to such a sufficient thickness to fill the plurality of openings SNH defined by the plurality of storage nodes SN. Thereafter, desired partial regions of the insulating film may be etched back to form a plurality of inter-channel insulating patterns 138 including the remaining portions of the insulating film. After the plurality of inter-channel insulating patterns 138 are formed, a portion of each of the plurality of recess spaces RS3 may remain empty around the second bit line hole RBH.

Figure 29A:
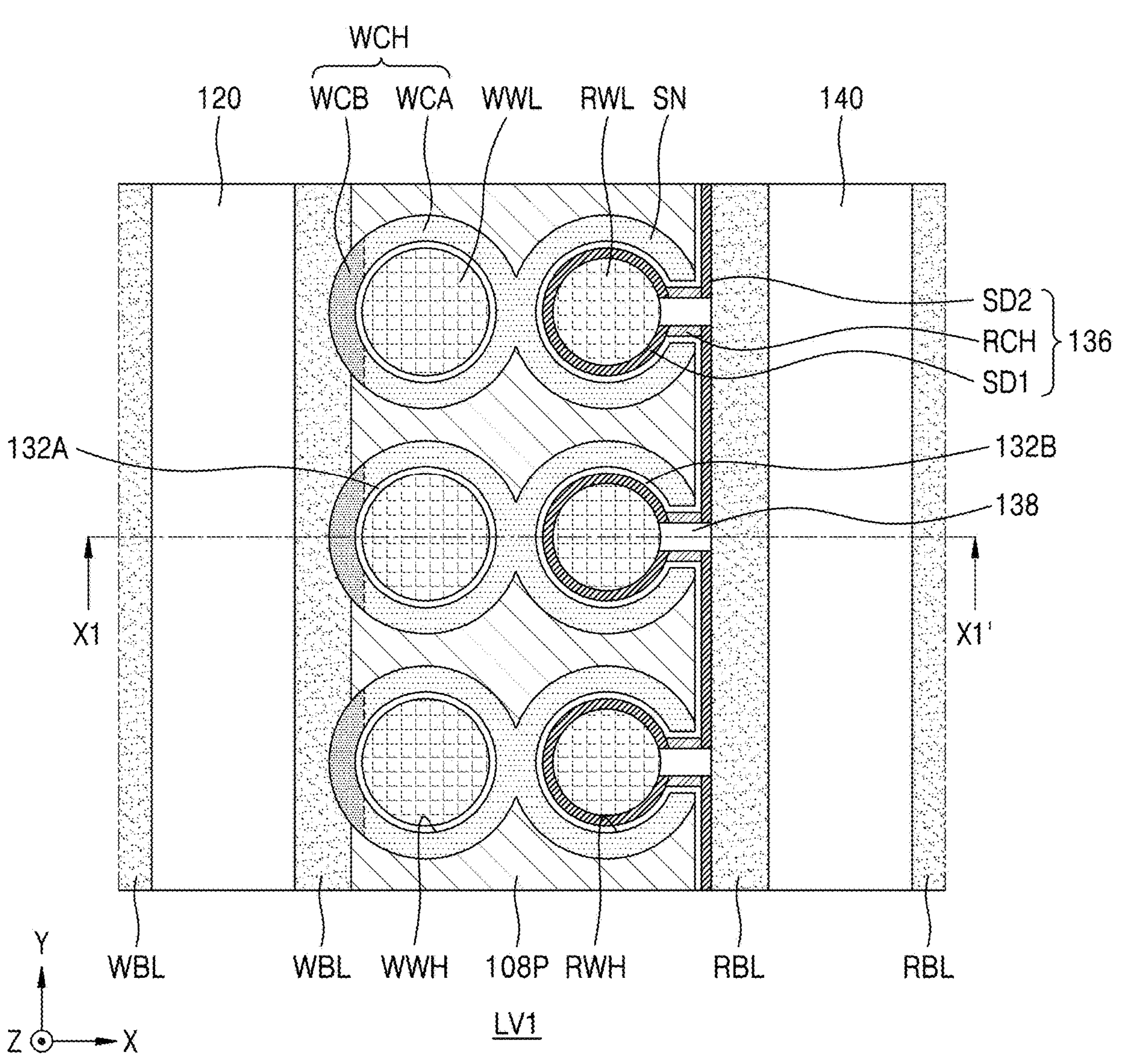
Figure 29B:
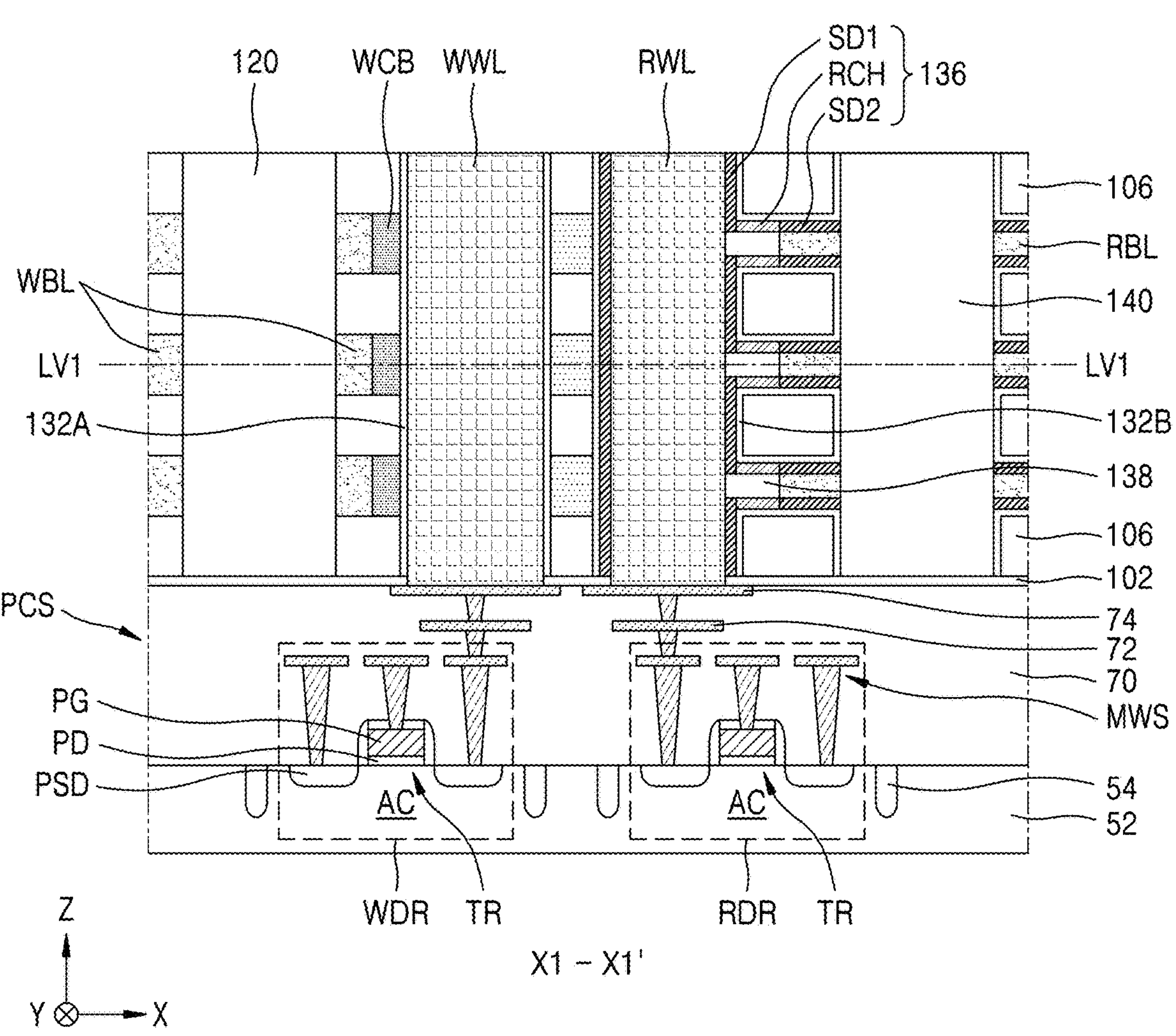

Referring to FIGS. 29A and 29B, the sacrificial film 109C may be removed from the resultant structure of FIGS. 28A and 28B. Thereafter, a portion of the etch stop film 102 may be removed, and thus, the conductive line 74 may be exposed at the bottom of each of the plurality of first word line holes WWH and the plurality of second word line holes RWH. Afterwards, a plurality of write word lines WWL filling the plurality of first word line holes WWH, a plurality of read word lines RWL filling the plurality of second word line holes RWH, and a plurality of read bit lines RBL filling the plurality of recess spaces RS3 may be formed, and a second cell inter-group insulating film 140 filling the second bit line hole (refer to RBH in FIG. 28B) may be formed.

Portions of the plurality of first insulating films 106, which remain in the resultant structure of FIGS. 29A and 29B, may constitute a plurality of vertical inter-cell insulating patterns 106P included in the semiconductor memory device 100 shown in FIGS. 1, 2, and 3A to 3C.

Although the method of manufacturing the semiconductor device 100 shown in FIGS. 1, 2, and 3A to 3C has been described with reference to FIGS. 15A to 29B, it will be understood that semiconductor devices having variously changed structures may be manufactured by applying various modifications and changes to the processes described with reference to FIGS. 15A to 29B within the scope of the inventive concept.

While various example embodiments been particularly shown and described with reference to some example embodiments thereof, it will be understood that various changes in form and details may be made therein without departing from the spirit and scope of the following claims. Furthermore example embodiments are not necessarily mutually exclusive. For example, some example embodiments may include one or more features described with reference to one or more figures, and may also include one or more other features described with reference to one or more other figures.

What is claimed is:

1. A semiconductor memory device comprising:

a memory cell array having a three-dimensional structure, the memory cell array comprising a plurality of memory cells, the plurality of memory cells being repeatedly arranged in a first lateral direction, a second lateral direction, and a vertical direction, wherein the first lateral direction and the second lateral direction are perpendicular to each other, and the vertical direction is perpendicular to each of the first lateral direction and the second lateral direction, wherein each of the plurality of memory cells comprises two transistors comprising at least portions of two word lines passing through the memory cell in the vertical direction and at least portions of two bit lines respectively on both sides of the two word lines in the first lateral direction, each of the two bit lines extending along in the second lateral direction, and each of the plurality of memory cells does not comprise a capacitor.

2. The semiconductor memory device of claim 1, wherein the plurality of memory cells comprise:

a write word line extending along the vertical direction;

a read word line apart from the write word line in the first lateral direction, the read word line extending along the vertical direction;

a plurality of write bit lines on one side of the write word line and the read word line in the first lateral direction, the plurality of write bit lines overlapping each other in the vertical direction and each extending along the second lateral direction; and a plurality of read bit lines on another side of the write word line and the read word line in the first lateral direction, the plurality of read bit lines overlapping each other in the vertical direction and each extending along the second lateral direction, wherein, from among the plurality of memory cells, memory cells arranged in a line in the vertical direction share the write word line and the read word line, and, from among the plurality of memory cells, memory cells arranged in a line in the second lateral direction share a selected one of the plurality of write bit lines and a selected one of the plurality of read bit lines.

3. The semiconductor memory device of claim 2, wherein the plurality of memory cells further comprise:

a plurality of first channel regions at least partly overlapping each other in the vertical direction, each first channel region surrounding the write word line;

a plurality of storage nodes at least partly overlapping each other in the vertical direction, each storage node surrounding the read word line; and a plurality of second channel regions between the read word line and the plurality of read bit lines, wherein each of the plurality of storage nodes comprises a first sidewall portion in contact with a selected one of the plurality of first channel regions and a second sidewall portion defining an opening, and each of the plurality of second channel regions intersects with a selected one of the plurality of storage nodes through the opening of the selected storage node and extends in the first lateral direction.

4. The semiconductor memory device of claim 2, wherein the plurality of memory cells further comprise:

a first gate dielectric film surrounding the write word line; and a plurality of first channel regions at least partly overlapping each other in the vertical direction, the plurality of first channel regions surrounding the write word line and the first gate dielectric film, wherein each of the plurality of first channel regions is in contact with one write bit line adjacent thereto in the first lateral direction, from among the plurality of write bit lines, from among the plurality of memory cells, memory cells arranged in a line in the vertical direction share the first gate dielectric film, and each of the plurality of memory cells comprises a selected one of the plurality of first channel regions.

5. The semiconductor memory device of claim 2, wherein the plurality of memory cells further comprise:

a first source/drain region surrounding the read word line;

a second gate dielectric film surrounding the read word line and the first source/drain region;

a plurality of second channel regions at least partly overlapping each other in the vertical direction, each second channel region extending away from the first source/drain region in the first lateral direction;

a plurality of second source/drain regions at least partly overlapping each other in the vertical direction, the plurality of second source/drain regions respectively covering surfaces of the plurality of read bit lines; and a plurality of storage nodes surrounding the read word line, the first source/drain region, and the second gate dielectric film, wherein the first source/drain region, the plurality of second channel regions, and the plurality of second source/drain regions are integrally connected to each other, each of the plurality of memory cells comprises two adjacent ones of the plurality of second channel regions, two adjacent ones of the plurality of second source/drain regions, and one of the plurality of storage nodes, and, from among the plurality of memory cells, memory cells arranged in a line in the vertical direction share the second source/drain region and the second gate dielectric film.

6. The semiconductor memory device of claim 2, wherein the plurality of memory cells further comprise:

a plurality of first channel regions at least partly overlapping each other in the vertical direction, each first channel region surrounding the write word line; and a plurality of second channel regions between the read word line and the plurality of read bit lines, wherein each of the plurality of first channel regions and the plurality of second channel regions comprises a silicon film.

7. The semiconductor memory device of claim 2, wherein the plurality of memory cells further comprise:

a plurality of first channel regions at least partly overlapping each other in the vertical direction, each first channel region surrounding the write word line; and a plurality of second channel regions between the read word line and the plurality of read bit lines, wherein at least one of the plurality of first channel regions and the plurality of second channel regions comprises an oxide semiconductor.

8. The semiconductor memory device of claim 2, wherein each of the plurality of memory cells comprises a storage node surrounding the read word line, and the storage node comprises at least one of silicon, a metal, or a conductive metal nitride.

9. The semiconductor memory device of claim 2, wherein each of the plurality of memory cells comprises:

a first channel region surrounding the write word line;

a storage node surrounding the read word line; and a second channel region apart from the storage node, the second channel region extending to intersect with a portion of the storage node in the first lateral direction, and the second channel region being connected to each of the read word line and the read bit line, wherein each of the first channel region, the second channel region, and the storage node comprises a semiconductor film, and a dopant concentration of the storage node is higher than a dopant concentration of each of the first channel region and the second channel region.

10. The semiconductor memory device of claim 2, wherein each of the plurality of memory cells comprises:

a first channel region surrounding the write word line; and a storage node surrounding the read word line, wherein the first channel region has a first thickness in a radial direction from a first central axis that is in a lengthwise direction of the write word line, and the storage node has a second thickness in a radial direction from a second central axis that is in a lengthwise direction of the read word line, wherein the second thickness is greater than the first thickness.

11. The semiconductor memory device of claim 2, wherein the plurality of memory cells comprise:

a first gate dielectric film surrounding the write word line; and a second gate dielectric film surrounding the read word line, wherein the first gate dielectric film comprises a paraelectric material, a high-k dielectric material, or a combination thereof, and the second gate dielectric film comprises a ferroelectric material.

12. A semiconductor memory device comprising:

a memory cell array having a three-dimensional structure, the memory cell array comprising a plurality of memory cells on a substrate, the plurality of memory cells being repeatedly arranged in a first lateral direction, a second lateral direction, and a vertical direction, wherein the first lateral direction and the second lateral direction are parallel to a main surface of the substrate and perpendicular to each other, and the vertical direction is perpendicular to the main surface of the substrate, wherein each of the plurality of memory cells comprises two transistors adjacent to each other in the first lateral direction, and wherein each of the plurality of memory cells comprises, at least a portion of a write word line extending along the vertical direction, at least a portion of a read word line apart from the write word line in the first lateral direction, the read word line extending along the vertical direction, at least a portion of a write bit line on one side of the write word line in the first lateral direction, the write bit line extending along the second lateral direction, and at least a portion of a read bit line apart from the write bit line in the first lateral direction with the write word line and the read word line therebetween, the read bit line extending along the second lateral direction.

13. The semiconductor memory device of claim 12, wherein each of the plurality of memory cells further comprises:

a first channel region surrounding the write word line;

a storage node surrounding the read word line; and two second channel regions extending to intersect with a portion of the storage node in the first lateral direction between the read word line and the read bit line, the two second channel regions being apart from each other in the vertical direction, wherein the first channel region and the storage node are in contact with each other.

14. The semiconductor memory device of claim 12, wherein each of the plurality of memory cells further comprises:

a first channel region surrounding the write word line; and a storage node surrounding the read word line, the storage node being in contact with the first channel region, wherein each of the first channel region and the storage node comprises a silicon film.

15. The semiconductor memory device of claim 12, wherein each of the plurality of memory cells further comprises:

a first channel region surrounding the write word line; and a storage node surrounding the read word line, the storage node being in contact with the first channel region, wherein each of the first channel region and the storage node comprises a semiconductor film, and a dopant concentration of the storage node is higher than a dopant concentration of the first channel region.

16. The semiconductor memory device of claim 12, wherein each of the plurality of memory cells further comprises:

a first channel region surrounding the write word line; and a storage node surrounding the read word line, the storage node being in contact with the first channel region, wherein the first channel region comprises a semiconductor or an oxide semiconductor, and the storage node comprises a metal or a conductive metal nitride.

17. The semiconductor memory device of claim 12, wherein each of the plurality of memory cells further comprises:

a first channel region surrounding the write word line; and a storage node surrounding the read word line, the storage node being in contact with the first channel region, wherein the first channel region has a first thickness in a radial direction from a first central axis that is in a lengthwise direction of the write word line, and the storage node has a second thickness in a radial direction from a second central axis that is in a lengthwise direction of the read word line, wherein the second thickness is greater than the first thickness.

18. The semiconductor memory device of claim 12, wherein each of the plurality of memory cells comprises:

a first gate dielectric film surrounding the write word line; and a second gate dielectric film surrounding the read word line, wherein the first gate dielectric film comprises a paraelectric material, a high-k dielectric material, or a combination thereof, and the second gate dielectric film comprises a ferroelectric material.

19. The semiconductor memory device of claim 12, wherein each of the plurality of memory cells further comprises:

a first channel region surrounding the write word line; and a storage node surrounding the read word line, the storage node being in contact with the first channel region, wherein a planar shape of the first channel region comprises a circular or elliptical shape comprising a closed curve, and a planar shape of the storage node comprises a partially circular shape or partially elliptical shape of which a portion opens toward the read bit line.

20. A semiconductor memory device comprising:

a memory cell array having a three-dimensional structure, the memory cell array comprising a plurality of memory cells on a substrate, the plurality of memory cells being repeatedly arranged in a first lateral direction, a second lateral direction, and a vertical direction, wherein the first lateral direction and the second lateral direction are parallel to a main surface of the substrate and perpendicular to each other, and the vertical direction is perpendicular to the main surface of the substrate, wherein each of the plurality of memory cells comprises a write transistor and a read transistor adjacent to each other in the first lateral direction, and each of the plurality of memory cells comprises, at least a portion of a write word line extending along the vertical direction, at least a portion of a write bit line on one side of the write word line in the first lateral direction, the write bit line extending along the second lateral direction, a first gate dielectric film surrounding the write word line, a first channel region surrounding the write word line and the first gate dielectric film, the first channel region being in contact with the write bit line, at least a portion of a read word line apart from the write word line in the first lateral direction, the read word line extending along the vertical direction, at least a portion of a read bit line apart from the write bit line in the first lateral direction with the write word line and the read word line therebetween, the read bit line extending along the second lateral direction, a second gate dielectric film surrounding the read word line, and a storage node surrounding the read word line and the second gate dielectric film, the storage node being in contact with the first channel region.

* * * * *